(12) United States Patent
Poltorak

(10) Patent No.: US 11,609,053 B2
(45) Date of Patent: Mar. 21, 2023

(54) SYSTEM AND METHOD FOR MAINTAINING EFFICIENCY OF A HEAT SINK

(71) Applicant: Fractal Heatsink Technologies, LLC, Miami, FL (US)

(72) Inventor: Alexander I Poltorak, Monsey, NY (US)

(73) Assignee: fractal heatsink technologies llc, Miami, FL (US)

(*) Notice: Subject to any disclaimer, the term of this patent is extended or adjusted under 35 U.S.C. 154(b) by 0 days.

(21) Appl. No.: 17/828,011

(22) Filed: May 30, 2022

(65) Prior Publication Data

US 2022/0290933 A1 Sep. 15, 2022

Related U.S. Application Data

(63) Continuation of application No. 17/093,307, filed on Nov. 9, 2020, now Pat. No. 11,346,620, which is a
(Continued)

(51) Int. Cl.
*F28G 7/00* (2006.01)
*H05K 7/20* (2006.01)
(Continued)

(52) U.S. Cl.
CPC ............... *F28G 7/00* (2013.01); *F28F 13/12* (2013.01); *F28G 1/16* (2013.01); *F28G 9/005* (2013.01);
(Continued)

(58) Field of Classification Search
CPC ............ F28G 7/00; F28G 9/00; F28G 15/003; F28G 9/005; F28G 1/163; F28G 13/00;
(Continued)

(56) References Cited

U.S. PATENT DOCUMENTS 2,535,721 A 12/1950 Chausson
4,654,092 A 3/1987 Melton
(Continued)

FOREIGN PATENT DOCUMENTS

CN 101394730 A 4/2008
CN 200810103241.3 4/2008
(Continued)

OTHER PUBLICATIONS

U.S. Appl. No. 10/001,015, filed Jun. 19, 2018, Shelman-Cohen.
(Continued)

*Primary Examiner* — Adam B Dravininkas
(74) *Attorney, Agent, or Firm* — Hoffberg & Associates; Steven M. Hoffberg

(57) ABSTRACT

A heatsink comprising a heat exchange device having a plurality of heat exchange elements each having a surface boundary with respect to a heat transfer fluid, having successive elements or regions having varying size scales. According to one embodiment, an accumulation of dust or particles on a surface of the heatsink is reduced by a removal mechanism. The mechanism can be thermal pyrolysis, vibration, blowing, etc. In the case of vibration, adverse effects on the system to be cooled may be minimized by an active or passive vibration suppression system.

18 Claims, 22 Drawing Sheets

Related U.S. Application Data continuation of application No. 15/648,065, filed on Jul. 12, 2017, now Pat. No. 10,830,545.

(60) Provisional application No. 62/361,253, filed on Jul. 12, 2016.

(51) Int. Cl.
| | |
|---|---|
| *H05K 1/02* | (2006.01) |
| *F28F 13/12* | (2006.01) |
| *F28G 1/16* | (2006.01) |
| *F28G 9/00* | (2006.01) |
| *F28D 21/00* | (2006.01) |

(52) U.S. Cl.
CPC ....... *H05K 1/0203* (2013.01); *H05K 7/20418* (2013.01); *F28D 2021/0029* (2013.01); *F28F 2215/10* (2013.01); *F28F 2255/14* (2013.01)

(58) Field of Classification Search
CPC .... F28F 13/12; F28F 2215/10; F28F 2245/06; F28F 3/02; H05K 1/0203; H05K 7/20418
See application file for complete search history.

(56) References Cited

U.S. PATENT DOCUMENTS

| | | |
|---|---|---|
| 4,715,438 A | 12/1987 | Gabuzda et al. |
| 4,769,644 A | 9/1988 | Frazier |
| 4,819,200 A | 4/1989 | Chua et al. |
| 4,904,073 A | 2/1990 | Lawton et al. |
| 4,931,626 A | 6/1990 | Shikama et al. |
| 5,134,685 A | 7/1992 | Rosenbluth |
| 5,224,663 A | 7/1993 | Criswell |
| 5,354,017 A | 10/1994 | Levich |
| 5,371,753 A | 12/1994 | Adsett |
| 5,396,413 A | 3/1995 | Kaneko et al. |
| 5,443,727 A | 8/1995 | Gagnon |
| 5,453,844 A | 9/1995 | George et al. |
| 5,471,991 A | 12/1995 | Shinnar |
| 5,483,098 A | 1/1996 | Joiner, Jr. |
| 5,510,598 A | 4/1996 | Kawam et al. |
| 5,548,481 A | 8/1996 | Salisbury et al. |
| 5,549,795 A | 8/1996 | Gregoire et al. |
| 5,566,377 A | 10/1996 | Lee |
| 5,600,073 A | 2/1997 | Hill |
| 5,616,246 A | 4/1997 | Gagnon et al. |
| 5,649,507 A | 7/1997 | Gregoire et al. |
| 5,655,210 A | 8/1997 | Gregoire et al. |
| 5,714,691 A | 2/1998 | Hill |
| 5,774,357 A | 6/1998 | Hoffberg et al. |
| 5,781,460 A | 7/1998 | Nguyen et al. |
| 5,792,062 A | 8/1998 | Poon et al. |
| 5,797,736 A | 8/1998 | Menguc et al. |
| 5,803,301 A | 9/1998 | Sato et al. |
| 5,822,721 A | 10/1998 | Johnson et al. |
| 5,834,871 A | 11/1998 | Puskas |
| 5,839,080 A | 11/1998 | Muller et al. |
| 5,841,911 A | 11/1998 | Kopeika et al. |
| 5,842,937 A | 12/1998 | Dalton et al. |
| 5,843,301 A | 12/1998 | Esztergar et al. |
| 5,846,394 A | 12/1998 | Burlatsky et al. |
| 5,856,836 A | 1/1999 | Silverbrook |
| 5,867,386 A | 2/1999 | Hoffberg et al. |
| 5,870,284 A | 2/1999 | Stewart et al. |
| 5,872,443 A | 2/1999 | Williamson |
| 5,875,108 A | 2/1999 | Hoffberg et al. |
| 5,901,246 A | 5/1999 | Hoffberg et al. |
| 5,903,454 A | 5/1999 | Hoffberg et al. |
| 5,920,477 A | 7/1999 | Hoffberg et al. |
| 5,921,679 A | 7/1999 | Muzzio et al. |
| 5,928,726 A | 7/1999 | Butler et al. |
| 5,938,333 A | 8/1999 | Kearney |
| 5,938,594 A | 8/1999 | Poon et al. |
| 5,973,770 A | 10/1999 | Carter et al. |
| 6,002,588 A | 12/1999 | Vos et al. |
| 6,015,008 A | 1/2000 | Kogure et al. |
| 6,048,313 A | 4/2000 | Stonger |
| 6,051,075 A | 4/2000 | Kochergin et al. |
| 6,081,750 A | 6/2000 | Hoffberg et al. |
| 6,088,634 A | 7/2000 | Muller et al. |
| 6,092,009 A | 7/2000 | Glover |
| 6,122,570 A | 9/2000 | Muller et al. |
| 6,128,188 A | 10/2000 | Hanners |
| 6,138,060 A | 10/2000 | Conner et al. |
| 6,164,458 A | 12/2000 | Mandrin et al. |
| 6,219,592 B1 | 4/2001 | Muller et al. |
| 6,248,399 B1 | 6/2001 | Hehmann |
| 6,259,516 B1 | 7/2001 | Carter et al. |
| 6,276,370 B1 | 8/2001 | Fisch et al. |
| 6,277,522 B1 | 8/2001 | Omaru et al. |
| 6,292,721 B1 | 9/2001 | Conner et al. |
| 6,292,830 B1 | 9/2001 | Taylor et al. |
| 6,330,157 B1 | 12/2001 | Bezama et al. |
| 6,333,019 B1 | 12/2001 | Coppens |
| 6,333,852 B1 | 12/2001 | Lin |
| 6,347,263 B1 | 2/2002 | Johnson et al. |
| 6,398,736 B1 | 6/2002 | Seward |
| 6,400,996 B1 | 6/2002 | Hoffberg et al. |
| 6,418,424 B1 | 7/2002 | Hoffberg et al. |
| 6,422,998 B1 | 7/2002 | Vo-Dinh et al. |
| 6,433,749 B1 | 8/2002 | Thompson |
| 6,484,132 B1 | 11/2002 | Hively et al. |
| 6,487,442 B1 | 11/2002 | Wood |
| 6,502,067 B1 | 12/2002 | Hegger et al. |
| 6,512,996 B1 | 1/2003 | Praskovsky et al. |
| 6,544,187 B2 | 4/2003 | Seward |
| 6,544,309 B1 | 4/2003 | Hoefer et al. |
| 6,570,078 B2 | 5/2003 | Ludwig |
| 6,581,008 B2 | 6/2003 | Intriligator et al. |
| 6,597,906 B1 | 7/2003 | Van Leeuwen et al. |
| 6,606,034 B1 | 8/2003 | Muller et al. |
| 6,608,716 B1 | 8/2003 | Armstrong et al. |
| 6,610,917 B2 | 8/2003 | Ludwig |
| 6,616,327 B1 | 9/2003 | Kearney et al. |
| 6,640,145 B2 | 10/2003 | Hoffberg et al. |
| 6,641,471 B1 | 11/2003 | Pinheiro et al. |
| 6,641,796 B2 | 11/2003 | Micco et al. |
| 6,679,272 B2 | 1/2004 | Bran et al. |
| 6,688,381 B2 | 2/2004 | Pence et al. |
| 6,689,486 B2 | 2/2004 | Ho et al. |
| 6,689,947 B2 | 2/2004 | Ludwig |
| 6,691,004 B2 | 2/2004 | Johnson et al. |
| 6,707,837 B1 | 3/2004 | Muller |
| 6,710,723 B2 | 3/2004 | Muller et al. |
| 6,716,557 B2 | 4/2004 | Omaru et al. |
| 6,717,661 B1 | 4/2004 | Bernstein et al. |
| 6,721,572 B1 | 4/2004 | Smith et al. |
| 6,736,195 B2 | 5/2004 | Busch et al. |
| 6,742,924 B2 | 6/2004 | Kearney |
| 6,781,690 B2 | 8/2004 | Armstrong et al. |
| 6,816,786 B2 | 11/2004 | Intriligator et al. |
| 6,849,795 B2 | 2/2005 | Ludwig |
| 6,850,252 B1 | 2/2005 | Hoffberg |
| 6,852,919 B2 | 2/2005 | Ludwig |
| 6,865,083 B2 | 3/2005 | Liu |
| 6,876,320 B2 | 4/2005 | Puente Baliarda |
| 6,895,375 B2 | 5/2005 | Malah et al. |
| 6,898,216 B1 | 5/2005 | Kleinschmidt |
| 6,905,595 B2 | 6/2005 | Gebauer |
| 6,906,296 B2 | 6/2005 | Centanni et al. |
| 6,909,198 B2 | 6/2005 | Ragwitz et al. |
| 6,937,473 B2 | 8/2005 | Cheng et al. |
| 6,941,973 B2 | 9/2005 | Hehmann |
| 6,942,767 B1 | 9/2005 | Fazzina et al. |
| 6,945,094 B2 | 9/2005 | Eggen et al. |
| 6,967,315 B2 | 11/2005 | Centanni et al. |
| 6,969,327 B2 | 11/2005 | Aoyama et al. |
| 6,971,383 B2 | 12/2005 | Hickey et al. |
| 6,980,092 B2 | 12/2005 | Turnbull et al. |
| 6,986,739 B2 | 1/2006 | Warren et al. |
| 6,988,066 B2 | 1/2006 | Malah |
| 6,993,377 B2 | 1/2006 | Flick et al. |
| 6,994,045 B2 | 2/2006 | Paszkowski |

(56) References Cited

U.S. PATENT DOCUMENTS

| | | |
|---|---|---|
| 7,001,521 B2 | 2/2006 | Paananen et al. |
| 7,006,881 B1 | 2/2006 | Hoffberg et al. |
| 7,018,418 B2 | 3/2006 | Amrich et al. |
| 7,038,123 B2 | 5/2006 | Ludwig |
| 7,050,605 B2 | 5/2006 | Gerson et al. |
| 7,080,989 B2 | 7/2006 | Gates |
| 7,096,121 B2 | 8/2006 | Intriligator et al. |
| 7,103,480 B2 | 9/2006 | Intriligator et al. |
| 7,113,402 B2 | 9/2006 | Rutledge et al. |
| 7,117,108 B2 | 10/2006 | Rapp et al. |
| 7,117,131 B2 | 10/2006 | Binnig |
| 7,123,359 B2 | 10/2006 | Armstrong et al. |
| 7,128,833 B2 | 10/2006 | Jumppanen et al. |
| 7,129,091 B2 | 10/2006 | Ismagilov et al. |
| 7,136,710 B1 | 11/2006 | Hoffberg et al. |
| 7,177,282 B1 | 2/2007 | Gilbert et al. |
| 7,178,941 B2 | 2/2007 | Roberge et al. |
| 7,195,058 B2 | 3/2007 | Wolford et al. |
| 7,216,074 B2 | 5/2007 | Malah et al. |
| 7,217,878 B2 | 5/2007 | Ludwig |
| 7,226,539 B2 | 6/2007 | Dong et al. |
| 7,238,085 B2 | 7/2007 | Montierth et al. |
| 7,242,988 B1 | 7/2007 | Hoffberg et al. |
| 7,256,751 B2 | 8/2007 | Cohen |
| 7,258,632 B2 | 8/2007 | Aoyama et al. |
| 7,263,130 B1 | 8/2007 | Mitlin |
| 7,265,826 B2 | 9/2007 | Mottin |
| 7,272,599 B1 | 9/2007 | Gilbert et al. |
| 7,273,456 B2 | 9/2007 | May et al. |
| 7,276,026 B2 | 10/2007 | Skinner |
| 7,296,014 B1 | 11/2007 | Gilbert et al. |
| 7,303,491 B2 | 12/2007 | Nardacci et al. |
| 7,303,682 B2 | 12/2007 | Paananen et al. |
| 7,309,828 B2 | 12/2007 | Ludwig |
| 7,309,829 B1 | 12/2007 | Ludwig |
| 7,327,226 B2 | 2/2008 | Turnbull et al. |
| 7,351,360 B2 | 4/2008 | Hougham et al. |
| 7,376,553 B2 | 5/2008 | Quinn |
| 7,390,408 B2 | 6/2008 | Kearney et al. |
| 7,407,586 B2 | 8/2008 | Jumppanen et al. |
| 7,408,108 B2 | 8/2008 | Ludwig |
| 7,411,791 B2 | 8/2008 | Chang et al. |
| 7,416,903 B2 | 8/2008 | Sklar et al. |
| 7,417,954 B1 | 8/2008 | Gilbert et al. |
| 7,422,910 B2 | 9/2008 | Fitzgerald et al. |
| 7,442,360 B2 | 10/2008 | Tonkovich et al. |
| 7,451,005 B2 | 11/2008 | Hoffberg et al. |
| 7,485,343 B1 | 2/2009 | Branson et al. |
| 7,495,671 B2 | 2/2009 | Chemel et al. |
| 7,496,000 B2 | 2/2009 | Vosburgh et al. |
| 7,502,034 B2 | 3/2009 | Chemel et al. |
| 7,507,380 B2 | 3/2009 | Chang et al. |
| 7,507,902 B2 | 3/2009 | Ludwig |
| 7,513,839 B2 | 4/2009 | Nardacci et al. |
| 7,539,533 B2 | 5/2009 | Tran |
| 7,551,519 B2 | 6/2009 | Slater |
| 7,554,511 B2 | 6/2009 | Fager et al. |
| 7,558,622 B2 | 7/2009 | Tran |
| 7,569,354 B2 | 8/2009 | Okano et al. |
| 7,588,505 B2 | 9/2009 | Hebert et al. |
| 7,589,742 B2 | 9/2009 | Street et al. |
| 7,590,589 B2 | 9/2009 | Hoffberg |
| 7,604,956 B2 | 10/2009 | Drukier |
| 7,613,604 B1 | 11/2009 | Malah et al. |
| 7,614,406 B2 | 11/2009 | Bran |
| 7,630,931 B1 | 12/2009 | Rachev et al. |
| 7,638,704 B2 | 12/2009 | Ludwig |
| 7,641,865 B2 | 1/2010 | Tonkovich et al. |
| 7,646,029 B2 | 1/2010 | Mueller et al. |
| 7,646,607 B2 | 1/2010 | Gallina et al. |
| 7,650,319 B2 | 1/2010 | Hoffberg et al. |
| 7,652,208 B1 | 1/2010 | Ludwig |
| 7,655,341 B2 | 2/2010 | Strobel et al. |
| 7,689,283 B1 | 3/2010 | Schecter |
| 7,696,890 B2 | 4/2010 | Bandholz et al. |
| 7,710,424 B1 | 5/2010 | Hutchins et al. |
| 7,724,258 B2 | 5/2010 | Ebert et al. |
| 7,727,746 B2 | 6/2010 | Foody et al. |
| 7,728,837 B2 | 6/2010 | Szymanski et al. |
| 7,733,224 B2 | 6/2010 | Tran |
| 7,744,855 B2 | 6/2010 | Staniforth et al. |
| 7,757,866 B2 | 7/2010 | McCutchen |
| 7,759,571 B2 | 7/2010 | Ludwig |
| 7,767,902 B2 | 8/2010 | Ludwig |
| 7,769,782 B1 | 8/2010 | Gilbert et al. |
| 7,772,966 B2 | 8/2010 | Turnbull et al. |
| 7,778,029 B2 | 8/2010 | Ueno |
| 7,782,459 B2 | 8/2010 | Holve |
| 7,786,370 B2 | 8/2010 | Ludwig |
| 7,804,186 B2 | 9/2010 | Freda |
| 7,813,822 B1 | 10/2010 | Hoffberg |
| 7,850,862 B2 | 12/2010 | Amrich et al. |
| 7,856,154 B2 | 12/2010 | Young |
| 7,857,756 B2 | 12/2010 | Warren et al. |
| 7,871,578 B2 | 1/2011 | Schmidt |
| 7,901,939 B2 | 3/2011 | Ismagliov et al. |
| 7,904,187 B2 | 3/2011 | Hoffberg et al. |
| 7,955,504 B1 | 6/2011 | Jovanovic et al. |
| 7,959,880 B2 | 6/2011 | Tonkovich et al. |
| 7,960,640 B2 | 6/2011 | Ludwig |
| 7,965,643 B1 | 6/2011 | Gilbert et al. |
| 7,966,078 B2 | 6/2011 | Hoffberg et al. |
| 7,974,714 B2 | 7/2011 | Hoffberg |
| 7,987,003 B2 | 7/2011 | Hoffberg et al. |
| 7,987,677 B2 | 8/2011 | McCutchen |
| 8,014,150 B2 | 9/2011 | Campbell et al. |
| 8,025,801 B2 | 9/2011 | McCutchen |
| 8,030,565 B2 | 10/2011 | Ludwig |
| 8,030,566 B2 | 10/2011 | Ludwig |
| 8,030,567 B2 | 10/2011 | Ludwig |
| 8,030,818 B2 | 10/2011 | Nelson et al. |
| 8,031,060 B2 | 10/2011 | Hoffberg et al. |
| 8,032,477 B1 | 10/2011 | Hoffberg et al. |
| 8,033,933 B2 | 10/2011 | Sullivan et al. |
| 8,035,024 B2 | 10/2011 | Ludwig |
| 8,037,927 B2 | 10/2011 | Schuette |
| 8,040,508 B2 | 10/2011 | Holve |
| 8,046,313 B2 | 10/2011 | Hoffberg et al. |
| RE42,882 E | 11/2011 | Kearney |
| 8,069,038 B2 | 11/2011 | Malah et al. |
| 8,080,819 B2 | 12/2011 | Mueller et al. |
| 8,089,173 B2 | 1/2012 | Freda |
| 8,101,160 B2 | 1/2012 | Staniforth et al. |
| 8,103,333 B2 | 1/2012 | Tran |
| 8,108,036 B2 | 1/2012 | Tran |
| 8,110,103 B2 | 2/2012 | Mormino et al. |
| 8,111,261 B1 | 2/2012 | Perlin |
| 8,114,438 B2 | 2/2012 | Pipkin et al. |
| 8,116,024 B2 | 2/2012 | Erden |
| 8,116,841 B2 | 2/2012 | Bly et al. |
| 8,137,216 B2 | 3/2012 | Sullivan et al. |
| 8,137,554 B2 | 3/2012 | Jovanovic et al. |
| 8,165,916 B2 | 4/2012 | Hoffberg et al. |
| 8,167,826 B2 | 5/2012 | Oohashi et al. |
| 8,178,990 B2 | 5/2012 | Freda |
| 8,182,573 B2 | 5/2012 | Stark et al. |
| 8,203,840 B2 | 6/2012 | Lin et al. |
| 8,207,821 B2 | 6/2012 | Roberge et al. |
| 8,208,698 B2 | 6/2012 | Bogdan |
| 8,210,171 B2 | 7/2012 | Denny et al. |
| 8,223,062 B2 | 7/2012 | Bunch et al. |
| 8,228,671 B2 | 7/2012 | Ikeda |
| 8,249,686 B2 | 8/2012 | Libbus et al. |
| 8,258,206 B2 | 9/2012 | Kanagasabapathy et al. |
| 8,262,909 B2 | 9/2012 | Angelescu et al. |
| 8,268,136 B2 | 9/2012 | McCutchen et al. |
| 8,273,245 B2 | 9/2012 | Jovanovic et al. |
| 8,273,330 B2 | 9/2012 | York et al. |
| 8,273,573 B2 | 9/2012 | Ismagilov et al. |
| 8,280,641 B1 | 10/2012 | Pellionisz |
| 8,285,356 B2 | 10/2012 | Bly et al. |
| 8,289,710 B2 | 10/2012 | Spearing et al. |
| 8,295,046 B2 | 10/2012 | St. Rock et al. |
| 8,304,193 B2 | 11/2012 | Ismagilov et al. |

(56) References Cited

U.S. PATENT DOCUMENTS

| | | |
|---|---|---|
| 8,323,188 B2 | 12/2012 | Tran |
| 8,329,407 B2 | 12/2012 | Ismagilov et al. |
| 8,352,400 B2 | 1/2013 | Hoffberg et al. |
| 8,361,622 B2 | 1/2013 | Gottschalk-Gaudig et al. |
| 8,364,136 B2 | 1/2013 | Hoffberg et al. |
| 8,369,967 B2 | 2/2013 | Hoffberg et al. |
| 8,371,291 B2 | 2/2013 | Haroutunian |
| 8,374,688 B2 | 2/2013 | Libbus et al. |
| 8,385,066 B2 | 2/2013 | Chang et al. |
| 8,388,401 B2 | 3/2013 | Lanahan |
| 8,395,276 B2 | 3/2013 | Freda |
| 8,395,629 B1 | 3/2013 | Kilpatrick et al. |
| 8,396,700 B2 | 3/2013 | Chakrabarty et al. |
| 8,400,766 B2 | 3/2013 | Kim |
| 8,402,490 B2 | 3/2013 | Hoffberg-Borghesani et al. |
| 8,409,807 B2 | 4/2013 | Neely et al. |
| 8,412,317 B2 | 4/2013 | Mazar |
| 8,414,182 B2 | 4/2013 | Paul et al. |
| 8,416,297 B2 | 4/2013 | Finn et al. |
| 8,449,471 B2 | 5/2013 | Tran |
| 8,460,126 B2 | 6/2013 | Sullivan et al. |
| 8,460,189 B2 | 6/2013 | Libbus et al. |
| 8,474,264 B2 | 7/2013 | McCutchen |
| 8,475,616 B2 | 7/2013 | McCutchen |
| 8,482,146 B2 | 7/2013 | Freda |
| 8,484,000 B2 | 7/2013 | Gulati |
| 8,491,683 B1 | 7/2013 | Brown-Fitzpatrick et al. |
| 8,492,164 B2 | 7/2013 | Fitzgerald et al. |
| 8,506,674 B1 | 8/2013 | Brown-Fitzpatrick et al. |
| 8,506,799 B2 | 8/2013 | Jorden et al. |
| 8,516,266 B2 | 8/2013 | Hoffberg et al. |
| 8,519,250 B2 | 8/2013 | Ludwig |
| 8,525,673 B2 | 9/2013 | Tran |
| 8,525,687 B2 | 9/2013 | Tran |
| 8,531,291 B2 | 9/2013 | Tran |
| 8,539,840 B2 | 9/2013 | Ariessohn et al. |
| 8,547,519 B2 | 10/2013 | Streefkerk et al. |
| 8,568,330 B2 | 10/2013 | Mollicone et al. |
| 8,577,184 B2 | 11/2013 | Young |
| 8,578,494 B1 | 11/2013 | Engler et al. |
| 8,583,263 B2 | 11/2013 | Hoffberg et al. |
| 8,591,430 B2 | 11/2013 | Amurthur et al. |
| 8,595,001 B2 | 11/2013 | Malah et al. |
| 8,598,730 B2 | 12/2013 | Freda |
| 8,600,830 B2 | 12/2013 | Hoffberg |
| 8,602,599 B2 | 12/2013 | Zimmer et al. |
| 8,608,838 B2 | 12/2013 | Wong et al. |
| 8,621,867 B2 | 1/2014 | Galbraith |
| 8,623,212 B2 | 1/2014 | Irvin, Sr. et al. |
| 8,633,437 B2 | 1/2014 | Dantus et al. |
| 8,634,056 B2 | 1/2014 | Streefkerk et al. |
| 8,636,910 B2 | 1/2014 | Irvin, Sr. et al. |
| 8,641,194 B2 | 2/2014 | Primeau et al. |
| 8,666,196 B2 | 3/2014 | Young |
| 8,680,991 B2 | 3/2014 | Tran |
| 8,684,900 B2 | 4/2014 | Tran |
| 8,684,925 B2 | 4/2014 | Manicka et al. |
| 8,695,431 B2 | 4/2014 | Pearce |
| 8,707,729 B2 | 4/2014 | Schmidt et al. |
| 8,718,752 B2 | 5/2014 | Libbus et al. |
| 8,725,676 B1 | 5/2014 | Engler et al. |
| 8,725,677 B1 | 5/2014 | Engler et al. |
| 8,750,971 B2 | 6/2014 | Tran |
| 8,764,243 B2 | 7/2014 | Zimmer et al. |
| 8,764,651 B2 | 7/2014 | Tran |
| 8,771,499 B2 | 7/2014 | McCutchen et al. |
| 8,784,540 B2 | 7/2014 | Rubit et al. |
| 8,790,257 B2 | 7/2014 | Libbus et al. |
| 8,790,259 B2 | 7/2014 | Katra et al. |
| 8,794,927 B2 | 8/2014 | Vassilicos |
| 8,808,113 B2 | 8/2014 | Aoyama et al. |
| 8,822,148 B2 | 9/2014 | Ismagilov et al. |
| 8,839,527 B2 | 9/2014 | Ben-Shmuel et al. |
| 8,859,876 B2 | 10/2014 | Ludwig |
| 8,861,075 B2 | 10/2014 | Dantus et al. |
| 8,873,168 B2 | 10/2014 | Boone |
| 8,874,477 B2 | 10/2014 | Hoffberg |
| 8,877,072 B2 | 11/2014 | Sahai et al. |
| 8,882,552 B2 | 11/2014 | Lambert |
| 8,883,423 B2 | 11/2014 | Neely |
| 8,889,083 B2 | 11/2014 | Ismagilov et al. |
| 8,892,495 B2 | 11/2014 | Hoffberg et al. |
| 8,897,868 B2 | 11/2014 | Mazar et al. |
| 8,937,399 B2 | 1/2015 | Freda |
| 8,939,081 B1 | 1/2015 | Smith et al. |
| 8,940,361 B2 | 1/2015 | Smith et al. |
| 8,947,430 B1 | 2/2015 | Green et al. |
| 8,948,253 B2 | 2/2015 | Reckwerdt et al. |
| 8,961,667 B2 | 2/2015 | McCutchen et al. |
| 8,965,498 B2 | 2/2015 | Katra et al. |
| 8,968,585 B2 | 3/2015 | Malik et al. |
| 8,977,588 B1 | 3/2015 | Engler et al. |
| 9,011,646 B2 | 4/2015 | McCutchen et al. |
| 9,023,216 B2 | 5/2015 | Kochergin et al. |
| 9,028,405 B2 | 5/2015 | Tran |
| 9,045,651 B2 | 6/2015 | Chen et al. |
| 9,046,493 B2 | 6/2015 | Neely et al. |
| 9,061,267 B2 | 6/2015 | Gottschall et al. |
| 9,062,263 B2 | 6/2015 | Sevastyanov |
| 9,067,821 B2 | 6/2015 | Bleecher et al. |
| 9,085,019 B2 | 7/2015 | Zhang et al. |
| 9,090,890 B2 | 7/2015 | Malik et al. |
| 9,090,891 B2 | 7/2015 | Madero et al. |
| 9,091,865 B2 | 7/2015 | Hofmann et al. |
| 9,098,889 B2 | 8/2015 | Zhao et al. |
| 9,107,586 B2 | 8/2015 | Tran |
| 9,121,801 B2 | 9/2015 | Clark et al. |
| 9,125,566 B2 | 9/2015 | Libbus et al. |
| 9,125,574 B2 | 9/2015 | Zia et al. |
| 9,134,079 B2 | 9/2015 | Tonkovich et al. |
| 9,134,622 B2 | 9/2015 | Streefkerk et al. |
| 9,134,623 B2 | 9/2015 | Streefkerk et al. |
| 9,137,548 B2 | 9/2015 | Li et al. |
| 9,138,699 B2 | 9/2015 | Kulkarni et al. |
| 9,155,849 B2 | 10/2015 | Haroutunian |
| 9,165,717 B1 | 10/2015 | Yializis et al. |
| 9,167,633 B2 | 10/2015 | Ben-Shmuel et al. |
| 9,169,014 B2 | 10/2015 | Elson et al. |
| 9,173,615 B2 | 11/2015 | Katra et al. |
| 9,186,089 B2 | 11/2015 | Mazar et al. |
| 9,197,904 B2 | 11/2015 | Li et al. |
| 9,204,796 B2 | 12/2015 | Tran |
| 9,207,341 B2 | 12/2015 | Pearce |
| 9,228,785 B2 | 1/2016 | Poltorak |
| 9,233,862 B2 | 1/2016 | Bose et al. |
| 9,239,951 B2 | 1/2016 | Hoffberg et al. |
| 9,248,501 B1 | 2/2016 | Johannes et al. |
| 9,254,496 B2 | 2/2016 | Dhiman et al. |
| 9,256,001 B2 | 2/2016 | Pearce |
| 9,262,723 B2 | 2/2016 | Luvalle |
| 9,278,362 B2 | 3/2016 | Wells et al. |
| 9,278,374 B2 | 3/2016 | Wohl, Jr. et al. |
| 9,279,073 B2 | 3/2016 | Bleecher et al. |
| 9,284,520 B2 | 3/2016 | Malik et al. |
| 9,292,916 B2 | 3/2016 | Rowe |
| 9,309,162 B2 | 4/2016 | Azimi et al. |
| 9,311,670 B2 | 4/2016 | Hoffberg |
| 9,314,181 B2 | 4/2016 | Brockway et al. |
| 9,320,443 B2 | 4/2016 | Libbus et al. |
| 9,326,697 B2 | 5/2016 | Linker |
| 9,327,325 B1 * | 5/2016 | Bradford, Jr. ............. F28G 7/00 |
| 9,329,107 B2 | 5/2016 | Ismagilov et al. |
| 9,339,459 B2 | 5/2016 | York et al. |
| 9,339,616 B2 | 5/2016 | Denny et al. |
| 9,340,802 B2 | 5/2016 | Trevethick |
| 9,351,928 B2 | 5/2016 | Staniforth et al. |
| 9,355,774 B2 | 5/2016 | Mathieu et al. |
| 9,360,457 B2 | 6/2016 | Neely et al. |
| 9,371,173 B2 | 6/2016 | Smith et al. |
| 9,381,528 B2 | 7/2016 | Dhiman et al. |
| 9,389,204 B2 | 7/2016 | Cloutier et al. |
| 9,411,936 B2 | 8/2016 | Landrum et al. |
| 9,416,343 B2 | 8/2016 | Malik et al. |
| 9,427,676 B2 | 8/2016 | Howard |

(56) References Cited

U.S. PATENT DOCUMENTS

| | | |
|---|---|---|
| 9,427,679 B2 | 8/2016 | Mahmoudi et al. |
| 9,430,869 B1 | 8/2016 | Kilpatrick et al. |
| 9,440,171 B2 | 9/2016 | McCutchen |
| 9,451,897 B2 | 9/2016 | Mazar et al. |
| 9,458,399 B2 | 10/2016 | Wei et al. |
| 9,469,553 B2 | 10/2016 | Irvin, Sr. |
| 9,475,026 B2 | 10/2016 | Fitzgerald et al. |
| 9,488,648 B2 | 11/2016 | Neely et al. |
| 9,498,934 B2 | 11/2016 | Paxson et al. |
| 9,500,855 B2 | 11/2016 | Rossbach |
| 9,503,696 B2 | 11/2016 | Tillotson |
| 9,518,291 B2 | 12/2016 | Malik et al. |
| 9,535,563 B2 | 1/2017 | Hoffberg et al. |
| 9,538,960 B2 | 1/2017 | Mazar et al. |
| 9,549,691 B2 | 1/2017 | Tran |
| RE46,310 E | 2/2017 | Hoffberg et al. |
| 9,579,020 B2 | 2/2017 | Libbus et al. |
| 9,579,622 B2 | 2/2017 | Ismagilov et al. |
| 9,580,742 B2 | 2/2017 | Kelley et al. |
| 9,585,757 B2 | 3/2017 | Slocum, Jr. et al. |
| 9,592,506 B2 | 3/2017 | Ismagilov et al. |
| 9,599,269 B2 | 3/2017 | Malik |
| 9,611,556 B2 | 4/2017 | McCutchen et al. |
| 9,618,438 B2 | 4/2017 | Jorden |
| 9,625,075 B2 | 4/2017 | Smith et al. |
| 9,643,877 B2 | 5/2017 | Sekhar et al. |
| 9,648,313 B1 | 5/2017 | Henry et al. |
| 9,650,661 B2 | 5/2017 | Witcher et al. |
| 9,675,270 B2 | 6/2017 | Sarkar |
| 9,676,684 B2 | 6/2017 | Duerr et al. |
| 9,682,225 B2 | 6/2017 | Rubinson et al. |
| 9,683,756 B2 | 6/2017 | Barmore |
| 9,684,011 B2 | 6/2017 | Barille |
| 9,700,529 B2 | 7/2017 | York et al. |
| 9,702,852 B2 | 7/2017 | Lowery, Jr. et al. |
| 9,706,956 B2 | 7/2017 | Brockway et al. |
| 9,709,028 B2 | 7/2017 | Freda |
| 9,713,431 B2 | 7/2017 | Brockway et al. |
| 9,714,940 B2 | 7/2017 | Lowery, Jr. et al. |
| 9,727,042 B2 | 8/2017 | Hoffberg-Borghesani et al. |
| 9,738,046 B2 | 8/2017 | Parker et al. |
| 9,748,628 B1 | 8/2017 | Hiller |
| 9,770,182 B2 | 9/2017 | Bly et al. |
| 9,775,520 B2 | 10/2017 | Tran |
| 9,775,694 B2 | 10/2017 | Tutak |
| 9,791,170 B2 | 10/2017 | Van Der Merwe |
| 9,800,323 B2 | 10/2017 | Auricchio, Jr. et al. |
| 9,803,623 B2 | 10/2017 | Burkle |
| 9,816,705 B2 | 11/2017 | Martin et al. |
| 9,818,136 B1 | 11/2017 | Hoffberg |
| 9,820,658 B2 | 11/2017 | Tran |
| 9,827,963 B2 | 11/2017 | Fletcher et al. |
| 9,834,464 B1 | 12/2017 | Hawthorne |
| 9,836,667 B2 | 12/2017 | Dickrell, III et al. |
| 9,839,893 B2 | 12/2017 | Ismagilov et al. |
| 9,851,145 B2 | 12/2017 | McCutchen et al. |
| 9,855,752 B2 | 1/2018 | Williams et al. |
| 9,868,108 B2 | 1/2018 | Gottschall et al. |
| 9,872,345 B2 | 1/2018 | Ben-Shmuel et al. |
| 9,889,446 B2 | 2/2018 | Ismagilov et al. |
| 9,901,252 B2 | 2/2018 | Tran |
| 9,907,473 B2 | 3/2018 | Tran |
| 9,926,478 B2 | 3/2018 | Bleecher et al. |
| 9,938,390 B2 | 4/2018 | Storti et al. |
| 9,947,481 B2 | 4/2018 | Solomon et al. |
| 9,952,148 B2 | 4/2018 | Georgakoudi et al. |
| 9,952,515 B2 | 4/2018 | Streefkerk et al. |
| 9,961,812 B2 | 5/2018 | Suorsa |
| 9,968,933 B2 | 5/2018 | Ismagilov et al. |
| 9,975,064 B2 | 5/2018 | Mahmoudi et al. |
| 9,993,948 B2 | 6/2018 | Zhang et al. |
| 2001/0031238 A1 | 10/2001 | Omaru et al. |
| 2001/0032814 A1 | 10/2001 | Kearney et al. |
| 2001/0053741 A1 | 12/2001 | Micco et al. |
| 2001/0056316 A1 | 12/2001 | Johnson et al. |
| 2002/0005108 A1 | 1/2002 | Ludwig |
| 2002/0010710 A1 | 1/2002 | Binnig |
| 2002/0032510 A1 | 3/2002 | Turnbull et al. |
| 2002/0056358 A1 | 5/2002 | Ludwig |
| 2002/0058469 A1 | 5/2002 | Pinheiro et al. |
| 2002/0080563 A1 | 6/2002 | Pence et al. |
| 2002/0015150 A1 | 7/2002 | Armstrong et al. |
| 2002/0107638 A1 | 8/2002 | Intriligator et al. |
| 2002/0113719 A1 | 8/2002 | Muller et al. |
| 2002/0128554 A1 | 9/2002 | Seward |
| 2002/0151992 A1 | 10/2002 | Hoffberg et al. |
| 2002/0196706 A1 | 12/2002 | Kearney |
| 2003/0041801 A1 | 3/2003 | Hehmann |
| 2003/0050219 A1 | 3/2003 | Micco et al. |
| 2003/0065401 A1 | 4/2003 | Amrich et al. |
| 2003/0093278 A1 | 5/2003 | Malah |
| 2003/0093279 A1 | 5/2003 | Malah et al. |
| 2003/0094141 A1 | 5/2003 | Davis |
| 2003/0100824 A1 | 5/2003 | Warren et al. |
| 2003/0137442 A1 | 7/2003 | Baliarda |
| 2003/0155110 A1 | 8/2003 | Joshi et al. |
| 2003/0156738 A1 | 8/2003 | Gerson et al. |
| 2003/0160457 A1 | 8/2003 | Ragwitz et al. |
| 2003/0162835 A1 | 8/2003 | Staniforth et al. |
| 2003/0165436 A1 | 9/2003 | Staniforth et al. |
| 2003/0171667 A1 | 9/2003 | Seward |
| 2003/0182246 A1 | 9/2003 | Johnson et al. |
| 2003/0183368 A1 | 10/2003 | Paradis et al. |
| 2003/0184450 A1 | 10/2003 | Muller et al. |
| 2003/0207338 A1 | 11/2003 | Sklar et al. |
| 2003/0220740 A1 | 11/2003 | Intriligator et al. |
| 2003/0232020 A1 | 12/2003 | York et al. |
| 2004/0006566 A1 | 1/2004 | Taylor et al. |
| 2004/0065187 A1 | 4/2004 | Ludwig |
| 2004/0069125 A1 | 4/2004 | Ludwig |
| 2004/0069126 A1 | 4/2004 | Ludwig |
| 2004/0069127 A1 | 4/2004 | Ludwig |
| 2004/0069128 A1 | 4/2004 | Ludwig |
| 2004/0069129 A1 | 4/2004 | Ludwig |
| 2004/0069131 A1 | 4/2004 | Ludwig |
| 2004/0074379 A1 | 4/2004 | Ludwig |
| 2004/0078219 A1 | 4/2004 | Kaylor et al. |
| 2004/0094021 A1 | 5/2004 | Ludwig |
| 2004/0099127 A1 | 5/2004 | Ludwig |
| 2004/0099128 A1 | 5/2004 | Ludwig |
| 2004/0099129 A1 | 5/2004 | Ludwig |
| 2004/0099131 A1 | 5/2004 | Ludwig |
| 2004/0104934 A1 | 6/2004 | Fager et al. |
| 2004/0118268 A1 | 6/2004 | Ludwig |
| 2004/0123864 A1 | 7/2004 | Hickey et al. |
| 2004/0129641 A1 | 7/2004 | Paananen et al. |
| 2004/0131688 A1 | 7/2004 | Dov et al. |
| 2004/0140252 A1 | 7/2004 | Gebauer |
| 2004/0150666 A1 | 8/2004 | Fager et al. |
| 2004/0150818 A1 | 8/2004 | Armstrong et al. |
| 2004/0163528 A1 | 8/2004 | Ludwig |
| 2004/0166414 A1 | 8/2004 | Omaru et al. |
| 2004/0171939 A1 | 9/2004 | May et al. |
| 2004/0182855 A1 | 9/2004 | Centanni |
| 2004/0187861 A1 | 9/2004 | Harrison et al. |
| 2004/0213084 A1 | 10/2004 | Kearney |
| 2004/0217011 A1 | 11/2004 | Strobel et al. |
| 2004/0243328 A1 | 12/2004 | Rapp et al. |
| 2004/0253365 A1 | 12/2004 | Warren et al. |
| 2005/0000879 A1 | 1/2005 | Kearney et al. |
| 2005/0003737 A1 | 1/2005 | Montierth et al. |
| 2005/0008179 A1 | 1/2005 | Quinn |
| 2005/0011829 A1 | 1/2005 | Dong et al. |
| 2005/0061221 A1 | 3/2005 | Paszkowski |
| 2005/0087122 A1 | 4/2005 | Ismagilov et al. |
| 2005/0087767 A1 | 4/2005 | Fitzgerald et al. |
| 2005/0095168 A1 | 5/2005 | Centanni et al. |
| 2005/0101841 A9 | 5/2005 | Kaylor et al. |
| 2005/0106310 A1 | 5/2005 | Green et al. |
| 2005/0116336 A1 | 6/2005 | Chopra et al. |
| 2005/0120870 A1 | 6/2005 | Ludwig |
| 2005/0126373 A1 | 6/2005 | Ludwig |
| 2005/0126374 A1 | 6/2005 | Ludwig |
| 2005/0128751 A1 | 6/2005 | Roberge et al. |

(56) References Cited

U.S. PATENT DOCUMENTS

| | | |
|---|---|---|
| 2005/0131089 A1 | 6/2005 | Kocon et al. |
| 2005/0137032 A1 | 6/2005 | Aoyama et al. |
| 2005/0159894 A1 | 7/2005 | Intriligator et al. |
| 2005/0174473 A1 | 8/2005 | Morgan et al. |
| 2005/0187759 A1 | 8/2005 | Malah et al. |
| 2005/0220681 A1 | 10/2005 | Chang et al. |
| 2005/0245659 A1 | 11/2005 | Chen |
| 2005/0248299 A1 | 11/2005 | Chemel et al. |
| 2005/0265915 A1 | 12/2005 | Tonkovich et al. |
| 2005/0267685 A1 | 12/2005 | Intriligator et al. |
| 2005/0272110 A1 | 12/2005 | Drukier |
| 2005/0272159 A1 | 12/2005 | Ismagilov et al. |
| 2005/0275626 A1 | 12/2005 | Mueller et al. |
| 2006/0002110 A1 | 1/2006 | Dowling et al. |
| 2006/0011326 A1 | 1/2006 | Yuval |
| 2006/0022214 A1 | 2/2006 | Morgan et al. |
| 2006/0024435 A1 | 2/2006 | Holunga et al. |
| 2006/0025245 A1 | 2/2006 | Aoyama et al. |
| 2006/0032364 A1 | 2/2006 | Ludwig |
| 2006/0037177 A1 | 2/2006 | Blum et al. |
| 2006/0072289 A1 | 4/2006 | Rutledge et al. |
| 2006/0087509 A1 | 4/2006 | Ebert et al. |
| 2006/0090632 A1 | 5/2006 | Ludwig |
| 2006/0097855 A1 | 5/2006 | Turnbull et al. |
| 2006/0113065 A1 | 6/2006 | Wolford et al. |
| 2006/0124550 A1 | 6/2006 | Paananen et al. |
| 2006/0129161 A1 | 6/2006 | Amrich et al. |
| 2006/0148591 A1 | 7/2006 | Hebert et al. |
| 2006/0154352 A1 | 7/2006 | Foody et al. |
| 2006/0155398 A1 | 7/2006 | Hoffberg et al. |
| 2006/0165898 A1 | 7/2006 | Kodas et al. |
| 2006/0167784 A1 | 7/2006 | Hoffberg |
| 2006/0172824 A1 | 8/2006 | Nardacci et al. |
| 2006/0191534 A1 | 8/2006 | Hickey et al. |
| 2006/0200253 A1 | 9/2006 | Hoffberg et al. |
| 2006/0200258 A1 | 9/2006 | Hoffberg et al. |
| 2006/0200259 A1 | 9/2006 | Hoffberg et al. |
| 2006/0200260 A1 | 9/2006 | Hoffberg et al. |
| 2006/0237178 A1 | 10/2006 | Katoh et al. |
| 2006/0245987 A1 | 11/2006 | Schmidt |
| 2006/0260638 A1 | 11/2006 | Fani et al. |
| 2006/0262876 A1 | 11/2006 | LaDue |
| 2006/0275185 A1 | 12/2006 | Tonkovich et al. |
| 2007/0016476 A1 | 1/2007 | Hoffberg et al. |
| 2007/0032733 A1 | 2/2007 | Burton |
| 2007/0041159 A1 | 2/2007 | Bate |
| 2007/0053513 A1 | 3/2007 | Hoffberg |
| 2007/0055151 A1 | 3/2007 | Shertukde et al. |
| 2007/0058346 A1 | 3/2007 | Yeh |
| 2007/0059763 A1 | 3/2007 | Okano et al. |
| 2007/0061022 A1 | 3/2007 | Hoffberg-Borghesani et al. |
| 2007/0061023 A1 | 3/2007 | Hoffberg et al. |
| 2007/0061735 A1 | 3/2007 | Hoffberg et al. |
| 2007/0070038 A1 | 3/2007 | Hoffberg et al. |
| 2007/0087756 A1 | 4/2007 | Hoffberg |
| 2007/0145915 A1 | 6/2007 | Roberge et al. |
| 2007/0172954 A1 | 7/2007 | Ismagilov et al. |
| 2007/0175472 A1 | 8/2007 | Pipkin et al. |
| 2007/0189026 A1 | 8/2007 | Chemel et al. |
| 2007/0191740 A1 | 8/2007 | Shertukde et al. |
| 2007/0206016 A1 | 9/2007 | Szymanski et al. |
| 2007/0206023 A1 | 9/2007 | Street et al. |
| 2007/0221218 A1 | 9/2007 | Warden et al. |
| 2007/0230135 A1 | 10/2007 | Feger et al. |
| 2007/0236406 A1 | 10/2007 | Wen et al. |
| 2007/0239003 A1 | 10/2007 | Shertukde et al. |
| 2007/0242955 A1 | 10/2007 | Kavehrad |
| 2007/0258329 A1 | 11/2007 | Winey |
| 2007/0273504 A1 | 11/2007 | Tran |
| 2007/0276270 A1 | 11/2007 | Tran |
| 2007/0297285 A1 | 12/2007 | Cross et al. |
| 2007/0299292 A1 | 12/2007 | Cross et al. |
| 2008/0001735 A1 | 1/2008 | Tran |
| 2008/0004904 A1 | 1/2008 | Tran |
| 2008/0013747 A1 | 1/2008 | Tran |
| 2008/0017219 A1 | 1/2008 | Franklin |
| 2008/0024923 A1 | 1/2008 | Tomimoto et al. |
| 2008/0040749 A1 | 2/2008 | Hoffberg et al. |
| 2008/0043029 A1 | 2/2008 | Nardacci et al. |
| 2008/0080137 A1 | 4/2008 | Otsuki et al. |
| 2008/0103655 A1 | 5/2008 | Turnbull et al. |
| 2008/0108122 A1 | 5/2008 | Paul et al. |
| 2008/0115916 A1 | 5/2008 | Schuette |
| 2008/0121373 A1 | 5/2008 | Wang et al. |
| 2008/0121374 A1 | 5/2008 | Wang et al. |
| 2008/0135211 A1 | 6/2008 | Yassour |
| 2008/0145633 A1 | 6/2008 | Kodas et al. |
| 2008/0149304 A1 | 6/2008 | Slaughter |
| 2008/0151694 A1 | 6/2008 | Slater |
| 2008/0168987 A1 | 7/2008 | Denny et al. |
| 2008/0173059 A1 | 7/2008 | Gautreau et al. |
| 2008/0192576 A1 | 8/2008 | Vosburgh et al. |
| 2008/0233356 A1 | 9/2008 | Loher et al. |
| 2008/0268246 A1 | 10/2008 | Stark et al. |
| 2008/0281238 A1 | 11/2008 | Oohashi et al. |
| 2008/0294019 A1 | 11/2008 | Tran |
| 2009/0004074 A1 | 1/2009 | Tonkovich et al. |
| 2009/0016019 A1 | 1/2009 | Bandholz et al. |
| 2009/0017941 A1 | 1/2009 | Sullivan et al. |
| 2009/0021270 A1 | 1/2009 | Bandholz et al. |
| 2009/0021513 A1 | 1/2009 | Joshi et al. |
| 2009/0032104 A1 | 2/2009 | Lee et al. |
| 2009/0042200 A1 | 2/2009 | Okano et al. |
| 2009/0042739 A1 | 2/2009 | Okano et al. |
| 2009/0045967 A1 | 2/2009 | Bandholz et al. |
| 2009/0050293 A1 | 2/2009 | Kuo |
| 2009/0071624 A1 | 3/2009 | Zhang et al. |
| 2009/0074627 A1 | 3/2009 | Fitzgerald et al. |
| 2009/0079981 A1 | 3/2009 | Holve |
| 2009/0135042 A1 | 5/2009 | Umishita et al. |
| 2009/0146435 A1 | 6/2009 | Freda |
| 2009/0159461 A1 | 6/2009 | McCutchen et al. |
| 2009/0161312 A1 | 6/2009 | Spearing et al. |
| 2009/0162853 A1 | 6/2009 | Clark et al. |
| 2009/0162920 A1 | 6/2009 | Vanhoutte et al. |
| 2009/0166273 A1 | 7/2009 | Mormino et al. |
| 2009/0181805 A1 | 7/2009 | Sullivan et al. |
| 2009/0200176 A1 | 8/2009 | McCutchen et al. |
| 2009/0207087 A1 | 8/2009 | Fang et al. |
| 2009/0208582 A1 | 8/2009 | Johnston et al. |
| 2009/0217691 A1 | 9/2009 | Schmidt et al. |
| 2009/0227876 A1 | 9/2009 | Tran |
| 2009/0236333 A1 | 9/2009 | Ben-Shmuel et al. |
| 2009/0236334 A1 | 9/2009 | Ben-Shmuel et al. |
| 2009/0236335 A1 | 9/2009 | Ben-Shmuel et al. |
| 2009/0241545 A1 | 10/2009 | McCutchen |
| 2009/0245017 A1 | 10/2009 | Paul et al. |
| 2009/0272404 A1 | 11/2009 | Kim |
| 2009/0274549 A1 | 11/2009 | Mitchell et al. |
| 2009/0318779 A1 | 12/2009 | Tran |
| 2009/0321045 A1 | 12/2009 | Hernon et al. |
| 2009/0321047 A1 | 12/2009 | Chen |
| 2009/0325215 A1 | 12/2009 | Okano et al. |
| 2010/0012586 A1 | 1/2010 | Angelescu et al. |
| 2010/0016568 A1 | 1/2010 | Okano et al. |
| 2010/0016569 A1 | 1/2010 | Okano et al. |
| 2010/0018862 A1 | 1/2010 | Okano et al. |
| 2010/0021634 A1 | 1/2010 | Kodas et al. |
| 2010/0021725 A1 | 1/2010 | Gottschalk-Gaudig |
| 2010/0021933 A1 | 1/2010 | Okano et al. |
| 2010/0042408 A1 | 2/2010 | Malah et al. |
| 2010/0063393 A1 | 3/2010 | Moradi et al. |
| 2010/0073477 A1 | 3/2010 | Finn et al. |
| 2010/0076642 A1 | 3/2010 | Hoffberg et al. |
| 2010/0085713 A1 | 4/2010 | Balandin et al. |
| 2010/0089549 A1 | 4/2010 | Su et al. |
| 2010/0094152 A1 | 4/2010 | Semmlow |
| 2010/0100328 A1 | 4/2010 | Moore et al. |
| 2010/0101181 A1 | 4/2010 | Hamm-Dubischar |
| 2010/0110826 A1 | 5/2010 | D'herde |
| 2010/0115785 A1 | 5/2010 | Ben-Shmuel et al. |
| 2010/0115947 A1 | 5/2010 | Galbraith |
| 2010/0136676 A1 | 6/2010 | Vanhoutte et al. |
| 2010/0150718 A1 | 6/2010 | Freda |

(56) References Cited

U.S. PATENT DOCUMENTS

| | | |
|---|---|---|
| 2010/0151267 A1 | 6/2010 | Kodas et al. |
| 2010/0171145 A1 | 7/2010 | Morgan et al. |
| 2010/0195868 A1 | 8/2010 | Lu |
| 2010/0196811 A1 | 8/2010 | Gottschalk-Gaudig et al. |
| 2010/0202071 A1 | 8/2010 | Preumont et al. |
| 2010/0208065 A1 | 8/2010 | Heiner et al. |
| 2010/0219296 A1 | 9/2010 | Shelman-Cohen |
| 2010/0221343 A1 | 9/2010 | Johnston et al. |
| 2010/0221819 A1 | 9/2010 | Foody et al. |
| 2010/0226202 A1 | 9/2010 | Vassilicos et al. |
| 2010/0233026 A1 | 9/2010 | Ismagliov et al. |
| 2010/0235285 A1 | 9/2010 | Hoffberg |
| 2010/0236236 A1 | 9/2010 | Mankame et al. |
| 2010/0252648 A1 | 10/2010 | Robinson |
| 2010/0258198 A1 | 10/2010 | Tonkovich et al. |
| 2010/0277733 A1 | 11/2010 | Holve |
| 2010/0285142 A1 | 11/2010 | Staniforth et al. |
| 2010/0287822 A1 | 11/2010 | Wei et al. |
| 2010/0302093 A1 | 12/2010 | Bunch et al. |
| 2010/0307665 A1 | 12/2010 | McCutchen |
| 2010/0317420 A1 | 12/2010 | Hoffberg |
| 2011/0004513 A1 | 1/2011 | Hoffberg |
| 2011/0029922 A1 | 2/2011 | Hoffberg et al. |
| 2011/0031236 A1 | 2/2011 | Ben-Shmuel et al. |
| 2011/0032632 A1 | 2/2011 | Erden |
| 2011/0039078 A1 | 2/2011 | Brennan Fournet et al. |
| 2011/0049904 A1 | 3/2011 | Freda |
| 2011/0060533 A1 | 3/2011 | Jorden et al. |
| 2011/0075903 A1 | 3/2011 | Turiel Martinez |
| 2011/0080802 A1 | 4/2011 | Vassilicos et al. |
| 2011/0092817 A1 | 4/2011 | Cloutier et al. |
| 2011/0109910 A1 | 5/2011 | Georgakoudi et al. |
| 2011/0115624 A1 | 5/2011 | Tran |
| 2011/0142734 A1 | 6/2011 | Ismagliov et al. |
| 2011/0152729 A1 | 6/2011 | Oohashi et al. |
| 2011/0156896 A1 | 6/2011 | Hoffberg et al. |
| 2011/0167110 A1 | 7/2011 | Hoffberg et al. |
| 2011/0174462 A1 | 7/2011 | Arik et al. |
| 2011/0174622 A1 | 7/2011 | Ismagilov et al. |
| 2011/0176966 A1 | 7/2011 | Ismagilov et al. |
| 2011/0177494 A1 | 7/2011 | Ismagilov et al. |
| 2011/0177586 A1 | 7/2011 | Ismagilov et al. |
| 2011/0177609 A1 | 7/2011 | Ismagilov et al. |
| 2011/0179950 A1 | 7/2011 | Wong et al. |
| 2011/0181422 A1 | 7/2011 | Tran |
| 2011/0223043 A1* | 9/2011 | Tanaka ............ H01L 23/3672 417/410.1 |
| 2011/0226460 A1 | 9/2011 | Sommer |
| 2011/0253629 A1 | 10/2011 | Jovanovic et al. |
| 2011/0265480 A1 | 11/2011 | McCutchen |
| 2011/0280019 A1 | 11/2011 | Zimmer et al. |
| 2011/0311769 A1 | 12/2011 | Chen et al. |
| 2012/0009668 A1 | 1/2012 | Hass |
| 2012/0017232 A1 | 1/2012 | Hoffberg et al. |
| 2012/0026506 A1 | 2/2012 | Primeau et al. |
| 2012/0031272 A1 | 2/2012 | Rubit et al. |
| 2012/0035767 A1 | 2/2012 | Runkana et al. |
| 2012/0036016 A1 | 2/2012 | Hoffberg et al. |
| 2012/0040778 A1 | 2/2012 | Aoyama et al. |
| 2012/0043037 A1 | 2/2012 | Polat et al. |
| 2012/0057974 A1 | 3/2012 | Freda |
| 2012/0064243 A1 | 3/2012 | Akay et al. |
| 2012/0074051 A1 | 3/2012 | Gebauer et al. |
| 2012/0074062 A1 | 3/2012 | Jovanovic et al. |
| 2012/0088608 A1 | 4/2012 | Sullivan et al. |
| 2012/0092157 A1 | 4/2012 | Tran |
| 2012/0095352 A1 | 4/2012 | Tran |
| 2012/0097591 A1 | 4/2012 | Berthold et al. |
| 2012/0114709 A1 | 5/2012 | Staniforth et al. |
| 2012/0116769 A1 | 5/2012 | Malah et al. |
| 2012/0142814 A1 | 6/2012 | Kanagasabapathy et al. |
| 2012/0150651 A1 | 6/2012 | Hoffberg et al. |
| 2012/0160030 A1 | 6/2012 | Pearce |
| 2012/0161580 A1 | 6/2012 | Pearce |
| 2012/0163119 A1 | 6/2012 | Pearce |
| 2012/0163120 A1 | 6/2012 | Pearce |
| 2012/0164184 A1 | 6/2012 | Pipkin et al. |
| 2012/0164644 A1 | 6/2012 | Neely et al. |
| 2012/0168389 A1 | 7/2012 | Kochergin et al. |
| 2012/0174650 A1 | 7/2012 | Ariessohn et al. |
| 2012/0193221 A1 | 8/2012 | McCutchen et al. |
| 2012/0193923 A1 | 8/2012 | Freda |
| 2012/0196336 A1 | 8/2012 | McCutchen et al. |
| 2012/0255548 A1 | 10/2012 | Denny et al. |
| 2012/0261514 A1 | 10/2012 | Boone |
| 2012/0285660 A1* | 11/2012 | Poltorak ............ F28F 21/02 165/104.11 |
| 2012/0292246 A1 | 11/2012 | Jovanovic et al. |
| 2012/0293952 A1 | 11/2012 | Herring et al. |
| 2012/0298037 A1 | 11/2012 | Paul et al. |
| 2012/0301888 A1 | 11/2012 | Neely et al. |
| 2012/0318671 A1 | 12/2012 | McCutchen et al. |
| 2012/0329171 A1 | 12/2012 | Ismagliov et al. |
| 2012/0330109 A1 | 12/2012 | Tran |
| 2013/0001090 A1 | 1/2013 | Rubinson et al. |
| 2013/0009783 A1 | 1/2013 | Tran |
| 2013/0010257 A1 | 1/2013 | Primeau et al. |
| 2013/0029345 A1 | 1/2013 | Neely et al. |
| 2013/0042893 A1 | 2/2013 | Ariessohn et al. |
| 2013/0056460 A1 | 3/2013 | Ben-Shmuel et al. |
| 2013/0095494 A1 | 4/2013 | Neely |
| 2013/0101995 A1 | 4/2013 | Rustem et al. |
| 2013/0147598 A1 | 6/2013 | Hoffberg et al. |
| 2013/0155687 A1 | 6/2013 | Zimmer et al. |
| 2013/0156091 A1 | 6/2013 | Li et al. |
| 2013/0156092 A1 | 6/2013 | Li et al. |
| 2013/0156095 A1 | 6/2013 | Li et al. |
| 2013/0167441 A1 | 7/2013 | Sevastyanov |
| 2013/0170999 A1 | 7/2013 | Vassilicos |
| 2013/0172691 A1 | 7/2013 | Tran |
| 2013/0182214 A1 | 7/2013 | Hofmann et al. |
| 2013/0197105 A1 | 8/2013 | Pipkin et al. |
| 2013/0202182 A1 | 8/2013 | Rowe |
| 2013/0206165 A1 | 8/2013 | Busnaina et al. |
| 2013/0208560 A1 | 8/2013 | Kulkarni et al. |
| 2013/0214539 A1 | 8/2013 | Freda |
| 2013/0231574 A1 | 9/2013 | Tran |
| 2013/0231906 A1 | 9/2013 | Luvalle |
| 2013/0244238 A1 | 9/2013 | Neely et al. |
| 2013/0252373 A1 | 9/2013 | Siau et al. |
| 2013/0252848 A1 | 9/2013 | Okano et al. |
| 2013/0260367 A1 | 10/2013 | Lowery, Jr. et al. |
| 2013/0266944 A1 | 10/2013 | Neely et al. |
| 2013/0273522 A1 | 10/2013 | Lowery, Jr. et al. |
| 2013/0273523 A1 | 10/2013 | Neely et al. |
| 2013/0274712 A1 | 10/2013 | Schecter |
| 2013/0284830 A1 | 10/2013 | Wells et al. |
| 2013/0286666 A1 | 10/2013 | Bakk |
| 2013/0299148 A1 | 11/2013 | Hernon et al. |
| 2013/0299415 A1 | 11/2013 | McCutchen |
| 2013/0309778 A1 | 11/2013 | Lowe et al. |
| 2013/0312638 A1 | 11/2013 | Parker et al. |
| 2013/0312787 A1 | 11/2013 | Suzuki |
| 2013/0322471 A1 | 12/2013 | Rossbach |
| 2013/0334824 A1 | 12/2013 | Freda |
| 2013/0335731 A1 | 12/2013 | Jorden |
| 2013/0339216 A1 | 12/2013 | Lambert |
| 2014/0005364 A1 | 1/2014 | Gottschall et al. |
| 2014/0021288 A1 | 1/2014 | Elson et al. |
| 2014/0037958 A1 | 2/2014 | Gerber |
| 2014/0046023 A1 | 2/2014 | Gottschall et al. |
| 2014/0057210 A1 | 2/2014 | Malik et al. |
| 2014/0057277 A1 | 2/2014 | Malik et al. |
| 2014/0057278 A1 | 2/2014 | Madero et al. |
| 2014/0057279 A1 | 2/2014 | Malik et al. |
| 2014/0077946 A1 | 3/2014 | Tran |
| 2014/0079782 A1 | 3/2014 | York et al. |
| 2014/0089241 A1 | 3/2014 | Hoffberg et al. |
| 2014/0096763 A1 | 4/2014 | Barmore |
| 2014/0098542 A1 | 4/2014 | Zimmer et al. |
| 2014/0111671 A1 | 4/2014 | Cao et al. |
| 2014/0120523 A1 | 5/2014 | Lowery, Jr. et al. |
| 2014/0127790 A1 | 5/2014 | Malik et al. |
| 2014/0127796 A1 | 5/2014 | Malik et al. |

(56) References Cited

U.S. PATENT DOCUMENTS

| | | |
|---|---|---|
| 2014/0134678 A1 | 5/2014 | Foody et al. |
| 2014/0143064 A1 | 5/2014 | Tran |
| 2014/0163425 A1 | 6/2014 | Tran |
| 2014/0166575 A1 | 6/2014 | Bose et al. |
| 2014/0170646 A1 | 6/2014 | Kelley et al. |
| 2014/0173452 A1 | 6/2014 | Hoffberg et al. |
| 2014/0180153 A1 | 6/2014 | Zia et al. |
| 2014/0207463 A1 | 7/2014 | Nakanishi |
| 2014/0212006 A1 | 7/2014 | Zhao et al. |
| 2014/0217331 A1 | 8/2014 | Hata et al. |
| 2014/0235965 A1 | 8/2014 | Tran |
| 2014/0238012 A1 | 8/2014 | Miller |
| 2014/0249429 A1 | 9/2014 | Tran |
| 2014/0255205 A1 | 9/2014 | Shelman-Cohen |
| 2014/0267123 A1 | 9/2014 | Ludwig |
| 2014/0278158 A1 | 9/2014 | Miller |
| 2014/0322515 A1 | 10/2014 | Parker et al. |
| 2014/0325866 A1 | 11/2014 | McCutchen et al. |
| 2014/0326277 A1 | 11/2014 | Nettesheim et al. |
| 2014/0332081 A1 | 11/2014 | Fitzgerald et al. |
| 2014/0336953 A1 | 11/2014 | Johnson et al. |
| 2014/0338895 A1 | 11/2014 | Paulsen |
| 2014/0345152 A1 | 11/2014 | Ben-Shmuel et al. |
| 2014/0346055 A1 | 11/2014 | McCutchen et al. |
| 2014/0360607 A1 | 12/2014 | Fletcher et al. |
| 2014/0360699 A1 | 12/2014 | van Schoor et al. |
| 2014/0362660 A1 | 12/2014 | Pearce |
| 2014/0377826 A1 | 12/2014 | Trevethick |
| 2015/0015869 A1 | 1/2015 | Smith et al. |
| 2015/0068069 A1 | 3/2015 | Tran et al. |
| 2015/0094914 A1 | 4/2015 | Abreu |
| 2015/0099264 A1 | 4/2015 | Ismagilov et al. |
| 2015/0105687 A1 | 4/2015 | Abreu |
| 2015/0110599 A1 | 4/2015 | Freda |
| 2015/0138355 A1 | 5/2015 | Tillotson |
| 2015/0181685 A1 | 6/2015 | Sekhar et al. |
| 2015/0183520 A1 | 7/2015 | Elson |
| 2015/0203822 A1 | 7/2015 | Tremolada et al. |
| 2015/0204559 A1 | 7/2015 | Hoffberg et al. |
| 2015/0231635 A1 | 8/2015 | Okano et al. |
| 2015/0251217 A1 | 9/2015 | Wohl, Jr. et al. |
| 2015/0287141 A1 | 10/2015 | Parker, Jr. |
| 2015/0291760 A1 | 10/2015 | Storti et al. |
| 2015/0293140 A1 | 10/2015 | Barille |
| 2015/0328601 A1 | 11/2015 | Vassilicos |
| 2015/0342093 A1 | 11/2015 | Poltorak |
| 2015/0353880 A1 | 12/2015 | Clark et al. |
| 2015/0359467 A1 | 12/2015 | Tran |
| 2015/0366006 A1 | 12/2015 | Ben-Shmuel et al. |
| 2015/0377831 A1 | 12/2015 | Wheeler et al. |
| 2016/0001108 A1 | 1/2016 | Zhou et al. |
| 2016/0010778 A1 | 1/2016 | Malik |
| 2016/0034422 A1 | 2/2016 | Brandt |
| 2016/0051960 A1 | 2/2016 | Ismagilov et al. |
| 2016/0129361 A1 | 5/2016 | Howard |
| 2016/0138805 A1 | 5/2016 | Martin et al. |
| 2016/0140834 A1 | 5/2016 | Tran |
| 2016/0145397 A1 | 5/2016 | Kornfield et al. |
| 2016/0154126 A1 | 6/2016 | Pearce |
| 2016/0157978 A1 | 6/2016 | Tutak |
| 2016/0160795 A1 | 6/2016 | Miller |
| 2016/0215411 A1 | 7/2016 | Ismagilov et al. |
| 2016/0243039 A1 | 8/2016 | Staniforth et al. |
| 2016/0256059 A1 | 9/2016 | Volkov et al. |
| 2016/0269099 A1 | 9/2016 | Auricchio, Jr. et al. |
| 2016/0274271 A1 | 9/2016 | Lukas et al. |
| 2016/0287166 A1 | 10/2016 | Tran |
| 2016/0288124 A1 | 10/2016 | Ismagilov et al. |
| 2016/0310031 A1 | 10/2016 | Sarkar |
| 2016/0319110 A1 | 11/2016 | Matheu et al. |
| 2016/0320149 A1 | 11/2016 | Poltorak |
| 2016/0324806 A1 | 11/2016 | York et al. |
| 2016/0328366 A1 | 11/2016 | Elarian |
| 2016/0328620 A1 | 11/2016 | Elarian |
| 2016/0333295 A1 | 11/2016 | Baker et al. |
| 2016/0350920 A1 | 12/2016 | Kassab |
| 2016/0360965 A1 | 12/2016 | Tran |
| 2016/0367186 A1 | 12/2016 | Freeman et al. |
| 2016/0375370 A1 | 12/2016 | Howard |
| 2017/0009274 A1 | 1/2017 | Abate et al. |
| 2017/0016414 A1 | 1/2017 | Fletcher et al. |
| 2017/0024886 A1 | 1/2017 | Dickrell et al. |
| 2017/0029111 A1 | 2/2017 | Elson |
| 2017/0029730 A1 | 2/2017 | Wei et al. |
| 2017/0036152 A1 | 2/2017 | Li et al. |
| 2017/0045613 A1 | 2/2017 | Wang |
| 2017/0056532 A1 | 3/2017 | Freeman et al. |
| 2017/0059263 A1* | 3/2017 | Sun ................. H05K 7/20181 |
| 2017/0081466 A1 | 3/2017 | Kornfield et al. |
| 2017/0086672 A1 | 3/2017 | Tran |
| 2017/0097197 A1 | 4/2017 | Poltorak |
| 2017/0100817 A1 | 4/2017 | Ganapathiappan et al. |
| 2017/0104426 A1 | 4/2017 | Mills |
| 2017/0106349 A1 | 4/2017 | Gottschall et al. |
| 2017/0106463 A1 | 4/2017 | Sekhar |
| 2017/0136445 A1 | 5/2017 | Ostraat et al. |
| 2017/0136603 A1 | 5/2017 | Ganapathiappan et al. |
| 2017/0158047 A1 | 6/2017 | Walkowski |
| 2017/0173957 A1 | 6/2017 | Williams et al. |
| 2017/0175711 A1 | 6/2017 | Burkle |
| 2017/0183955 A1 | 6/2017 | Peacock et al. |
| 2017/0198401 A1 | 7/2017 | Phillips |
| 2017/0203408 A1 | 7/2017 | Ganapathiappan et al. |
| 2017/0228607 A1 | 8/2017 | Elarian |
| 2017/0229375 A1 | 8/2017 | Haj-Hariri et al. |
| 2017/0232440 A1 | 8/2017 | Ismagilov et al. |
| 2017/0233668 A1 | 8/2017 | Kornfield et al. |
| 2017/0233798 A1 | 8/2017 | Neely et al. |
| 2017/0246510 A1 | 8/2017 | Sullivan et al. |
| 2017/0251931 A1 | 9/2017 | Prakash et al. |
| 2017/0251985 A1 | 9/2017 | Howard |
| 2017/0253912 A1 | 9/2017 | Kelley et al. |
| 2017/0273920 A1 | 9/2017 | York et al. |
| 2017/0284359 A1 | 10/2017 | Burkle |
| 2017/0347886 A1 | 12/2017 | Tran |
| 2017/0354903 A1 | 12/2017 | Kochergin et al. |
| 2017/0361321 A1 | 12/2017 | Ismagilov et al. |
| 2017/0368551 A1 | 12/2017 | Ismagilov et al. |
| 2017/0370387 A1 | 12/2017 | Nino et al. |
| 2018/0000160 A1 | 1/2018 | Taschner et al. |
| 2018/0002995 A1 | 1/2018 | Dotson et al. |
| 2018/0003045 A1 | 1/2018 | Dotson et al. |
| 2018/0017345 A1 | 1/2018 | Poltorak |
| 2018/0019595 A1 | 1/2018 | Bandi |
| 2018/0024264 A1 | 1/2018 | Dotson et al. |
| 2018/0043875 A1 | 2/2018 | Fletcher et al. |
| 2018/0055772 A1 | 3/2018 | Staniforth et al. |
| 2018/0058595 A1 | 3/2018 | Grayson et al. |
| 2018/0066232 A1 | 3/2018 | Tremolada et al. |
| 2018/0068358 A1 | 3/2018 | Hoffberg |
| 2018/0080567 A1 | 3/2018 | Hampton et al. |
| 2018/0087443 A1 | 3/2018 | Adriany et al. |
| 2018/0087701 A1 | 3/2018 | Adriany et al. |
| 2018/0089905 A1 | 3/2018 | Solenthaler et al. |
| 2018/0094214 A1 | 4/2018 | Labib et al. |
| 2018/0098739 A1 | 4/2018 | Freeman et al. |
| 2018/0107370 A1 | 4/2018 | Ludwig |
| 2018/0118337 A1 | 5/2018 | Viel |
| 2018/0119040 A1 | 5/2018 | Waanders et al. |
| 2018/0119950 A1 | 5/2018 | Martin et al. |
| 2018/0120269 A1 | 5/2018 | Sinha et al. |
| 2018/0128240 A1 | 5/2018 | Freda |
| 2018/0154362 A1 | 6/2018 | Ismagilov et al. |
| 2018/0168459 A1 | 6/2018 | Tran |
| 2018/0184907 A1 | 7/2018 | Tran |
| 2018/0193837 A1 | 7/2018 | Ismagilov et al. |
| 2018/0193838 A1 | 7/2018 | Ismagilov et al. |
| 2018/0198517 A1 | 7/2018 | Auricchio et al. |
| 2018/0206730 A1 | 7/2018 | Abreu |
| 2018/0207863 A1 | 7/2018 | Porter et al. |
| 2018/0216160 A1 | 8/2018 | Abate et al. |
| 2018/0258773 A1 | 9/2018 | Zuniga |

(56) References Cited

U.S. PATENT DOCUMENTS

| | | |
|---|---|---|
| 2018/0268085 A1 | 9/2018 | Vassilicos et al. |
| 2018/0272351 A1 | 9/2018 | Ismagilov et al. |
| 2018/0272352 A1 | 9/2018 | Ismagilov et al. |
| 2018/0272426 A1 | 9/2018 | Martin et al. |
| 2018/0280646 A1 | 10/2018 | Freeman et al. |
| 2018/0284005 A1 | 10/2018 | Oberreit |
| 2018/0298762 A1 | 10/2018 | Shelman-Cohen |
| 2018/0298882 A1 | 10/2018 | Burkle |
| 2018/0300569 A1 | 10/2018 | Elarian |
| 2018/0300570 A1 | 10/2018 | Elarian |
| 2018/0304268 A1 | 10/2018 | Ismagilov et al. |
| 2018/0319951 A1 | 11/2018 | Fruh et al. |
| 2018/0340743 A1 | 11/2018 | Poltorak |
| 2018/0360999 A1 | 12/2018 | Freeman et al. |
| 2019/0008552 A1 | 1/2019 | Levin |
| 2019/0016859 A1 | 1/2019 | Kornfield et al. |
| 2019/0021186 A1 | 1/2019 | Poltorak |
| 2019/0030538 A1 | 1/2019 | Ismagilov et al. |
| 2019/0038133 A1 | 2/2019 | Tran |
| 2019/0041505 A1 | 2/2019 | Moradi et al. |
| 2019/0054449 A1 | 2/2019 | Bukhovko et al. |
| 2019/0076257 A1 | 3/2019 | Dee et al. |
| 2019/0079905 A1 | 3/2019 | Elarian |
| 2019/0085381 A1 | 3/2019 | Neely et al. |
| 2019/0086154 A1 | 3/2019 | Adriany et al. |
| 2019/0099641 A1 | 4/2019 | Sullivan et al. |
| 2019/0110413 A1 | 4/2019 | Li et al. |
| 2019/0114310 A1 | 4/2019 | Elarian |
| 2019/0114557 A1 | 4/2019 | Ashrafi |
| 2019/0117087 A1 | 4/2019 | Yasunaga et al. |
| 2019/0117088 A1 | 4/2019 | Nomura et al. |
| 2019/0117089 A1 | 4/2019 | Nomura et al. |
| 2019/0117090 A1 | 4/2019 | Ishii et al. |
| 2019/0117181 A1 | 4/2019 | Ishii et al. |
| 2019/0117557 A1 | 4/2019 | Johnston et al. |
| 2019/0125192 A1 | 5/2019 | Kusu et al. |
| 2019/0125193 A1 | 5/2019 | Saito et al. |
| 2019/0125194 A1 | 5/2019 | Sekine et al. |
| 2019/0125287 A1 | 5/2019 | Itou et al. |
| 2019/0144807 A1 | 5/2019 | Baker et al. |
| 2019/0150867 A1 | 5/2019 | Itou et al. |
| 2019/0153247 A1 | 5/2019 | Velev et al. |
| 2019/0154854 A1 | 5/2019 | Pearce |
| 2019/0202024 A1 | 7/2019 | Ganapathiappan et al. |
| 2019/0209974 A1 | 7/2019 | Zadaka-Amir et al. |
| 2019/0219025 A1 | 7/2019 | Burkle |
| 2019/0234914 A1 | 8/2019 | Williams et al. |
| 2019/0249115 A1 | 8/2019 | Labib et al. |
| 2019/0255519 A1 | 8/2019 | Ostraat et al. |
| 2019/0256070 A1 | 8/2019 | Fletcher et al. |
| 2019/0270655 A1 | 9/2019 | Jorden et al. |
| 2019/0299112 A1 | 10/2019 | Howard |
| 2019/0307328 A1 | 10/2019 | Tran |
| 2019/0337117 A1 | 11/2019 | Ganapathiappan et al. |
| 2019/0344091 A1 | 11/2019 | Fischer |
| 2019/0350880 A1 | 11/2019 | York et al. |

FOREIGN PATENT DOCUMENTS

| | | |
|---|---|---|
| CN | 202957232 U | 10/2012 |
| CN | 20120407003.8 | 10/2012 |
| CN | 203708731 U | 11/2013 |
| CN | 104617062 A | 2/2015 |
| CN | 20150080266.1 | 2/2015 |
| JP | 03-070162 | 9/1989 |
| JP | 04-291750 | 10/1992 |
| RU | 110893 U1 | 6/2011 |
| RU | 134358 U1 | 5/2013 |
| RU | 144011 U1 | 3/2014 |
| RU | 180382 U1 | 7/2017 |
| WO | WO9904429 | 1/1999 |
| WO | WO2008086479 A2 | 7/2008 |

OTHER PUBLICATIONS

U.S. Appl. No. 10/010,870, filed Jul. 3, 2018, Ostraat et al.
U.S. Appl. No. 10/011,910, filed Jul. 3, 2018, Phillips.
U.S. Appl. No. 10/018,712, filed Jul. 10, 2018, Moradi et al.
U.S. Appl. No. 10/028,699, filed Jul. 24, 2018, Libbus et al.
U.S. Appl. No. 10/031,040, filed Jul. 24, 2018, Smith et al.
U.S. Appl. No. 10/041,005, filed Aug. 7, 2018, Van Der Merwe et al.
U.S. Appl. No. 10/041,745, filed Aug. 7, 2018, Poltorak.
U.S. Appl. No. 10/055,659, filed Aug. 21, 2018, Elarian.
U.S. Appl. No. 10/059,196, filed Aug. 28, 2018, Walkowski.
U.S. Appl. No. 10/059,977, filed Aug. 28, 2018, Witcher et al.
U.S. Appl. No. 10/080,264, filed Sep. 18, 2018, Ben-Shmuel et al.
U.S. Appl. No. 10/083,362, filed Sep. 25, 2018, Elarian.
U.S. Appl. No. 10/084,239, filed Sep. 25, 2018, Shaver et al.
U.S. Appl. No. 10/086,092, filed Oct. 2, 2018, Freeman et al.
U.S. Appl. No. 10/092,512, filed Oct. 9, 2018, Johnston et al.
U.S. Appl. No. 10/098,561, filed Oct. 16, 2018, Brockway et al.
U.S. Appl. No. 10/105,703, filed Oct. 23, 2018, Ismagilov et al.
U.S. Appl. No. 10/107,081, filed Oct. 23, 2018, Paulsen.
U.S. Appl. No. 10/117,940, filed Nov. 6, 2018, Pipkin et al.
U.S. Appl. No. 10/118,140, filed Nov. 6, 2018, Vassilicos.
U.S. Appl. No. 10/118,174, filed Nov. 6, 2018, Ismagilov et al.
U.S. Appl. No. 10/119,084, filed Nov. 6, 2018, Kornfield et al.
U.S. Appl. No. 10/140,262, filed Nov. 27, 2018, Elarian.
U.S. Appl. No. 10/143,893, filed Dec. 4, 2018, Sullivan et al.
U.S. Appl. No. 10/155,179, filed Dec. 18, 2018, Mahmoudi et al.
U.S. Appl. No. 10/164,704, filed Dec. 25, 2018, Auricchio et al.
U.S. Appl. No. 10/179,896, filed Jan. 15, 2019, Baker et al.
U.S. Appl. No. 10/185,882, filed Jan. 22, 2019, Elarian.
U.S. Appl. No. 10/188,614, filed Jan. 29, 2019, York et al.
U.S. Appl. No. 10/217,220, filed Feb. 26, 2019, Kassab.
U.S. Appl. No. 10/217,692, filed Feb. 26, 2019, Haj-Hariri et al.
U.S. Appl. No. 10/221,808, filed Mar. 5, 2019, Miller.
U.S. Appl. No. 10/223,786, filed Mar. 5, 2019, Dickrell, III et al.
U.S. Appl. No. 10/226,717, filed Mar. 12, 2019, Van Der Merwe et al.
U.S. Appl. No. 10/227,063, filed Mar. 12, 2019, Abreu.
U.S. Appl. No. 10/229,215, filed Mar. 12, 2019, Solenthaler et al.
U.S. Appl. No. 10/241,220, filed Mar. 26, 2019, Pearce.
U.S. Appl. No. 10/242,276, filed Mar. 26, 2019, Elarian.
U.S. Appl. No. 10/253,746, filed Apr. 9, 2019, Burkle.
U.S. Appl. No. 10/254,499, filed Apr. 9, 2019, Cohen et al.
U.S. Appl. No. 10/260,334, filed Apr. 16, 2019, Peacock et al.
U.S. Appl. No. 10/266,793, filed Apr. 23, 2019, Labib et al.
U.S. Appl. No. 10/267,515, filed Apr. 23, 2019, Adriany et al.
U.S. Appl. No. 10/282,841, filed May 7, 2019, Parsons-Wingerter et al.
U.S. Appl. No. 10/285,312, filed May 7, 2019, Suorsa.
U.S. Appl. No. 10/301,666, filed May 28, 2019, Kelley et al.
U.S. Appl. No. 10/307,060, filed Jun. 4, 2019, Tran.
U.S. Appl. No. 10/323,761, filed Jun. 18, 2019, Grayson et al.
U.S. Appl. No. 10/335,618, filed Jul. 2, 2019, Zhou et al.
U.S. Appl. No. 10/336,305, filed Jul. 2, 2019, Fletcher et al.
U.S. Appl. No. 10/338,631, filed Jul. 2, 2019, Jorden et al.
U.S. Appl. No. 10/345,712, filed Jul. 9, 2019, Streefkerk et al.
U.S. Appl. No. 10/352,171, filed Jul. 16, 2019, Shelman-Cohen.
U.S. Appl. No. 10/352,303, filed Jul. 16, 2019, Burkle.
U.S. Appl. No. 10/361,802, filed Jul. 23, 2019, Hoffberg-Borghesani et al.
U.S. Appl. No. 10/362,940, filed Jul. 30, 2019, Tran.
U.S. Appl. No. 10/365,200, filed Jul. 30, 2019, Liu et al.
U.S. Appl. No. 10/371,462, filed Aug. 6, 2019, Vos et al.
U.S. Appl. No. 10/387,583, filed Aug. 20, 2019, Tetzlaff et al.
U.S. Appl. No. 10/391,605, filed Aug. 27, 2019, Ganapathiappan et al.
U.S. Appl. No. 10/399,201, filed Sep. 3, 2019, Ganapathiappan et al.
U.S. Appl. No. 10/400,186, filed Sep. 3, 2019, Wei et al.
U.S. Appl. No. 10/405,809, filed Sep. 10, 2019, Manicka et al.
U.S. Appl. No. 10/407,790, filed Sep. 10, 2019, Johannes et al.
U.S. Appl. No. 10/408,064, filed Sep. 10, 2019, Zuniga.
U.S. Appl. No. 10/408,189, filed Sep. 10, 2019, Freda.

(56) References Cited

OTHER PUBLICATIONS

U.S. Appl. No. 10/422,351, filed Sep. 24, 2019, Fletcher et al.
U.S. Appl. No. 10/428,286, filed Oct. 1, 2019, Kornfield et al.
U.S. Appl. No. 10/432,871, filed Oct. 1, 2019, Cao et al.
U.S. Appl. No. 10/434,062, filed Oct. 8, 2019, Johnston et al.
U.S. Appl. No. 10/443,139, filed Oct. 15, 2019, Mills.
U.S. Appl. No. 10/451,761, filed Oct. 22, 2019, Dotson et al.
U.S. Appl. No. 10/452,752, filed Oct. 22, 2019, Elarian.
U.S. Appl. No. 10/461,018, filed Oct. 29, 2019, Vos et al.
U.S. Appl. No. 10/461,519, filed Oct. 29, 2019, Miller.
U.S. Appl. No. 10/467,330, filed Nov. 5, 2019, Elarian.
U.S. Appl. No. 10/472,470, filed Nov. 12, 2019, Kornfield et al.
U.S. Appl. No. 10/478,911, filed Nov. 19, 2019, Sekhar.
U.S. Appl. No. 10/480,481, filed Nov. 19, 2019, Burkle.
U.S. Appl. No. 10/492,247, filed Nov. 26, 2019, Ben-Shmuel et al.
"Natural Convection and Chimneys," available at akemalhammar.fr/articels2/parallel_pl_Inc.html.
Alharbi, Ali Y., Deborah V. Pence, and Rebecca N. Cullion. "Thermal characteristics of microscale fractal-like branching channels." Journal of Heat Transfer 126.5 (2004): 744-752.
Andrews, Earl H. "Scramjet development and testing in the United States", AIAA paper 1927 (2001): 2001.
Arovas, Daniel, Lecture Notes on Thermodynamics and Statistical Mechanics (A Work in Progress), Department of Physics, University of California, San Diego, Nov. 14, 2013.
Azar, A, et al., 2009, "Heat sink testing methods and common oversights", Qpedia Thermal E-Magazine, Jan. 2009.
Balasubramania, K. et al., Pressure Drop Characteristics and Instabilities During Flow Boiling in Parallel and Oblique Finned Microchannels—A Comparative Study, 2012.
Batchelor, G. K., The theory of homogeneous turbulence. Cambridge University Press, 1953.
Batten, Paul, et al. "Sub-Grid Turbulence Modeling for Unsteady Flow with Acoustic Resonance," available at www.researchgate.net/publication/269068673_Sub-grid_turbulence_modeling_for_unsteady_flow_with_acoustic_resonance.
Baurle, R. A., and D. R. Eklund. "Analysis of dual-mode hydrocarbon scramjet operation at Mach 4-6.5." Journal of Propulsion and Power 18.5 (2002): 990-1002.
Bohr, T., M.H. Jensen, G. Paladin and A. Vulpiani. Dynamical Systems Approach to Turbulence, Cambridge University Press, 1998.
Boming Yu et al., Fractal-Like Tree Networks Reducing the Thermal Conductivity, 2006 The American Physical Society.
Bonetto, F., et al, Fourier Law, Atlanta, GA 20006.
Boudreau, Albert H. "Hypersonic air-breathing propulsion efforts in the air force research laboratory." AIAA 3255.1 (2005): 10.
Cardy, J., G. Falkovich and K. Gawedzki (2008) Non-equilibrium statistical mechanics and turbulence. Cambridge University Press.
Casanova, Joaquin J., Jason A. Taylor, and Jenshan Lin. "Design of a 3-D fractal heatsink antenna." Antennas and Wireless Propagation Letters, IEEE 9 (2010): 1061-1064.
Chen Yongping et al, Characteristics of Heat and Fluid Flow in Fractal Tree-Like Channel Heat Sink, 2009.
Cockrell Jr, Charles E. "Technology Roadmap for Dual-Mode Scramjet Propulsion to Support Space-Access Vision Vehicle Development." (2002).
Covert, Lance, Jenshan Lin, Dan Janning, Thomas Dalrymple, "5.8 GHz orientation-specific extruded-fin heatsink antennas for 3D RF system integration", Apr. 23, 2008 DOI: 10.1002/mop.23478, Microwave and Optical Technology Letters vol. 50, Issue 7, pp. 1826-1831, Jul. 2008.
Crane, Jackson T. Radial parallel plate flow with mechanical agitation. Diss. Massachusetts Institute of Technology, 2013.
Dannelley, Daniel. Enhancement of extended surface heat transfer using fractal-like geometries. Diss. The University of Alabama Tuscaloosa, 2013.
Davidson, P. A. (2004). Turbulence: An Introduction for Scientists and Engineers. Oxford University Press. ISBN 978-0-19-852949-1.

Donbar, J., et al. "Post-test analysis of flush-wall fuel injection experiments in a scramjet", AIAA Paper 3197 (2001): 2001.
Durbin P. A., and B. A. Pettersson Reif. Statistical Theory and Modeling for Turbulent Flows. Johns Wiley & Sons, 2001.
en.wikipedia.org/wiki/Bimetallic_strip.
en.wikipedia.org/wiki/Chaos_theory.
en.wikipedia.org/wiki/Fractal.
en.wikipedia.org/wiki/Heat_sink.
en.wikipedia.org/wiki/Heat_transfer.
en.wikipedia.org/wiki/Phonon.
en.wikipedia.org/wiki/Turbulence; www.scholarpedia.org/article/Turbulence.
Escher, W., B. Michel, and D. Poulikakos. "Efficiency of optimized bifurcating tree-like and parallel microchannel networks in the cooling of electronics." International Journal of Heat and Mass Transfer 52.5 (2009): 1421-1430.
Escher, W., et al, Efficiency of Optimized Bifurcating Tree-Like and Parallel Microchannel Networks in the Cooling of Electronics, Switzerland 2008.
Falkovich, G., and K.R. Sreenivasan. Lessons from hydrodynamic turbulence, Physics Today, vol. 59, No. 4, pp. 43-49 (Apr. 2006).
Falkovich, G., Scholarpedia, "Cascade and scaling".
Fichera, A., and A. Pagano. "Modelling and control of rectangular natural circulation loops." International journal of heat and mass transfer 46.13 (2003): 2425-2444.
Fichera, Alberto, et al. "A modeling strategy for rectangular thermal convection loops." World Congress. vol. 15. No. 1. 2002.
Forghan, F., Goldthwaite, D., Ulinski, M., Metghalchi, M., Experimental and Theoretical Investigation of Thermal Performance of Heat Sinks, ISME, May 2001.
Fourier, J. B., 1822, Theorie analytique de la chaleur, Paris; Freeman, A., 1955, translation, Dover Publications, Inc., NY.
Frigus Primore, "Natural Convection and Chimneys," available at www.frigprim.com/articels2/parallel.sub.--plchim.html.
Frigus Primore, "A Method for Comparing Heat Sinks Based on Reynolds Analogy," available at akemalhammar.fr/downloads/Reynolds_analogy_heatsinks.PDF.
Frigus Primore, "Natural Convection and Inclined Parallel Plates," www.engineeringclicks.com/natural-convection-and-inclined-parallel-plates/.
Garibaldi, Dott Ing Pietro. Single-phase natural circulation loops: effects of geometry and heat sink temperature on dynamic behavior and stability. Diss. Ph. D. Thesis, 2008.
Gruber, Mark, et al. "Newly developed direct-connect high-enthalpy supersonic combustion research facility." Journal of Propulsion and Power 17.6 (2001): 1296-1304.
Hone, J., Carbon Nanotubes: Thermal Properties, New York, NY 2004.
Hong, F. J., et al. "Conjugate heat transfer in fractal-shaped microchannel network heat sink for integrated microelectronic cooling application." International Journal of Heat and Mass Transfer 50.25 (2007): 4986-4998.
Incropera, F.P. and DeWitt, D.P., 1985, Introduction to heat transfer, John Wiley and sons, NY.
Jackson, K., et al. "Calibration of a newly developed direct-connect high-enthalpy supersonic combustion research facility." AIAA paper (1998): 98-1510.
Jeggels, Y.U., Dobson, R.T., Jeggels, D.H., Comparison of the cooling performance between heat pipe and aluminium conductors for electronic equipment enclosures, Proceedings of the 14th International Heat Pipe Conference, Florianópolis, Brazil, 2007.
Jin, Y.; Uth, M.-F.; Kuznetsov, A. V.; Herwig, H. (Feb. 2, 2015). "Numerical investigation of the possibility of macroscopic turbulence in porous media: a direct numerical simulation study". Journal of Fluid Mechanics 766: 76-103. Bibcode:2015JFM . . . 766 . . . 76J. doi:10.1017/jfm.2015.9.
Kay, Ira W., W. T. Peschke, and R. N. Guile. "Hydrocarbon-fueled scramjet combustor investigation." Journal of Propulsion and Power 8.2 (1992): 507-512.
Kolmogorov, Andrey Nikolaevich (1941). "Dissipation of Energy in the Locally Isotropic Turbulence". Proceedings of the USSR Academy of Sciences (in Russian) 32: 16-18., translated into English by Kolmogorov, Andrey Nikolaevich (Jul. 8, 1991). Proceedings of the

(56) References Cited

OTHER PUBLICATIONS

Royal Society A 434 (1980): 15-17. Bibcode: 1991RSPSA.434 . . . 15K. doi:10.1098/rspa.1991.0076.
Kolmogorov, Andrey Nikolaevich (1941). "The local structure of turbulence in incompressible viscous fluid for very large Reynolds numbers". Proceedings of the USSR Academy of Sciences (in Russian) 30: 299-303., translated into English by V. Levin: Kolmogorov, Andrey Nikolaevich (Jul. 8, 1991). Proceedings of the Royal Society A 434 (1991): 9-13. Bibcode:1991RSPSA.434 . . . 9K. doi:10.1098/rspa.1991.0075.
Kordyban, T., 1998, Hot air rises and heat sinks—Everything you know about cooling electronics is wrong, ASME Press, NY; Anon, Unknown, "Heat sink selection", Mechanical engineering department, San Jose State University [Jan. 27, 2010].
Lasance, C.J.M and Eggink, H.J., A Method to Rank Heat Sinks in Practice: The Heat Sink Performance Tester, 21st IEEE Semi-Therm Symposium 2001.
Lee, S.R., Li, Z.G., Wang, B.G., Chiou, H.S., 2005, "An Application of the Fractal Theory in the Design of Heat Sink for Precision Measurement Instrument," Key Engineering Materials, 295-296, pp. 717-722.
Lee, Y.J., "Enhanced Microchannel Heat Sinks Using Oblique Fins," IPACK 2009-89059.
Lee, Yong-Jiun, Poh-Seng Lee, and Siaw-Kiang Chou. "Enhanced microchannel heat sinks using oblique fins." ASME 2009 InterPACK Conference collocated with the ASME 2009 Summer Heat Transfer Conference and the ASME 2009 3rd International Conference on Energy Sustainability, American Society of Mechanical Engineers, 2009.
Li, Jie, et al, Computational Analysis of Nanofluid Flow in Microchannels with Applications to Micro-Heat Sinks and Bio-MEMS, Raleigh, North Carolina 2008.
Lienard, J.H., IV & V, 2004, A Heat Transfer Textbook, Third edition, MIT.
Liu et al, Heat Transfer and Pressure Drop in Fractal Microchannel Heat Sink for Cooling of Electronic Chips, 44 Heat Mass Transfer 221 (2007).
Liu, Shutian, Yongcun Zhang, and Peng Liu. "Heat transfer and pressure drop in fractal microchannel heat sink for cooling of electronic chips." Heat and Mass Transfer 44.2 (2007): 221-227. ludens.cl/Electron/Thermal.html.
Malhammar, Ake, A Method for Comparing Heat Sinks Based on Reynolds Analogy, France, Sep. 29-Oct. 2004.
Mandelbrot, B.B. (1982), The Fractal Geometry of Nature. W.H. Freeman and Company. ISBN 0-7167-1186-9. (1982).
McDonough, J. M. (2007). Introductory Lectures on Turbulence—Physics, Mathematics, and Modeling.
Mills, A.F., 1999, Heat transfer, Second edition, Prentice Hall; Potter, C.M. and Wiggert, D.C., 2002, Mechanics of fluid, Third Edition, Brooks/Cole.
Nicole Delong Okamoto, Unknown, "Heat sink selection", Mechanical engineering department, San Jose State University [Jan. 27, 2010]. www.engr.sjsu.edu/ndejong/ME%20146%20files/Heat%20Sink.ppt.
Palac, Donald T., Charles J. Trefny, and Joseph M. Roche, Performance Evaluation of the NASA GTX RBCC Flowpath, NASA, Glenn Research Center, 2001.

Peles, Yoav, Ali Kossar, Chandan Mishra, Chih-Jung Kuo, Brandon Schneider, "Forced convective heat transfer across a pin fin micro heat sink", International Journal of Heat and Mass Transfer 48 (2005) 3615-3627.
Pence, D. V., 2002, "Reduced Pumping Power and Wall Temperature in Microchannel Heat Sinks with Fractal-like Branching Channel Networks", Microscale Thermophys. Eng. 5, pp. 293-311.
Prstic, S., Iyengar, M., and Bar-Cohen, A., 2000, Bypass effect in high performance heat sinks, Proceedings of the International Thermal Science Seminar Bled, Slovenia, June 11-14.
Ryan, NJ, DA Stone, "Application of the FD-TD method to modelling the electromagnetic radiation from heatsinks", IEEE International Conference on Electromagnetic Compatibility, 1997. 10th (Sep. 1-3, 1997), pp. 119-124.
Saint-Gobain, 2004, "Thermal management solutions for electronic equipment" Jul. 22, 2008 www.fff.saint-gobain.com/Media/Documents/S0000000000000001036/ThermaCool%20Brochure.pdf.
Search Report PCT/IB11/01026 dated May 13, 2011.
Soodphakdee, Denpong; Masud Behnia, and David Watabe Copeland, "A Comparison of Fin Geometries for Heatsinks in Laminar Forced Convection: Part I—Round, Elliptical, and Plate Fins in Staggered and In-Line Configurations", The International Journal of Microcircuits and Electronic Packaging, vol. 24, No. 1, First Quarter, 2001 (ISSN 1063-1674).
Written Opinion of the International Searching Authority PCT/US2017/041684 (dated Jul. 12, 2016).
International Search Report US2017/041684 (dated Jul. 12, 2016).
Senn, S. M., and D. Poulikakos. "Laminar mixing, heat transfer and pressure drop in tree-like microchannel nets and their application for thermal management in polymer electrolyte fuel cells." Journal of Power Sources 130.1 (2004): 178-191.
Senn, S. M., et al, Laminar Mixing, Heat Transfer and Pressure Drop, Zurich, Switzerland, 2003.
Sergent, J. and Krum, A., 1998, Thermal management handbook for electronic assemblies, First Edition, McGraw-Hill.
Sui, Y., Teo, C. J., Lee, P. S., Chew, Y. T., & Shu, C. (2010). Fluid flow and heat transfer in wavy microchannels. International Journal of Heat and Mass Transfer, 53(13), 2760-2772.
Wang et al., "Flow and Thermal Characteristics of Offset Branching Network," Aug. 12, 2009, International Journal of Thermal Science, vol. 49, pp. 272-280.
web.mit.edu/press/2010/thermopower-waves.html.
White, F.M., 1999, Fluid mechanics, Fourth edition, McGraw-Hill International; Azar, A, et al., 2009, "Heat sink testing methods and common oversights", Qpedia Thermal E-Magazine, Jan. 2009 Issue. www.emsclad.com/fileadmin/Data/Divisions/EMS/Bimetal_Desingers_Guide.pdf).
www.engr.sjsu.edu/ndejong/ME%20146%20files/Heat%20Sink.ppt.
www.qats.com/cpanel/UploadedPdf/January20092.pdf.
Xiangqi, Wang. "New approaches to micro-electronic component cooling." PhD diss., 2007 (National University of Singapore).
Xu, Peng, et al. "Thermal characteristics of tree-shaped microchannel nets with/without loops." International Journal of Thermal Sciences 48.11 (2009): 2139-2147.
Yakobson, Boris, "Acoustic waves may cool microelectronics", Nano Letters, ACS (2010).
Yong-Jiun Lee et al, Enhanced Microchannel Heat Sinks Using Oblique Fins, IPack 2009-89059, San Francisco, CA, 2009.
Yongping, Chen, et al. "Characteristics of Heat and Fluid Flow in Fractal Tree-like Channel Heat Sink [J]." Acta Aeronautica Et Astronautica Sinica 3 (2010): 008.

\* cited by examiner

SYSTEM AND METHOD FOR MAINTAINING EFFICIENCY OF A HEAT SINK

CROSS REFERENCE TO RELATED APPLICATIONS

The present application is a

Continuation of U.S. patent application Ser. No. 17/093,307, filed Nov. 9, 2020, now U.S. Pat. No. 11,346,620, issued May 31, 2022, which is a Continuation of U.S. patent application Ser. No. 15/648,065, filed Jul. 12, 2017, now U.S. Pat. No. 10,830,545, issued Nov. 10, 2020, which is a Non-provisional of, and claims benefit of priority under 35 U.S.C. § 119(e) from U.S. Provisional Patent Application No. 62/361,253, filed Jul. 12, 2016, the entirety of which are expressly incorporated herein by reference.

FIELD OF THE INVENTION

This invention relates to the field of heatsinks or devices that transfer heat between a concentrated source or sink and a fluid, and systems and methods for maintaining the efficiency of the heatsink and cleaning heatsinks.

BACKGROUND OF THE INVENTION

All references mentioned herein are expressly incorporated by reference in their entirety for all purposes.

A heat sink is a term for a component or assembly that transfers heat generated within a solid material to a fluid or gas medium, such as air or a liquid. A heat sink is typically designed to increase the surface area in contact with the cooling fluid or gas surrounding it, such as the air. Approach air velocity, choice of material, fin (or other protrusion) design and surface treatment are some of the design factors which influence the thermal resistance, i.e. thermal performance, of a heat sink. See, en.wikipedia.org/wiki/Heat_sink.

Heatsinks operate by removing heat from an object to be cooled into the surrounding air, gas or liquid through convection and radiation. Convection occurs when heat is either carried passively from one point to another by fluid motion (forced convection) or when heat itself causes fluid motion (free convection). When forced convection and free convection occur together, the process is termed mixed convection. Radiation occurs when energy, for example in the form of heat, travels through a medium or through space and is ultimately absorbed by another body. Thermal radiation is the process by which the surface of an object radiates its thermal energy in the form of electromagnetic waves. Infrared radiation from a common household radiator or electric heater is an example of thermal radiation, as is the heat and light (IR and visible EM waves) emitted by a glowing incandescent light bulb. Thermal radiation is generated when heat from the movement of charged particles within atoms is converted to electromagnetic radiation.

Heat transfer is the exchange of thermal energy between physical systems. The rate of heat transfer is dependent on the temperatures of the systems and the properties and states of the intervening medium through which the heat is transferred. The three fundamental modes of heat transfer are conduction, convection, and radiation. Heat transfer, the flow of energy in the form of heat, is a process by which a system changes its internal energy. The direction of heat transfer is from a region of high temperature to a region of lower temperature, and is governed by the Second Law of Thermodynamics. Heat transfer changes the internal energy of the respective systems, and occurs in a direction that increases the entropy of the collection of systems. Thermal equilibrium is reached when all involved bodies and the surroundings reach the same temperature. Thermodynamic and mechanical heat transfer is calculated with the heat transfer coefficient, the proportionality between the heat flux and the thermodynamic driving force for the flow of heat. See, Daniel Arovas, Lecture Notes on Thermodynamics and Statistical Mechanics (A Work in Progress), Department of Physics, University of California, San Diego, Nov. 14, 2013.

The fundamental modes of heat transfer are: Advection (the transport mechanism of a fluid from one location to another, and is dependent on motion and momentum of that fluid); Conduction or diffusion (the transfer of energy between objects that are in physical contact); Convection (The transfer of energy between an object and its environment, due to fluid motion); and Radiation (The transfer of energy by the emission of electromagnetic radiation in the infrared part of the spectrum).

Heat conduction occurs as hot, rapidly moving or vibrating atoms and molecules interact with neighboring atoms and molecules, transferring some of their energy (heat) to these neighboring particles. Conduction tends to be the most significant means of heat transfer within a solid or between solid objects in thermal contact. Heat transfer between the heat source and heat sink, as well as through the heat sink, are conductive transfer. Advection operates by transferring matter with its thermal energy, over space. Convective heat transfer, or convection, is the transfer of heat from one place to another by the movement of fluids, a process that is essentially the transfer of heat via mass transfer, and usually combines effects of heat conduction within the fluid (diffusion) and heat transference by bulk fluid flow streaming.

Convective cooling is sometimes described as Newton's law of cooling: The rate of heat loss of a body is proportional to the temperature difference between the body and its surroundings, however convective cooling sometimes deviates from this "law". In general, convection is not linearly dependent on temperature gradients, and in some cases is strongly nonlinear.

radiative transfer between two objects is described by and T is the absolute temperature (in Kelvin or Rankine).

Radiance or spectral radiance is a measure of the quantity of radiation that passes through or is emitted. Radiant barriers are materials that reflect radiation, and therefore reduce the flow of heat from radiation sources. The effectiveness of a radiant barrier is indicated by its reflectivity, which is the fraction of radiation reflected. A material with a high reflectivity (at a given wavelength) has a low emissivity (at that same wavelength), and vice versa. At any specific wavelength, reflectivity=1−emissivity.

A heatsink tends to decrease the maximum temperature of the exposed surface, because the power is transferred to a larger volume. This leads to a possibility of diminishing return on larger heatsinks, since the radiative and convective dissipation tends to be related to the temperature differential between the heatsink surface and the external medium. Therefore, if the heatsink is oversized, the efficiency of heat shedding is poor. If the heatsink is undersized, the object may be insufficiently cooled, the surface of the heatsink dangerously hot, and the heat shedding not much greater than the object itself absent the heatsink.

A heat sink transfers thermal energy from a higher temperature to a lower temperature fluid or gas medium, by a process such as radiation, convection, and diffusion. The fluid medium is frequently air, but can also be water or in the case of heat exchangers, oil, and refrigerants. Fourier's law of heat conduction, simplified to a one-dimensional form in the direction x, shows that when there is a temperature gradient in a body, heat will be transferred from the higher temperature region to the lower temperature region. The rate at which heat is transferred by conduction, $q_k$, is proportional to the product of the temperature gradient and the cross-sectional area through which heat is transferred:

$$q_k == kA \frac{dT}{dx} \qquad (1)$$

where $q_k$ is the rate of conduction, k is a constant which depends on the heat-conducting material, A is the surface area through which the heat is conducted, and dT/dx is the temperature gradient, i.e., the rate of change of temperature with respect to distance (for simplicity, the equation is written in one dimension). Thus, according to Fourier's law (which is not the only consideration by any means), heatsinks benefit from having a large surface area exposed to the medium into which the heat is to be transferred.

When dust settles on a heatsink, the area changes (typically increases, but by coating a microstructured surface, the area may decrease), and the constant k will typically decrease, since the dust is not an optimized heat transfer material, and often is a heat insulating material. The result is significant loss of heatsink efficiency.

Consider a heat sink in a duct, where air flows through the duct, and the heat sink base is higher in temperature than the air. Assuming conservation of energy, for steady-state conditions, and applying the convection-cooling law, also known as the Newton's law of cooling, gives the following set of equations.

$$\dot{Q} = \dot{m} c_{p,in} (T_{air,out} - T_{air,in}), \qquad (2)$$

$$\dot{Q} = \frac{T_{hs} - T_{air,av}}{R_{hs}}, \qquad (3)$$

$$\text{where } T_{air,av} = \frac{T_{air,out} + T_{air,in}}{2}, \qquad (4)$$

and $\dot{Q}$ is the first derivative of the thermal energy over time – $\dot{Q} = \frac{dQ}{dt}$.

Using the mean air temperature is an assumption that is valid for relatively short heat sinks. When compact heat exchangers are calculated, the logarithmic mean air temperature is used. $\dot{m}$ is the first derivative of mass over time, i.e., the air mass flow rate in kg/s.

The above equations show that when the airflow through or around the heat sink decreases, this results in an increase in the average air temperature. This in turn increases the heat sink base temperature. And additionally, the thermal resistance of the heat sink will also increase. The net result is a higher heat sink base temperature. The inlet air temperature relates strongly with the heat sink base temperature. Therefore, if there is no air or fluid flow around the heat sink, the energy dissipated to the air cannot be transferred to the ambient air. Therefore, the heatsink functions poorly.

The fractal or branching architecture may be compelled by the thermal transfer design, or other design constraint. For example, a fractal antenna may also serve as a heatsink, with the fractal features not critically optimized as comparted to other designs with respect to heat shedding. See, Casanova, Joaquin J., Jason A. Taylor, and Jenshan Lin. "Design of a 3-D fractal heatsink antenna." Antennas and Wireless Propagation Letters, IEEE 9 (2010): 1061-1064. See also, Dannelley, Daniel. Enhancement of extended surface heat transfer using fractal-like geometries. Diss. The University of Alabama TUSCALOOSA, 2013; and Lee, S. R., Li, Z. G., Wang, B. G., Chiou, H. S., 2005, "An Application of the Fractal Theory in the Design of Heat Sink for Precision Measurement Instrument," Key Engineering Materials, 295-296, pp. 717-722.

If a heatsink is initially optimized, the accretion of dust at the surface will de-optimize the air flows and heat conductivity of heatsink fins, and also decrease efficiency on that basis.

Various methods have been proposed for removing dust from heatsink fins, including vibration (See, U.S. 20070058346; 20080121373; 20080121374; 20090272404; 6,544,309; 5,566,377; 8,203,840; 8,400,766), air jets, and the like.

There are various methods to reduce damage to substrates (e.g. semiconductors) while being subjected to vibrations (e.g. ultrasound) for purposes of cleaning (e.g. removing dust etc.). For example, the power intensity of vibration may be lowered using an attenuator, etc. (See, U.S. Pat. No. 6,679,272; US 20060260638; WO2008086479A2.

The frequency of vibrations may be controlled to reduce the effect on nano-dimensioned structures on the substrate (US 20130206165). More generally, the sensitivity of the structure to be protected to vibration as a function of frequency may be determined, and the high sensitivity frequencies may be avoided.

The directionality of waves may be controlled using constructive interference (U.S. Pat. Nos. 6,276,370; 7,614,406). The angle of incidence of the vibrations onto substrate may be controlled (U.S. Pat. No. 7,238,085). That is, vibrations or shock waves from a transducer have a propagation direction, as they travel along a vector path. As a result, the vibrations may be cancelled by either active means, i.e. a second transducer, or passive means, by causing self-interference. In either case, the vibrations at a point may be cancelled, while in other regions, the vibrations may be significant.

It is noted that the vibrations used to facilitate cleaning may have low damage potential for the sensitive structures per se, but could cause damage as a result of resonances and constructive and/or destructive interference (U.S. Pat. No. 5,834,871; US 20050003737). Therefore, the structures may be designed to avoid enhancement of the vibration amplitude at or near sensitive structures, while potentially ensuring resonances and constructive interference at distal structures where the vibration action is intended.

Thermal interfaces that are elastomeric in nature may be used to isolate the sensitive structures from vibrations (U.S. Pat. No. 6,002,588). Similarly, through-holes may be provided within the substrate in order to dampen the vibrations (US 20080017219). More generally, a selective thermally conductive vibration damping structure or material may be provided disposed along the path of vibrations from a source to the thermal emitter.

According to one set of embodiments, a transducer is provided to generate a standing wave field of vibrations. However, the sensitive structure is disposed outside of the standing wave. (US 20130312787). For example, a transducer may be provided to launch standing waves into a bilateral structure, with the heat source provided along an orthogonal axis wherein vibrations from each side of the transducer bypass or destructively interfere at the heat source. The standing wave is intended to cause movement of the fine feature elements of the heatsink, to dislodge debris.

The heatsink may also be cleansed by controlling factors such as pressure, temperature, nature of cleaning fluid (US 20050003737).

Other examples of situations, in which a heat sink has impaired efficiency: (a) pin fins have a lot of surface area, but the pins are so close together that air has a hard time flowing through them; (b) aligning a heat sink so that the fins are not in the direction of flow; (c) aligning the fins horizontally for a natural convection heat sink. Whilst a heat sink is stationary and there are no centrifugal forces and artificial gravity, air that is warmer than the ambient temperature always flows upward, given essentially-still-air surroundings; this is convective cooling.

The most common heat sink material is aluminum. Chemically pure aluminum is not used in the manufacture of heat sinks, but rather aluminum alloys. Aluminum alloy 1050A has one of the higher thermal conductivity values at 229 W/m·K. However, it is not recommended for machining, since it is a relatively soft material. Aluminum alloys 6061 and 6063 are the more commonly used aluminum alloys, with thermal conductivity values of 166 and 201 W/m·K, respectively. The aforementioned values are dependent on the temper of the alloy.

Copper is also used since it has around twice the conductivity of aluminum, but is three times as heavy as aluminum. Copper is also around four to six times more expensive than aluminum, but this is market dependent. Aluminum has the added advantage that it is able to be extruded, while copper cannot. Copper heat sinks are machined and skived. Another method of manufacture is to solder the fins into the heat sink base.

Another heat sink material that can be used is diamond. With a thermal conductivity value of 2000 W/m·K, it exceeds that of copper by a factor of five. In contrast to metals, where heat is conducted by delocalized electrons, lattice vibrations are responsible for diamond's very high thermal conductivity. For thermal management applications, the outstanding thermal conductivity and diffusivity of diamond are essential. CVD diamond may be used as a sub-mount for high-power integrated circuits and laser diodes.

Composite materials also can be used. Examples are a copper-tungsten pseudoalloy, AlSiC (silicon carbide in aluminum matrix), Dymalloy (diamond in copper-silver alloy matrix), and E-Material (beryllium oxide in beryllium matrix). Such materials are often used as substrates for chips, as their thermal expansion coefficient can be matched to ceramics and semiconductors.

Fin efficiency is one of the parameters which make a higher thermal conductivity material important. A fin of a heat sink may be considered to be a flat plate with heat flowing in one end and being dissipated into the surrounding fluid as it travels to the other. As heat flows through the fin, the combination of the thermal resistance of the heat sink impeding the flow and the heat lost due to convection, the temperature of the fin and, therefore, the heat transfer to the fluid, will decrease from the base to the end of the fin. This factor is called the fin efficiency and is defined as the actual heat transferred by the fin, divided by the heat transfer were the fin to be isothermal (hypothetically the fin having infinite thermal conductivity). Equations 5 and 6 are applicable for straight fins.

$$\eta_f = \frac{\tanh(mL_c)}{mL_c}, \quad (5)$$

$$mL_c = \sqrt{\frac{2h_f}{kt_f}} L_f, \quad (6)$$

Where $h_f$ is the convection coefficient of the fin (Air: 10 to 100 W/(m²·K), Water: 500 to 10,000 W/(m²·K)); k is the thermal conductivity of the fin material (Aluminum: 120 to 240 W/(m²·K)); $L_f$ is the fin height (m); and $t_f$ is the fin thickness (m).

Another parameter that concerns the thermal conductivity of the heat sink material is spreading resistance. Spreading resistance occurs when thermal energy is transferred from a small area to a larger area in a substance with finite thermal conductivity. In a heat sink, this means that heat does not distribute uniformly through the heat sink base. The spreading resistance phenomenon is shown by how the heat travels from the heat source location and causes a large temperature gradient between the heat source and the edges of the heat sink. This means that some fins are at a lower temperature than if the heat source were uniform across the base of the heat sink. This non-uniformity increases the heat sink's effective thermal resistance.

A pin fin heat sink is a heat sink that has pins that extend from its base. The pins can be, for example, cylindrical, elliptical or square/geometric polygonal. A second type of heat sink fin arrangement is the straight fin. These run the entire length of the heat sink. A variation on the straight fin heat sink is a cross cut heat sink. A straight fin heat sink is cut at regular intervals but at a coarser pitch than a pin fin type.

In general, the more surface area a heat sink has, the better it works. However, this is not always true. The concept of a pin fin heat sink is to try to pack as much surface area into a given volume as possible. As well, it works well in any orientation. Kordyban has compared the performance of a pin fin and a straight fin heat sink of similar dimensions. Although the pin fin has 194 cm² surface area while the straight fin has 58 cm², the temperature difference between the heat sink base and the ambient air for the pin fin is 50° C. For the straight fin it was 44° C. or 6° C. better than the pin fin. Pin fin heat sink performance is significantly better than straight fins when used in their intended application where the fluid flows axially along the pins rather than only tangentially across the pins. See, Kordyban, T., Hot air rises and heat sinks—Everything you know about cooling electronics is wrong, ASME Press, N Y 1998.

Another configuration is the flared fin heat sink; its fins are not parallel to each other, but rather diverge with increasing distance from the base. Flaring the fins decreases flow resistance and makes more air go through the heat sink fin channel; otherwise, more air would bypass the fins. Slanting them keeps the overall dimensions the same, but offers longer fins. Forghan, et al. have published data on tests conducted on pin fin, straight fin and flared fin heat sinks. See, Forghan, F., Goldthwaite, D., Ulinski, M., Metghalchi, M., Experimental and Theoretical Investigation of Thermal Performance of Heat Sinks, ISME, May. 2001. They found that for low approach air velocity, typically around 1 m/s, the thermal performance is at least 20% better than straight fin heat sinks. Lasance and Eggink also found that for the bypass configurations that they tested, the flared heat sink performed better than the other heat sinks tested. See, Lasance, C. J. M and Eggink, H. J., A Method to Rank Heat Sinks in Practice: The Heat Sink Performance Tester, 21st IEEE Semi-Therm Symposium 2001.

The heat transfer from the heatsink is mediated by two effects: conduction via the coolant, and thermal radiation. The surface of the heatsink influences its emissivity; shiny metal absorbs and radiates only a small amount of heat, while matte black is a good radiator. In coolant-mediated heat transfer, the contribution of radiation is generally small. A layer of coating on the heatsink can then be counterproductive, as its thermal resistance can impair heat flow from the fins to the coolant. Finned heatsinks with convective or forced flow will not benefit significantly from being colored. In situations with significant contribution of radiative cooling, e.g. in case of a flat non-finned panel acting as a heatsink with low airflow, the heatsink surface finish can play an important role. Matte-black surfaces will radiate much more efficiently than shiny bare metal. The importance of radiative vs. coolant-mediated heat transfer increases in situations with low ambient air pressure (e.g. high-altitude operations) or in vacuum (e.g. satellites in space). See, Fourier, J. B., 1822, Theorie analytique de la chaleur, Paris; Freeman, A., 1955, translation, Dover Publications, Inc, NY; Kordyban, T., 1998, Hot air rises and heat sinks—Everything you know about cooling electronics is wrong, ASME Press, NY; Anon, Unknown, "Heat sink selection", Mechanical engineering department, San Jose State University [27 Jan. 2010]; www.engr.sjsu.edu/ndejong/ME%20146%20files/ Heat%20Sink.ppt; Sergent, J. and Krum, A., 1998, Thermal management handbook for electronic assemblies, First Edition, McGraw-Hill; Incropera, F. P. and DeWitt, D. P., 1985, Introduction to heat transfer, John Wiley and sons, NY; Forghan, F., Goldthwaite, D., Ulinski, M., Metghalchi, M., 2001, Experimental and Theoretical Investigation of Thermal Performance of Heat Sinks, ISME May; Lasance, C. J. M and Eggink, H. J., 2001, A Method to Rank Heat Sinks in Practice: The Heat Sink Performance Tester, 21st IEEE SEMI-THERM Symposium; ludens.cl/Electron/Thermal.html; Lienard, J. H., IV & V, 2004, A Heat Transfer Textbook, Third edition, MIT; Saint-Gobain, 2004, "Thermal management solutions for electronic equipment" 22 Jul. 2008 www.fff.saint-gobain.com/Media/Documents/ S0000000000000001036/ThermaCool%20Brochure.pdf; Jeggels, Y. U., Dobson, R. T., Jeggels, D. H., Comparison of the cooling performance between heat pipe and aluminium conductors for electronic equipment enclosures, Proceedings of the 14th International Heat Pipe Conference, Florianópolis, Brazil, 2007; Prstic, S., Iyengar, M., and Bar-Cohen, A., 2000, Bypass effect in high performance heat sinks, Proceedings of the International Thermal Science Seminar Bled, Slovenia, June 11-14; Mills, A. F., 1999, Heat transfer, Second edition, Prentice Hall; Potter, C. M. and Wiggert, D. C., 2002, Mechanics of fluid, Third Edition, Brooks/Cole; White, F. M., 1999, Fluid mechanics, Fourth edition, McGraw-Hill International; Azar, A, et al., 2009, "Heat sink testing methods and common oversights", Qpedia Thermal E-Magazine, January 2009 Issue; www.qats-.com/cpanel/UploadedPdf/January20092.pdf.

Several structurally complex heatsink designs are discussed in Hernon, US 2009/032104.

The relationship between friction and convention in heatsinks is discussed in Frigus Primore, "A Method for Comparing Heat Sinks Based on Reynolds Analogy," available at akemalhammar.fr/downloads/Reynolds_analogy_heatsinks.PDF. This article notes that for, plates, parallel plates, and cylinders to be cooled, it is necessary for the velocity of the surrounding fluid to be low in order to minimize mechanical power losses. However, larger surface flow velocities will increase the heat transfer efficiency, especially where the flow near the surface is turbulent, and substantially disrupts a stagnant surface boundary layer. Primore also discusses heatsink fin shapes and notes that no fin shape offers any heat dissipation or weight advantage compared with planar fins, and that straight fins minimize pressure losses while maximizing heat flow. Therefore, the art generally teaches that generally flat and planar surfaces are appropriate for most heatsinks.

Frigus Primore, "Natural Convection and Inclined Parallel Plates," www.engineeringclicks.com/natural-convection-and-inclined-parallel-plates/, discusses the use of natural convection (i.e., convection due to the thermal expansion of a gas surrounding a solid heatsink in normal operating conditions) to cool electronics. One of the design goals of various heatsinks is to increase the rate of natural convection. Primore suggests using parallel plates to attain this result. Once again, Primore notes that parallel plate heat sinks are the most efficient and attempts to define the optimal spacing and angle (relative to the direction of the fluid flow) of the heat sinks according to the equations in FIG. 1:

Optimum Plate Spacing (1)

$$S_{opt} = k_s \left(\frac{L}{dT}\right)^{0.25} \cdot \cos(\gamma)^{-0.25}$$

$$\gamma_{opt} = a\tan\left(\frac{1H}{3W}\right) \qquad \frac{H}{W} < \sqrt{3}$$

$$\gamma_{opt} = \frac{\pi}{4} - 0.508\left(\frac{H}{W}\right)^{-1.237} \qquad \frac{H}{W} > \sqrt{3}$$

Total heat Dissipation (2)

$$\dot{Q} = k_v \cdot k_\gamma \cdot A_c \cdot H^{0.5} \cdot dT^{1.5}$$

$$k_\gamma = \sqrt{1 + \frac{1}{9}\left(\frac{H}{W}\right)^2} \qquad \frac{H}{W} < \sqrt{3}$$

$$k_\gamma = 0.307 \cdot \left(\frac{H}{W}\right)^{-0.5} + 0.696 \cdot \left(\frac{H}{W}\right)^{-0.5} \qquad \frac{H}{W} > \sqrt{3}$$

Applied Equation (3)

$$\dot{Q} = \eta_v \cdot k_v \cdot k_\gamma \cdot A_c \cdot H^{0.5} \cdot dT_{ref}^{1.5}$$

$dT$ = Temperature difference $(K)$ $A_c = W \cdot D$ $\eta_v$ = Volumetric efficiency [--]

$\dot{Q}$ = Heat dissipation $[W]$

In another article titled "Natural Convection and Chimneys," available at akemalhammar.fr/articels2/parallel_pl_Inc.html, discusses the use of parallel plates in chimney heat sinks. One purpose of this type of design is to combine more efficient natural convection with a chimney. Primore notes that the design suffers if there is laminar flow (which creates a re-circulation region in the fluid outlet, thereby completely eliminating the benefit of the chimney) but benefits if there is turbulent flow which allows heat to travel from the parallel plates into the chimney and surrounding fluid.

Batten, Paul, et al. "Sub-Grid Turbulence Modeling for Unsteady Flow with Acoustic Resonance," available at www.researchgate.net/publication/269068673_Sub-grid_turbulence_modeling_for_unsteady_flow_with_a-coustic_resonance, discuss that when a fluid is flowing around an obstacle, localized geometric features, such as concave regions or cavities, create pockets of separated flow which can generate self-sustaining oscillations and acoustic resonance. The concave regions or cavities serve to substantially reduce narrow band acoustic resonance as compared to flat surfaces. This is beneficial to a heat sink in a turbulent flow environment because it allows for the reduction of oscillations and acoustic resonance, and therefore for an increase in the energy available for heat transfer.

Liu, S., et al., "Heat Transfer and Pressure Drop in Fractal Microchannel Heat Sink for Cooling of Electronic Chips," 44 Heat Mass Transfer 221 (2007), discuss a heatsink with a "fractal-like branching flow network." Liu's heatsink includes channels through which fluids would flow in order to exchange heat with the heatsink.

Y. J. Lee, "Enhanced Microchannel Heat Sinks Using Oblique Fins," IPACK 2009-89059, similarly discusses a heat sink comprising a "fractal-shaped microchannel based on the fractal pattern of mammalian circulatory and respiratory system." Lee's idea, similar to that of Liu, is that there would be channels inside the heatsink through which a fluid could flow to exchange heat with the heatsink. The stated improvement in Lee's heatsink is (1) the disruption of the thermal boundary layer development; and (2) the generation of secondary flows.

Pence, D. V., 2002, "Reduced Pumping Power and Wall Temperature in Microchannel Heat Sinks with Fractal-like Branching Channel Networks", Microscale Thermophys. Eng. 5, pp. 293-311, mentions heatsinks that have fractal-like channels allowing fluid to enter into the heat sink. The described advantage of Pence's structure is increased exposure of the heat sink to the fluid and lower pressure drops of the fluid while in the heatsink.

In general, a properly designed heatsink system will take advantage of thermally induced convection or forced air (e.g., a fan). In general, a turbulent flow near the surface of the heatsink disturbs a stagnant surface layer, and improves performance. In many cases, the heatsink operates in a non-ideal environment subject to dust or oil; therefore, the heatsink design must accommodate the typical operating conditions, in addition to the as-manufactured state.

Therefore, two factors appear to conflict in optimizing the configuration of an external heat exchange surface: the surface configuration designed to disturb laminar flow patterns, create turbulence, and enhance convective heat transfer, and the desire to efficiently flow large volumes of heat transfer fluid (e.g., air), over the surfaces, which is enhanced by laminar (smooth) flow. Even in passive dissipative device, convective flow may be a significant factor, and reducing air flow volume and velocity by increasing the effective impedance can be counterproductive. On the other hand, in some cases, the amount of energy necessary to move the air is dwarfed by the problem to be solved. In many computing systems, the processors are thermally constrained, that is, the functioning of the processor is limited by the ability to shed heat. In such cases, innovative ways to improve the efficiency of heat transfer may yield significant benefit, even if in some regimes of operation, they impose certain inefficiencies.

Prior art heatsink designs have traditionally concentrated on geometry that is Euclidian, involving structures such as the pin fins, straight fins, and flares discussed above.

N J Ryan, D A Stone, "Application of the FD-TD method to modelling the electromagnetic radiation from heatsinks", IEEE International Conference on Electromagnetic Compatibility, 1997. 10th (1-3 Sep. 1997), pp: 119-124, discloses a fractal antenna which also serves as a heatsink in a radio frequency transmitter.

Lance Covert, Jenshan Lin, Dan Janning, Thomas Dalrymple, "5.8 GHz orientation-specific extruded-fin heatsink antennas for 3D RF system integration", 23 Apr. 2008 DOI: 10.1002/mop.23478, Microwave and Optical Technology Letters Volume 50, Issue 7, pages 1826-1831, July 2008 also provide a heatsink which can be used as an antenna.

See, U.S. 20140098542; 20130309778; 20130286666; 20130155687; 20130042893; 20120174650; 20120031272; 20110280019; 20110226460; 20090045967; 20090021270; 20070041159; 20060072289; 8,784,540; 8,764,243; 8,602,599; 8,539,840; 8,506,674; 8,491,683; 7,696,890; 7,113,402; and 5,856,836.

SUMMARY OF THE INVENTION

In a preferred embodiment, a heatsink employed according to the present technology provides a branched 3D network of elements, which have a high surface area and, especially, near the terminal branches, have microstructured surfaces. As a result, dust may accumulate on the surfaces, resulting in decreased surface area as the dust obscures the microstructuring, increased thermal resistance, and deoptimized air flow patterns. Therefore, various technologies may be provided to reduce or eliminate the dust deposition on the surfaces than may occur in real-world environments:
vacuum environment;
filtering of the incoming air which circulates around the heatsink, e.g., using a HEPA filter;
clean liquid heat transfer medium;
air jet(s) which operate continuously or periodically to dislodge dust particles;
inducing electrostatic charge on the dust particles to repel them from the surface of the heatsink;
high voltage electric fields with or without electric discharge to cause the dust particles to move in response to the fields;
pyrolizing the dust (or binding factors within the dust that cause sticking to the surfaces), such as by intermittent IR laser emissions, resistive heating of the terminal branches of the heatsink, radiative heating, combustion, or other processes;
narrowband vibration over a range of frequencies representing resonances in the branches of the heatsink;
impulse vibration (e.g., from a piezoelectric transducer);
use of shape memory alloys, and causing a transition through the Curie temperature to induce significant shape change, resulting in surface stresses to dislodge dust.

In various cases, the physical effect sought to be employed to prevent dust accumulation or to dislodge the dust may impair or risk impairing the device being protected by the heatsink. For example, pyrolysis of the dust or its binder requires high temperatures, which would normally diffuse back to the device being protected. However, according to the present technology, this can be prevented by focusing the effect on the terminal branches of the heatsink. For example, a catalytic coating on the tips of the heatsink branches would permit a sub-explosive mixture of a combustible gas to combust at the catalyst, while air flows on other portions of the heatsink could protect the device from overheating. Similarly, use of an infrared (or other wavelength) pulse laser would cause two distinct effects to reduce dust accumulation: first, the laser would heat the immediate region of the heatsink irradiated by the laser, and second, the rapid thermal expansion of the heated material would generate a pressure shock wave that would tend to fracture the aggregated dust material; the amount of heat used need not be significant with respect to the heat load capacity of the heatsink. Therefore, heat-based technologies may acceptably be employed to remove dust.

A current flowing through the branched heatsink would cause heating, with higher temperatures at the narrow terminal branches. The voltages associated with high currents flowing through a metallic heatsink are low, and would generally not cause damage to electronics unless flowing through a forward-biased junction. Therefore, if the heating was performed as periodic pulses, the tips of the branched network would heat, and that heating would tend to reduce binding of the dust and cause a thermal expansion that would cause a strain in the dust layer that would reduce adhesion. Therefore, the dust layer would be disrupted. Similarly, a current passing through a shape memory allow such as Nitinol, would cause mechanical stresses and strains that could disrupt a dust layer, without requiring high temperature excursions beyond the Curie temperature of the material.

The use of vibration, wither continuous or pulsed, may cause damage to the device protected by the heatsink. One way to protect the device is through a liquid or gel-like layer that does not support propagation of shear waves, and exciting the vibrations in a shear mode. As such, the liquid or gel interface, which may be a heat transfer paste, may isolate the device to be protected from the vibration. In some cases, an active vibration suppression technology may be employed, such as a piezoelectric transducer that emits a feedback-controlled vibration to reduce the vibration experienced by the device to be protected.

Vibration is particularly interesting as a physical process to dislodge dust and debris and to maintain cleanliness of the heat exchange surfaces. The process imposes three constraints: first, vibration itself creates heat, which may or may not be a significant factor; second, many systems which generate heat may themselves be sensitive to vibration, for example bond wires of integrated circuits; and third, significant vibration may lead to fracture failure of the heatsink, bearing in mind that the vibration should have sufficient amplitude to generate inertia in the particulates at the surface to overcome the adhesive forces, and the movement may also create turbulence in the surrounding heat exchange media. In order to overcome these issues, a vibration isolator may be provided between the heat source and the source of vibration, which may be, for example, a piezoelectric element or electromagnetic element. The vibration isolator may be, for example, a plastic thermal transfer medium (e.g., a paste), a non-shear transmissive solid, such as a wire bundle (e.g., thin copper wires), an active vibration suppression interface, or the like. Further, the branching or fractal characteristics of the heatsink may be exploited to selectively transmit the vibrations distally from the source, by selecting the frequency or frequency range, vibration mode, etc., to generate significant movement of the distal branches of the heatsink, without unduly stressing the heat source. In another embodiment, the heatsink is "separable" from the heat source over a short period, and during that period, a large impulse is launched in the heatsink, to dislodge dust; the heatsink is thereafter reconnected to the source. In another embodiment, the heatsink is supported on an anisotropic mount (e.g., piston in cylinder), that provides good heat transfer, but does not support transmission of vibrations along at least one axis, which is then used as the axis of excitation for dust removal.

Electrostatic charge may cause damage to semiconductors. In order for electrostatic repulsion to be effective, the dust particles should be charged to a net charge of the same polarity as the heatsink, with an oppositely charged collector in the air flow path to divert the dust. The dust may be charged with a radioisotope, typically a low energy alpha or beta particle emitter, or through induced charge by charged plates, screen, or electron emitting surface. The voltages will typically be in the hundreds or low thousands of Volts, and in an environment that maintains such potential differences, discharge events may be common. If the device being protected or other nearby devices are static or static discharge sensitive, the result may be damage to the sensitive components. One way to reduce this issue is to dielectrically isolate the protected device from the electrically charged heatsink. For example, a high thermal conductivity layer, such as a diamond-like layer, may be provided as an electrical conduction barrier, with the sensitive device-side electrically grounded. This configuration might permit (or in some cases, encourage) dust deposition on the grounded portion of the heatsink and sensitive device; however, the structure of the branched network is such that accumulation of dust at the root of the branching network does not substantially impair heatsink operation.

In a vacuum environment, no dust is present, but convective heat transfer is prevented. Nevertheless, heat transfer through radiation may be sufficient, as fractal structures are known to be extremely efficient antennas for transmitting electromagnetic radiation. If the air passing over the heatsink is filtered with a HEPA filter, the presence of dust is significantly reduced, but the air-movement efficiency is also impaired. Air jets (typically with filtered air) may be aimed at portions of the heatsink and used to blow away accumulated dust. These have low efficiency with respect to the air in the jet being used as a heat transfer medium, but are efficient in removing dust. In some cases, an air jet can consolidate and densify loose dust, and therefore such jets should operate frequently, before significant dust accumulation can occur.

In a vacuum or radiative embodiment, the design of the exterior surface may be optimized to maximize emission (generally by maximizing hot surface area), and minimize recapture of radiated heat, among other constraints. This can generally be met by texturing the surface and avoiding hot parallel surfaces and especially by inclining surfaces with respect to each other. In three dimensions, the optimized radiant heatsink may be fractal, since these can be optimized to have high surface area, and obtuse relative angles. Likewise, more distal portions of the heatsink from the heat source may have more reflective surfaces than proximal portions, which may have greater emissivity. When such devices are subject to convective cooling as well, the recapture may be less of a factor in the overall efficiency, but should not be ignored, especially at the high temperature regions of the heatsink. In the convective case, the fluid may have entrained particles or dust, and this dust may be captured by or adhere to surfaces of the heatsink, reducing its efficiency by changing the shape and surface emissivity characteristics, changing the heat diffusion characteristics within the solid phases, and impairing convection.

A time-varying flow of a fluid, e.g., a heat exchange media, can be provided over the heatsink. This achieves a number of advantages. First, while a high flow rate peak may be an inefficient use of energy in terms of running the fan or pump, the high flow rate may assist in dislodging dust by inertia and turbulence. Second, the changes in flow rate will tend to create time-varying tensor flow patterns that increase the probability that the dust or debris will be at least temporarily dislodged from the surface and available for advective flow in the fluid medium. Third, the time varying flow, especially peak rates, can disrupt surface fluid boundary layers, increasing the advective component of the convective transfer process.

In some cases, non-adhesive particles may be entrained in the stream, to assist in removing surface debris. That is, while normally dust and particulates are sought to be avoided near the heatsink, by intentionally entraining specific particles, dust removal may be facilitated. For example, relatively dense particles entrained in a fluid flow can impact the surfaces of the heatsink, and as a result dislodge adherent dust or particles. While often a minor effect, the particles can themselves participate in conductive and advective heat transfer. Further, the heterogeneous fluid with particles can enhance turbulent flow patterns around the surfaces of the heatsink, enhancing heat flow from the surfaces. The heatsink system is typically a closed system, and therefore the entrained particles may then be recollected, filtered (to remove the undesired dust), and reused. In one embodiment, the particles are magnetic, and can therefore be collected magnetically, relaxing the need for a sealed system. Similarly, electrostatic particle collection technology may be employed. With respect to magnetic particles, the heatsink itself may be periodically magnetized, for cause the cool magnetic particles to stick, and thereafter demagnetized, permitting the heated magnetic particles to become free and entrained in the surrounding fluid, thus enhancing the advective heat transfer process. Similarly, in a vacuum or low pressure environment, transient contact of the particles (magnetic or otherwise) with the heat transfer surfaces may facilitate advective heat transfer as an adjunct to radiative heat transfer, and thus the particles need not be entrained in a fluid.

The result of the fluid flow process, especially under dynamically changing conditions, can be complex. For example, the flow can cause turbulent flow around the heat exchange elements, which induce complex pressure differentials, vibrations, and inertial flow patterns. Dynamically changing the flow rate or flow pattern can help distribute the turbulent dynamics over various regions of the heatsink surface. Thus, the entire surface of the heatsink need not be subject to continual high fluid flow rates, and only a small portion of the surface at any given time might be subject to a "jet" of fluid flow, thus reducing the energy disadvantage. Meanwhile, the jet may be strategically focused on portions of the heatsink intended to achieve particular effects. When the jet (or more generally, high flow rate stream) is focused or directed at the hot portion of the heatsink, higher convective heat transfer will occur. However, discontinuous high flow rates may be advantageous, since a reduced fluid flow on a region will tend to cause a diffusive heat transfer to the heat transfer material underlying the cooled surface, and thus lead to higher efficiency heat transfer when the jet or stream returns. Meanwhile, the jet or stream can be directed to other portions of the heatsink. This, in turn, causes dynamic temperature gradients within the heatsink, which can be controlled to causes pulsatile heating at the periphery of the heatsink, especially in a branched network. Thus, for example, in a fractal branched heatsink, the stream of fluid can be controlled to permit various regions of the heatsink to undergo heating and cooling cycles, such that the hot spots on the heatsink are dynamically controlled to be selectively cooled. While a model of the process may be employed, sensors, such as thermal sensors, thermal cameras, passive infrared sensors, optical camera with thermally responsive coating on the heatsink, or the like, may be used to monitor surface temperatures of the heatsink, and adaptively supply coolant as appropriate. Sensors may also be used to detect surface contamination of the heatsink, and a need for removal of the contamination, which may be by fluid jet, entrained particles, mechanical debris removal, etc.

The fluid flow over the heatsink surface can also cause acoustic resonance, which in the case of a heatsink having a fractal geometry, can be, in the aggregate, a broadband resonance. The flow can be pulsatile, with pulses causing inertial transfer of energy to the debris on the surface, resulting in separation from the underlying heat exchange surface. The flow can also cause stress and strain on the debris coating on the surface, causing separation along the surface plane. In some, the time varying flow can effectively remove the accumulated surface debris. A static flow in some cases could also reduce accumulation, but it is noted that the static flow is presumed to be associated with the accumulation conditions, and maintenance of sufficient continuous flow conditions to remove accumulation may consume excess energy, noise, and abrasion of the heat exchange surfaces.

Liquid heatsinks typically provide for a flow of liquid within a tube or channel or confined space. (In some cases, a spray of a non-volatile fluid over an open heat transfer surface is provided, similar to a machining process). As a result, a relatively large body of heat transfer material is provided with channels provided therein. In such a design, the cross-section area of the channels is relatively constant in the aggregate as the fluid travels through the branched channels. As a result, the linear velocity of the fluid flow will be constant. However, when one considers the logistics of a typical design, the flow channels are either planar or the design is radially symmetric.

In a planar configuration, a base of the heatsink interfaces with the heat source, and the fluid flows through the structure above the heat source to withdraw heat. See, Escher, W., B. Michel, and D. Poulikakos. "Efficiency of optimized bifurcating tree-like and parallel microchannel networks in the cooling of electronics." International Journal of Heat and Mass Transfer 52.5 (2009): 1421-1430; Wang et al., "Flow and Thermal Characteristics of Offset Branching Network," 12 Aug. 2009, International Journal of Thermal Science, Vol. 49, Pages 272-280; Yongping, Chen, et al. "Characteristics of Heat and Fluid Flow in Fractal Tree-like Channel Heat Sink [J]." Acta Aeronautica Et Astronautica Sinica 3 (2010): 008; Xu, Peng, et al. "Thermal characteristics of tree-shaped microchannel nets with/without loops." International Journal of Thermal Sciences 48.11 (2009): 2139-2147; Liu, Shutian, Yongcun Zhang, and Peng Liu. "Heat transfer and pressure drop in fractal microchannel heat sink for cooling of electronic chips." Heat and Mass Transfer 44.2 (2007): 221-227; Alharbi, Ali Y., Deborah V. Pence, and Rebecca N. Cullion. "Thermal characteristics of microscale fractal-like branching channels." Journal of Heat Transfer 126.5 (2004): 744-752; Hong, F. J., et al. "Conjugate heat transfer in fractal-shaped microchannel network heat sink for integrated microelectronic cooling application." International Journal of Heat and Mass Transfer 50.25 (2007): 4986-4998; Lee, Yong-Jiun, Poh-Seng Lee, and Siaw-Kiang Chou. "Enhanced microchannel heat sinks using oblique fins." ASME 2009 InterPACK Conference collocated with the ASME 2009 Summer Heat Transfer Conference and the ASME 2009 3rd International Conference on Energy Sustainability, American Society of Mechanical Engineers, 2009; Senn, S. M., and D. Poulikakos. "Laminar mixing, heat transfer and pressure drop in tree-like microchannel nets and their application for thermal management in polymer electrolyte fuel cells." Journal of Power Sources 130.1 (2004): 178-191; Xiangqi, Wang. "New approaches to micro-electronic component cooling." PhD diss., 2007 (National University of Singapore); U.S. Pat. Nos. 6,688,381; 2008037927; 6,333,852; 7,256,751. The temperature gradient within the heatsink having a planar flow plane would generally be decreasing with distance away from the interface, with the bulk material in and near the fluid flow plane largely isothermal.

In a radially symmetric arrangement, typically a constant cross section branched solid heatsink (e.g., extruded), see e.g., U.S. Pat. Nos. 4,715,438; 20080080137, 20090050293; 8,295,046; 2,535,721, may be placed within a shell or confinement, and a contained fluid permitted to contact the exposed surfaces. In this case, the fluid path is not highly constrained, and the operating temperature may be unstable, for example due to nearly adiabatic movement of fluid masses as a result of density and viscosity differences of the heated fluid. An extruded heatsink is generally a suboptimal shape, since the more distal portions of the structure a constant higher surface by lower thermal gradient. Indeed, due to possible adiabatic movement of hot fluid, in some cases the fluid can heat portions of the heatsink.

A "structurally complex" heatsink is provided in US 20090321045, but without branching networks and without optimized regional heterogeneity.

In a closed, vacuum or filtered system, typically no accumulation of dust, debris or precipitate on the heat exchanger surface occurs.

The techniques discussed above may be classified in five schemes: prevention of deposition; mechanical removal of deposition; thermal degradation of typically organic material; shock waves or vibrations to disrupt surface layer debris; and dynamic configuration.

Most heatsinks are designed using a linear or exponential relationship of the heat transfer and dissipating elements. A known geometry which has not generally been employed is fractal geometry. Some fractals are random fractals, which are also termed chaotic or Brownian fractals and include random noise components. In deterministic fractal geometry, a self-similar structure results from the repetition of a design or motif (or "generator") using a recursive algorithm, on a series of different size scales. As a result, certain types of fractal images or structures appear to have self-similarity over a broad range of scales. On the other hand, no two ranges within the design are identical.

A fractal is defined as "a rough or fragmented geometric shape that can be split into parts, each of which is (at least approximately) a reduced-size copy of the whole." Mandelbrot, B. B. (1982). That is, there is a recursive algorithm which describes the structure. The Fractal Geometry of Nature. W.H. Freeman and Company. ISBN 0-7167-1186-9. This property is termed "self-similarity." For a more detailed discussion of fractals, see the Wikipedia article thereon at en.wikipedia.org/wiki/Fractal. Exemplary images of well-known fractal designs can also be viewed on the Wikipedia page. Due to the fact that fractals involve largely self-repeating patterns, each of which serves to increase the surface area in three-dimensional fractals (perimeter in two-dimensional fractals), three dimensional fractals in theory are characterized by infinite surface area (and two-dimensional fractals are characterized by infinite perimeter). In practical implementations, the scale of the smallest features, which remain true to the generating algorithm, may be 3-25 iterations of the algorithm. Less than three recursions, and the fractal nature is not apparent, while present manufacturing technologies limit the manufacture of objects with a large range of feature scales.

An "approximately" fractal structure is one that, while a true fractal is a result of infinite number of iterations leading sometimes to infinite length of the border (such as Koch snowflake), in reality, any manufactured fractal will be a result of finite number of iterations in the fractal algorithm: 2 or 3, but rarely more than 5 or 6. The approximate fractal design may display various symmetries, and typically has a branched architecture with a tapering cross section from the heat source to the periphery.

Fractal theory is related to chaos theory. See, en.wikipedia.org/wiki/Chaos_theory. See, Sui, Y., Teo, C. J., Lee, P. S., Chew, Y. T., & Shu, C. (2010). Fluid flow and heat transfer in wavy microchannels. International Journal of Heat and Mass Transfer, 53(13), 2760-2772; Garibaldi, Dott Ing Pietro. Single-phase natural circulation loops: effects of geometry and heat sink temperature on dynamic behavior and stability. Diss. Ph. D. Thesis, 2008; Fichera, A., and A. Pagano. "Modelling and control of rectangular natural circulation loops." International journal of heat and mass transfer 46.13 (2003): 2425-2444; Fichera, Alberto, et al. "A modeling strategy for rectangular thermal convection loops." World Congress. Vol. 15. No. 1. 2002; Crane, Jackson T. Radial parallel plate flow with mechanical agitation. Diss. Massachusetts Institute of Technology, 2013.

This fractal nature is useful in a heatsink because the rate at which heat is transferred from a surface, either through convection or through radiation, is typically related to, and increasing with, the surface area. Of course, due to limitations in the technology used to build these heatsinks, engineering compromise is expected. However a feature of an embodiment of the designs proposed herein is that vortices induced by fluid flow over a heat transfer surface will be chaotically distributed over various elements of the surface, thus disrupting the stagnant surface boundary layer and increasing the effective surface area available for heat transfer, while avoiding acoustic resonance which may be apparent from a regular array of structures which produce vortices and turbulence.

Further, a large physical surface area to volume ratio, which is generally useful in heatsink design, can still be obtained using the fractal model. In addition, fractal structures provide a plurality of concave regions or cavities, providing pockets of separated flow which can generate self-sustaining oscillations and acoustic resonance. These pockets serve to reduce the acoustic resonance in turbulent flowing fluid (as compared to flat or Euclidian surfaces), thus allowing for more effective heat transfer between the fractal structure and the surrounding fluid, thereby making the fractal structure ideal for a heatsink.

U.S. Pat. No. 7,256,751 (Cohen), discusses fractal antennas. In the background of this patent, Cohen discusses Kraus' research, noting that Euclidian antennas with low area (and therefore low perimeter) exhibit very low radiation resistance and are thus inefficient. Cohen notes that the advantages of fractal antennas, over traditional antennas with Euclidian geometries, is that they can maintain the small area, while having a larger perimeter, allowing for a higher radiation resistance. Also, Cohen's fractal antenna features non-harmonic resonance frequencies, good bandwidth, high efficiency, and an acceptable standing wave ratio.

In the instant invention, this same wave theory may be applied to fractal heatsinks, especially with respect to the interaction of the heat transfer fluid with the heatsink. Thus, while the heat conduction within a solid heatsink is typically not modeled as a wave (though modern thought applies phonon phenomena to graphene heat transport), the fluid surrounding the heating certainly is subject to wave phenomena, complex impedances, and indeed the chaotic nature of fluid eddies may interact with the chaotic surface configuration of the heatsink.

The efficiency of capturing electric waves in a fractal antenna, achieved by Cohen, in some cases can be translated into an efficiency transferring heat out of an object to be cooled in a fractal heatsink as described herein. See, Boris Yakobson, "Acoustic waves may cool microelectronics", Nano Letters, ACS (2010). Some physics scholars have suggested that heat can be modeled as a set of phonons. Convection and thermal radiation can therefore be modeled as the movement of phonons. A phonon is a quasiparticle characterized by the quantization of the modes of lattice vibration of solid crystal structures. Any vibration by a single phonon is in the normal mode of classical mechanics, meaning that the lattice oscillates in the same frequency. Any other arbitrary lattice vibration can be considered a superposition of these elementary vibrations. Under the phonon model, heat travels in waves, with a wavelength on the order of 1 µm. In most materials, the phonons are incoherent, and, therefore, on macroscopic scales, the wave nature of heat transport is not apparent or exploitable.

The thermodynamic properties of a solid are directly related to its phonon structure. The entire set of all possible phonons combine in what is known as the phonon density of states which determines the heat capacity of a crystal. At absolute zero temperature (0 Kelvin or −273 Celsius), a crystal lattice lies in its ground state, and contains no phonons. A lattice at a non-zero temperature has an energy that is not constant, but fluctuates randomly about some mean value. These energy fluctuations are caused by random lattice vibrations, which can be viewed as a gas-like structure of phonons or thermal phonons. However, unlike the atoms which make up an ordinary gas, thermal phonons can be created and destroyed by random energy fluctuations. In the language of statistical mechanics this means that the chemical potential for adding a phonon is zero. For a more detailed description of phonon theory, see the Wikipedia article thereon available at en.wikipedia.org/wiki/Phonon.

In certain materials, such as graphene, phonon transport phenomena are apparent at macroscopic levels, which make phonon impedance measurable and useful. Thus, if a graphene sheet were formed to resonate at a particular phonon wavelength, the resonant energy would not be emitted. On the other hand, if the graphene sheet were configured using a fractal geometry, the phonon impedance would be well controlled over a broad range of wavelengths, with sharp resonances at none, leading to an efficient energy dissipation device.

One aspect of the technology therefore employs a thermally responsive technology, such as a memory metal or bimetal element actuator (which may be passive or active) (see en.wikipedia.org/wiki/Bimetallic_strip; www.emsclad.com/fileadmin/Data/Divisions/EMS/Bimetal_Desingers_Guide.pdf), or other active or passive element, to change the configuration of the heatsink under various conditions. It is noted that in an automotive radiator, a thermostat is provided to shunt flow around the radiator when the engine is cool. This is distinguished herein, in various alternate ways. For example, a variable geometry heatsink according to the present technology may have an external surface exposed to an unconstrained heat transfer medium, such as air. See, Baurle, R. A., and D. R. Eklund. "Analysis of dual-mode hydrocarbon scramjet operation at Mach 4-6.5." Journal of Propulsion and Power 18.5 (2002): 990-1002; Cockrell Jr, Charles E. "Technology Roadmap for Dual-Mode Scramjet Propulsion to Support Space-Access Vision Vehicle Development." (2002); Boudreau, Albert H. "Hypersonic air-breathing propulsion efforts in the air force research laboratory." AIAA 3255.1 (2005): 10; Kay, Ira W., W. T. Peschke, and R. N. Guile. "Hydrocarbon-fueled scramjet combustor investigation." Journal of Propulsion and Power 8.2 (1992): 507-512; Jackson, K., et al. "Calibration of a newly developed direct-connect high-enthalpy supersonic combustion research facility." AIAA paper (1998): 98-1510; Donbar, J., et al. "Post-test analysis of flush-wall fuel injection experiments in a scramjet", AIAA Paper 3197 (2001): 2001; Gruber, Mark, et al. "Newly developed direct-connect high-enthalpy supersonic combustion research facility." Journal of Propulsion and Power 17.6 (2001): 1296-1304; Andrews, Earl H. "Scramjet development and testing in the United States", AIAA paper 1927 (2001): 2001; Palac, Donald T., Charles J. Trefny, and Joseph M. Roche, Performance Evaluation of the NASA GTX RBCC Flowpath, NASA, Glenn Research Center, 2001; US 20030155110; 20040187861; 20050245659; 20090016019; 20090321047; 20100089549; 20100236236, 20100252648; 20110174462; 20120293952; 20140360699; 4,654,092; 4,931,626; 5,371,753; 5,483,098; 5,548,481; 5,510,598; 6,128,188; 6,330,157; 6,689,486; 7,080,989; 7,778,029; 8,228,671; 8,385,066; JP 03-070162; JP 04-291750; JP 61-098565; JP 63-006915; WO 99/04429.

For example, in one embodiment, a thermodynamic model of the system, encompassing at least the heat source, the heat sink, the thermal transfer medium, and a device to induce thermal transfer medium flow, determines, under each set of conditions, the optimal configuration. For example, at low loads, the heat sink may operate passively, without flows induced by an active device to induce flow in the thermal transfer medium. In such a case, radiative heat transfer may be important, as well as thermally-induced convection. Under high loads, the active device to induce flow in the thermal transfer medium may induce maximum flows, and the heatsink configured for minimal turbulence with laminar flows where possible. In intermediate states, the system may assume a configuration which is optimized according to a cost function, which may involve the effect of heat/temperature on the heat source, energy consumed by the active device to induce flow in the thermal transfer medium, noise resulting from induced flow, etc. This allows efficient use of an "oversized" heatsink, since the heatsink characteristics are variably controlled. In these intermediate states of configuration, efficiency may be improved by allowing the heatsink to assume a variable configuration. Since the optimum heatsink configuration depends on, e.g., ambient temperature, humidity, atmospheric pressure, heat load, air flow rate, gravitational vector with respect to the heatsink, etc., the model should explore the range of combinations of the device to induce thermal transfer medium flow, the variable geometry, and to a lesser extent, control over the heat source. An example of the later is that for a given power dissipation, it may be more efficient to have thermal cycles reaching a maximum temperature than a constant temperature. During the cycles, the geometry may change. Indeed, if the system is not in a static steady state, the geometry may optimally change during or in anticipation of temperature changes. An example here is that as the heat source produces a heat peak, the heat diffuses over time through a solid heatsink material. There is a lag, and so the temperature of the heat source is different that the temperature of the heatsink, and the heatsink itself has variations in temperature at different positions. Typically, there is a single actuator which controls the entire heatsink, though this is not a limitation, and there may be multiple actuators to control different parts of the heatsink independently or semi-independently. The device to induce thermal transfer medium flow may have a variable flow rate, and also may have multiple independently controlled portions. However, as the heat begins to peak, the device to induce thermal transfer medium flow may also increase activity. This, in turn, can reduce the temperature of various portions of the heatsink, depending on the relationship of the device to induce thermal transfer medium flow and the variable geometry heatsink. Thus, the entire system may operate in a phased cyclic or dynamic manner, with asynchronous maxima and minima of the various functions.

In practice, a heatsink may be provided for a microprocessor having multiple cores. Under low load, the device to induce thermal transfer medium flow may be off, or at a low flow rate. The heatsink in this case optimally has the greatest spread for radiative and passive convective cooling. In case of a higher load, the processor itself may have the option of distributing the load over multiple cores, and spatially spreading the heat dissipation, or concentrating the load in a single core which may get hot. Since temperature differentials increase heat flow, the concentrated heat source may selectively transfer heat to sub-portion of the heatsink, and thus that portion may be able to efficiently shed the heat under the passive or low energy cost state. As the load further increases, the processor as a whole typically becomes thermally limited, and as a result, the entire die or processor complex is treated as a unitary source, spreading heat to all elements of the heatsink. Initially, the temperature is low, and the system would seek to operate in the most efficient state of the device to induce thermal transfer medium flow. This may include laminar flow over the heat dissipating elements of the heatsink. In the next regime, the heat increases, and as a result, the device to induce thermal transfer medium flow must increase its flow rate. At this point, a compromise may be made, between minimum energy cost (and thus a minimization of the energy to drive the device to induce thermal transfer medium flow), and effective heat dissipation. In this regime, the heatsink may be configured to induce turbulence in the medium flow around it. This, in turn, increases the resistance to flow, but reduces the boundary layer effect. Advantageously, in this regime, a fractal physical relationship of element of the heatsink may act to reduce peak acoustic emission with respect to frequency. Likewise, by avoiding sharp acoustic resonances, there may be a more effective transfer of heat with lower losses as acoustic energy. Further, the interaction of the elements of the heatsink may be further optimized to achieve higher efficiency. Finally, at maximum heat load, presumably at the limit of the heatsink, the system enters a maximum heat dissipation mode. For example, this mode is one traditionally analyzed as the maximum capacity of the heatsink and device to induce thermal transfer medium flow system, and as such would typically assume or nearly assume a traditional optimized geometry. However, both due to the fact that the system may include fractal geometry elements for other regimes of operation, and because these may be exploited to gain efficiencies over traditional symmetric and regular geometries, the maximum heart dissipation configuration may be somewhat different than a parallel plate heatsink, for example. Note that not all regions of the heatsink need to operate within the same regime at the same time, and even under a steady state heat load, may vary cyclically, randomly or chaotically (over a relevant timescale). In this case, the term "chaotically" is intended to assume its technical meaning under chaos and fractal theory, and not adopt a lay interpretation. On the other hand, "randomly" is intended to encompass true randomness, pseudorandom variations, and deterministic changes that over the relevant timescale have statistical characteristics that model randomness within an acceptable margin of error, the acceptability relating to achieving a suitable regime of operation. For example, because some attributes of turbulent flow are random, even though they are more technically chaotic, the random features may be used to advantage. For example, the device to induce thermal transfer medium flow may be subject to a tinsel type flow disruptor, which in some regimes appears to be a random variation in air flow speed, direction, vortex, etc. While this may increase noise, it also can create persistent disruptions in boundary layers, even on smooth and regular heatsink elements. That is, either the heatsink geometry and the device to induce thermal transfer medium flow, or both, may have fractal or chaotic tendencies.

According to one embodiment, the geometry involves branching elements, to increase surface area of the elements. An actuator may be used to alter angles or even to open and close branches. For example, a heatsink formed of a shape memory alloy (SMA) (such as Nitinol), may be produced by an additive manufacturing process, e.g., a 3D printer or 2.5D printer. Such a device may be thermally processed to have characteristic shape changes at temperature transitions, and indeed, the composition of the alloy may be controlled during fabrication to produce a variety of transition temperatures. Therefore, a 3D heatsink may be provided which inherently changes shape through a series of transitions as the temperature is increased and decreased. In this embodiment, the changes tend to be monotonic with increasing temperature, though by engineering the angles and physical configuration, the actual physical shape and heat dissipation properties may assume a non-monotonic function. Note that in this embodiment, it is generally preferred that only the branch points are formed of SMA, and the bulk be formed of a high thermal conductivity material, such as copper and/or silver, or to a lesser extent, aluminum.

According to another embodiment, actuators, which may be SMA, solenoids, or otherwise, are controlled to change the position of repositionable elements. In this case, independent control can be exercised which is not dependent on temperature, but typically, the number of controlled elements is more constrained due to manufacturing and control feasibility issues. The actuators may alter a spacing, angle, position, or engagement of heat sink elements. When a set of regularly spaced and sized elements are controlled according to a constant or spectrally-defined distribution, this can be controlled to operate within highly predictable regimes. On the other hand, if the elements are not regularly sized and spaced, or are controlled in irregular manner, the resulting fluid dynamics will likely require a statistical flow (e.g., Monte Carlo) analysis, rather than a simplifying presumption of static function. This will especially be the case if the thermal time-constants of the heat flow from the heat source, to the heatsink, and then to the heat transfer fluid, are near or within the range of time-constants of the turbulence or chaotically varying flows of the heat transfer fluid. Typically, the thermal heat transfer time-constants are longer than the turbulent or chaotic variation time-constants, and therefore this meeting this presumption requires either generating low frequency turbulent or chaotic variations of the heat transfer fluid medium, or making the heatsink (and perhaps other elements) with short time-constants, such as using short/thin/small elements, using phonon transport phenomena, or other means.

In another embodiment, the time-constant(s) of the thermal transfer medium flow is much shorter than the relevant thermal time-constants of the heat source and heatsink, and the purpose of the turbulent or chaotic disruption is to alter the convective heat transfer characteristics of the heatsink, such as reducing the boundary layers or making them dynamically changing over time and space.

Another aspect of the technology involves planar heatsinks, such as used in antenna designs. In this case, the present technology may have corresponding effect to that discussed above, especially where a device to induce thermal transfer medium flow is provided to cool a generally planar heatsink system. It is noted that any heatsink in actuality must be considered in three dimensions, and the fact that it may have expanses of a thin uniform thickness layer does not defeat use of three-dimensional analysis to understand its functioning and optimization. In the case of a printed circuit board-type heatsink, a variable geometry is typically infeasible. Similarly, there a planar heatsink structure serves a secondary purpose, such as an antenna, the physical configuration is constrained by this other purpose. However, the device to induce thermal transfer medium flow is typically not so constrained, and therefore provides a controllable variable. Further, in many cases, the requirement for "thinness" of a 2D heatsink does not preclude texturing on an exposed surface, which itself may have a fractal variation.

In some cases, a variable geometry may be achieved by altering flow characteristics of thermal transfer medium flow, and for example, a deflector may be controlled to change a direction of impingement. Advantageously, a surface of a heatsink can have anisotropic features, which respond differently to different flow direction. Thus, the efficiency of the fan can be optimized other than by fan speed alone, to provide another control variable. This may have particular importance where the fan itself is highly constrained, and cannot simply be made oversized, or where energy efficiency is an overriding concern.

The technology is not limited to cooling gas fluids, and may encompass liquids. Typically, cooling liquids are recycled, and therefore operate within a physically closed system. Use of fractal branching fluid networks is known, but various principles discussed above, such as variable geometry, variations in flow rate over different regimes of operation, different directions of flow over surfaces, and intentional induction of chaotic flow patterns may be adopted top advantage.

Many fractal designs are characterized by concave regions or cavities. See, for example, FIGS. 2 and 3. While sets of concavities may be useful in improving aerodynamics and fluid dynamics to increase turbulence, if they are disposed in a regular array, they will likely produce an acoustic resonance, and may have peaks in a fluid impedance function. On the other hand, the multiscale nature of a fractal geometric design will allow the system to benefit from the concavities, while avoiding a narrowly tuned system.

The present technology proposes, according to one embodiment, a fractal-shaped heatsink for the purpose of dissipating heat. Benefits of a fractal heatsink, over a traditional heatsink having a Euclidian geometry may include: (1) the fractal heatsink has a greater surface area, allowing for more exposure of the hot device to the surrounding air or liquid and faster dissipation of heat; and (2) due to the plethora of concave structures or cavities in fractal structures, the fractal heatsink is better able to take advantage of turbulent flow mechanics than a traditional heatsink, resulting in heat entering and exiting the heatsink more quickly (3) acoustic properties, especially in forced convection systems.

The technology provides, according to various embodiments, a heatsink to cool an object through conduction (diffusion), convection and radiation. See, en.wikipedia.org/wiki/Heat_transfer.

With respect to conduction, the present technology observes that when heat energy is conducted by phonon transport, wave phenomena are pertinent, and thus a fractal branching network can advantageously be used to reduce reflections at discontinuities and decrease complex impedance. Further, a fractal geometry may assist in optimizing the cross-section area and surface area (for radiation and convective transfer) under given constraints.

With respect to convection, a fractal geometry may provide acoustic benefits, by distributing acoustic energy across a wide band, and thus ensuring "whiteness" of a noise spectrum and absence of sharp resonances. Further, a fractal geometry may provide high or maximum surface area, and produce turbulent cooling medium flows to reduce boundary later effects. Depending on the constraints imposed, a fractal geometry may also provide chimneys or defined flow paths through a network of elements, and thus control an impedance of coolant flow, though generally, a fractal branching network will produce higher flow impedance than corresponding smooth regular surfaces. In some cases, a textured surface or configuration (as might be achieved by a fractal geometry) can actually increase laminar flow some distance away from the surface, by creating a controlled disturbed intermediate layer.

With respect to radiation, a fractal geometry can avoid parallel surfaces which can limit radiative dissipation. For example, a parallel plate heatsink will radiatively transfer heat between the plates, and thus limit the effectiveness of radiation from the bulk of the surfaces as an effective dissipation mechanism. On the other hand, irregular angles and surface branches may help to avoid reabsorption of thermal radiation by the elements of the heatsink, and thus enhance radiative dissipation.

For the smallest heatsink elements, on the order of 10-100 nm, the focus of the heat transfer may be on radiation rather than convection. Electron emission and ionization may also be relevant. Larger heatsink elements, approximately >1 mm in size, will generally rely on convection as the primary form of heat transfer. In a fractal geometry system, elements spanning these regimes may be provided in a single system.

In one embodiment, the heatsink comprises a heat exchange device with a plurality of heat exchange elements having a fractal variation therebetween. A heat transfer fluid, such as air, water, or another gas or liquid, is induced to flow through the heat exchange device. The heat transfer fluid has turbulent portions. The fractal variation in the plurality of heat exchange elements substantially reduces the narrow band acoustic resonance resulting from fluid flow around the heatsink elements as compared to a heatsink having a linear or Euclidian geometric variation between the plurality heat exchange elements. The turbulent flow also disturbs the stagnant surface boundary layer, leading to more efficient heat transfer, but generally reduced flow rates for the same motive force. Note that, since turbulence dissipates energy, under some conditions, the heat added to the system by inducing the heat transfer fluid flow can be a significant factor.

When a heat transfer fluid (air, gas or liquid) is induced to flow over a surface, there may be turbulence in the fluid. The fractal shape of the heatsink would generally provide a range of physical size parameters, and thus for any given flow rate, would typically induce turbulent flow over some portion of a fractal geometry array. Notably, because the flow for a given heatsink may vary over a range of speeds, and the temperature and viscosity of the fluid varies over a range of conditions, a fractal geometry facilitates optimization over a range of parameters.

In fluid dynamics, turbulence or turbulent flow is a flow regime characterized by chaotic property changes. This includes low momentum diffusion, high momentum convection, and rapid variation of pressure and flow velocity in space and time. See, en.wikipedia.org/wiki/Turbulence; www.scholarpedia.org/article/Turbulence. Flow in which the kinetic energy dies out due to the action of fluid molecular viscosity is called laminar flow. While there is no theorem relating the non-dimensional Reynolds number (Re) to turbulence, flows at Reynolds numbers larger than 5000 are typically (but not necessarily) turbulent, while those at low Reynolds numbers usually remain laminar. In Poiseuille flow, for example, turbulence can first be sustained if the Reynolds number is larger than a critical value of about 2040; moreover, the turbulence is generally interspersed with laminar flow until a larger Reynolds number of about 4000. In turbulent flow, unsteady vortices appear on many scales and interact with each other. Drag due to boundary layer skin friction increases. The structure and location of boundary layer separation often changes, sometimes resulting in a reduction of overall drag. Although laminar-turbulent transition is not governed by Reynolds number, the same transition occurs if the size of the object is gradually increased, or the viscosity of the fluid is decreased, or if the density of the fluid is increased. Turbulence is characterized by the following features: Irregularity: Turbulent flows are always highly irregular. For this reason, turbulence problems are normally treated statistically rather than deterministically. Turbulent flow is chaotic. However, not all chaotic flows are turbulent. Diffusivity: The readily available supply of energy in turbulent flows tends to accelerate the homogenization (mixing) of fluid mixtures. The characteristic which is responsible for the enhanced mixing and increased rates of mass, momentum and energy transports in a flow is called "diffusivity". Rotationality: Turbulent flows have non-zero vorticity and are characterized by a strong three-dimensional vortex generation mechanism known as vortex stretching. In fluid dynamics, they are essentially vortices subjected to stretching associated with a corresponding increase of the component of vorticity in the stretching direction-due to the conservation of angular momentum. In general, the stretching mechanism implies thinning of the vortices in the direction perpendicular to the stretching direction due to volume conservation of fluid elements. As a result, the radial length scale of the vortices decreases and the larger flow structures break down into smaller structures. The process continues until the small-scale structures are small enough that their kinetic energy can be transformed by the fluid's molecular viscosity into heat, i.e., atomic scale random motion. This is why turbulence is always rotational and three dimensional. Dissipation: To sustain turbulent flow, a persistent source of energy supply is required because turbulence dissipates rapidly as the kinetic energy is converted into internal energy by viscous shear stress. It therefore becomes apparent that, because turbulent flow is chaotic, an optimization of heatsink geometry responsive to chaotic features can achieve efficiencies over a range of operating regimes, and at particular operating regimes.

Turbulence causes the formation of eddies of many different length scales. Most of the kinetic energy of the turbulent motion is contained in the large-scale structures. The energy "cascades" from these large-scale structures to smaller scale structures by an inertial and essentially inviscid mechanism. This process continues, creating smaller and smaller structures which produces a hierarchy of eddies. Eventually this process creates structures that are small enough that molecular diffusion becomes important and viscous dissipation of energy finally takes place. The scale at which this happens is the Kolmogorov length scale.

Via this energy cascade, turbulent flow can be realized as a superposition of a spectrum of flow velocity fluctuations and eddies upon a mean flow. The eddies are loosely defined as coherent patterns of flow velocity, vorticity and pressure. Turbulent flows may be viewed as made of an entire hierarchy of eddies over a wide range of length scales and the hierarchy can be described by the energy spectrum that measures the energy in flow velocity fluctuations for each length scale (wavenumber). The scales in the energy cascade are generally uncontrollable and highly non-symmetric. Nevertheless, based on these length scales these eddies can be divided into three categories.

Integral length scales: Largest scales in the energy spectrum. These eddies obtain energy from the mean flow and also from each other. Thus, these are the energy production eddies which contain most of the energy. They have the large flow velocity fluctuation and are low in frequency. Integral scales are highly anisotropic. The maximum length of these scales is constrained by the characteristic length of the apparatus.

Kolmogorov length scales: Smallest scales in the spectrum that form the viscous sub-layer range. In this range, the energy input from nonlinear interactions and the energy drain from viscous dissipation are in exact balance. The small scales have high frequency, causing turbulence to be locally isotropic and homogeneous.

Taylor microscales: The intermediate scales between the largest and the smallest scales which make the inertial subrange. Taylor microscales are not dissipative scale but pass down the energy from the largest to the smallest. Taylor microscales play a dominant role in energy and momentum transfer in the wavenumber space.

The Russian mathematician Andrey Kolmogorov proposed the first statistical theory of turbulence, based on the aforementioned notion of the energy cascade (an idea originally introduced by Richardson) and the concept of self-similarity (e.g., fractal relationships). For very high Reynolds numbers, the small-scale turbulent motions are statistically isotropic (i.e. no preferential spatial direction could be discerned). In general, the large scales of a flow are not isotropic, since they are determined by the particular geometrical features of the boundaries (the size characterizing the large scales will be denoted as L). Thus, Kolmogorov introduced a second hypothesis: for very high Reynolds numbers the statistics of small scales are universally and uniquely determined by the kinematic viscosity (v) and the rate of energy dissipation (s). With only these two parameters, the unique length (Kolmogorov length scale) that can be formed by dimensional analysis is $$\eta = \left(\frac{v^3}{\varepsilon}\right)^{1/4}.$$

A turbulent flow is characterized by a hierarchy of scales through which the energy cascade takes place. Dissipation of kinetic energy takes place at scales of the order of Kolmogorov length η, while the input of energy into the cascade comes from the decay of the large scales, of order L. These two scales at the extremes of the cascade can differ by several orders of magnitude at high Reynolds numbers. In between there is a range of scales (each one with its own characteristic length r) that has formed at the expense of the energy of the large ones. These scales are very large compared with the Kolmogorov length, but still very small compared with the large scale of the flow (i.e., η<<r<<L). Since eddies in this range are much larger than the dissipative eddies that exist at Kolmogorov scales, kinetic energy is essentially not dissipated in this range, and it is merely transferred to smaller scales until viscous effects become important as the order of the Kolmogorov scale is approached. Within this range inertial effects are still much larger than viscous effects, and it is possible to assume that viscosity does not play a role in their internal dynamics (for this reason this range is called "inertial range"). Kolmogorov theory is at present under revision. The theory implicitly assumes that the turbulence is statistically self-similar at different scales. This essentially means that the statistics are scale-invariant in the inertial range. However, there is evidence that turbulent flows deviate from this idealized behavior. See, Davidson, P. A. (2004). Turbulence: An Introduction for Scientists and Engineers. Oxford University Press. ISBN 978-0-19-852949-1; scholarpedia.org; G. Falkovich, Scholarpedia, "Cascade and scaling"; Jin, Y.; Uth, M.-F.; Kuznetsov, A. V.; Herwig, H. (2 Feb. 2015). "Numerical investigation of the possibility of macroscopic turbulence in porous media: a direct numerical simulation study". Journal of Fluid Mechanics 766: 76-103. Bibcode:2015JFM . . . 766 . . . 76J. doi:10.1017/jfm.2015.9; G Falkovich and K. R. Sreenivasan. Lessons from hydrodynamic turbulence, Physics Today, vol. 59, no. 4, pages 43-49 (April 2006); J. Cardy, G. Falkovich and K. Gawedzki (2008) Non-equilibrium statistical mechanics and turbulence. Cambridge University Press; P. A. Durbin and B. A. Pettersson Reif. Statistical Theory and Modeling for Turbulent Flows. Johns Wiley & Sons, 2001; T. Bohr, M. H. Jensen, G. Paladin and A. Vulpiani. Dynamical Systems Approach to Turbulence, Cambridge University Press, 1998; J. M. McDonough (2007). Introductory Lectures on Turbulence—Physics, Mathematics, and Modeling; Kolmogorov, Andrey Nikolaevich (1941). "The local structure of turbulence in incompressible viscous fluid for very large Reynolds numbers". Proceedings of the USSR Academy of Sciences (in Russian) 30: 299-303., translated into English by V. Levin: Kolmogorov, Andrey Nikolaevich (Jul. 8, 1991). Proceedings of the Royal Society A 434 (1991): 9-13. Bibcode: 1991RSPSA.434 . . . 9K. doi:10.1098/rspa.1991.0075; Kolmogorov, Andrey Nikolaevich (1941). "Dissipation of Energy in the Locally Isotropic Turbulence". Proceedings of the USSR Academy of Sciences (in Russian) 32: 16-18., translated into English by Kolmogorov, Andrey Nikolaevich (Jul. 8, 1991). Proceedings of the Royal Society A 434 (1980): 15-17. Bibcode:1991RSPSA.434 . . . 15K. doi: 10.1098/rspa.1991.0076; G. K. Batchelor, The theory of homogeneous turbulence. Cambridge University Press, 1953.

Therefore, the efficiency of heat transfer may be increased as compared to a heat exchange device having a linear or Euclidian geometric variation between several heat exchange elements, at least over certain regimes of operation.

The heat exchange device may include a highly conductive substance whose heat conductivity exceeds 850 W/(m-K). Examples of such superconductors include graphene, diamond, and diamond-like coatings. Alternatively, the heat exchange device may include carbon nanotubes. At such high thermal conductivities, phonon heat transport may be at play.

A heatsink according to the present technology may be manufactured, for example, by additive manufacturing (e.g., 3D print), casting, or subtractive manufacturing (machining). Further, a cast design may be produced by a lost wax or lost foam design from a 3D printed form or template. Thus, in practice, a design is generated on a computer-aided design (CAD) system, which may, for example, employ algorithms to optimize the shape according to various criteria, such as size, weight, heat load, air flow, other convective heat transfer parameters, infrared radiation recapture, and other criteria. The design is then converted, by a computer assisted manufacturing (CAM) system, such as an additive manufacturing "3D" printer or 2.5D printer (layers), into a form. The form, if produced using a metal sintering or ceramic process, may itself be a heatsink, though more typically the form is a polymer, which can then be used to create a mold. The mold, in turn, can be used to create multiple templates, which can be used in a casting process. As a result, relatively complex mechanical designs can be replicated in volume. In some cases, when the heatsink is molded, the metal may be heterogeneous, resulting in a range of properties over different regions of the mold.

The design, in some cases, will result in a fractal shape, which may have branches or multiple levels of branches, with multiple characteristic scales, which may have some symmetries or repetitions, or be absent symmetries and repetitions. A design which lacks symmetries or repetitions, and is self-similar at various scales, is considered "fractal". A design which adopts some of these characteristics, or functionally emulates some of these characteristics, is considered "fractal-like". A design representing an array of uniform, repeating elements of the same scale is generally considered non-fractal. In some cases, a branching array having multi-way symmetry may in some cases be considered fractal-like. A multiscale fractal (i.e., with asymmetries within each scale range) with outwardly tapering branches will tend to carry and dissipate heat further from the heat source than a symmetric design, since by nature the larger cross section branches will carry hear further than their smaller, higher surface area per mass cousin branches, and the asymmetry will tend to assure that some branches indeed have larger cross sections; however, this is not the only effect to be obtained. Since the fractal is typically generated by an iterative function system (IFS) responsive to its local environment, the fractal may be optimized by a steering function to steer heat flow to areas with highest convective heat loss, while avoiding heat flow toward branches which do not efficiently shed heat. Similarly, in a vacuum heatsink emitter, the heat loss tends to be radiative, and the optimization can address maximization of net radiative heat loss within the constrained environment.

The present technology, in an ambient atmosphere, may be subject to dust or fiber buildup due to particulates in the flow of cooling air. Filtering of the air to completely remove such particulates is inefficient, since the required filter would require significant energy to operate, and that energy both increases the heat load of the aggregate system to be shed, increases power consumption, and presents a compromise with respect to use of the same energy of more globally, system manufacturing and operating cost, that could be reallocated to a net higher efficiency, such as a heatsink with less susceptibility to dust or fiber deposition and a higher cooling air flow rate. However, the dust deposition may be modelled, and included within a design equation, e.g., an iterative function system, for generating an optimal heatsink which may have resulting fractal or fractal-like features.

As discussed herein, there are a number of strategies available to remove dust that has accumulated on the heatsink surfaces, and the system, including the heat source, heatsink, dust, air flow (e.g., fan) system, as well as the dust abatement system, may be together modelled. This model will typically have a time variance, and the operating point of the aggregate system may change over time, especially if the dust abatement system operates discontinuously. In such a system, the heat flow vectors within the heatsink may change over time in relative magnitude to each other, and the design system therefore typically models the system over its range of operation. In one embodiment, a fan controller (typically the only controllable part of the heatsink) may be controlled based not simply on a temperature and/or temperature rise rate of the heatsink, but also a convective and fluid dynamic model of the system, including measured or estimate dust, fiber, debris, etc. The fan controller may in some cases speed up the fan in an attempt to blow off dust, or create turbulence to disrupt dust, or to create velocity/pressure gradient dependent flow patterns around the heatsink to achieve efficient and/or optimal heat transfer. Maintaining low operating temperatures of the heat source and energy cost are not necessarily the only critical variables, and therefore in some cases, the fan will run at a fan speed which is energy-inefficient with respect to the lowest speed (lowest energy cost) that will achieve the desired cooling of the heat source.

The controller may also implement an acoustic/sonic model, especially where turbulent air flow is intentionally created, and the model may be used to ensure that acoustic emissions are not objectionable or outside of a predetermined or adaptive limit. See, U.S. Pat. No. 6,850,252. Likewise, in some cases, the sounds emitted by the heatsink system may be intentionally timed to external cues.

Various variations on this heatsink will be apparent to skilled persons in the art. For example, the heatsink could include a heat transfer surface that is connected to the heat exchange device and is designed to accept a solid to be cooled. Alternatively, there could be a connector that is designed to connect with a solid to be cooled in at least one point. In another embodiment, there are at least three connectors serving to keep the solid and the heatsink in a fixed position relative to one another. Various connectors will be apparent to persons skilled in the art. For example, the connector could be a point connector, a bus, a wire, a planar connector or a three-dimensional connector. In another embodiment, the heatsink has an aperture or void in the center thereof designed to accept a solid to be cooled. The heatsink may also be integral to the heat source, or attached by other means.

This heatsink is typically intended to be used to cool objects, and may be part of a passive or active system. Modern three-dimensional laser and liquid printers can create objects such as the heatsinks described herein with a resolution of features on the order of about 16 μm, making it feasible for those of skilled in the art to use such fabrication technologies to produce objects with a size below 25 cm. Alternatively, larger heatsinks, such as car radiators, can be manufactured in a traditional manner, designed with an architecture of elements having a fractal configuration. For example, a liquid-to-gas heat exchanger (radiator) may be provided in which segments of fluid flow conduit have a fractal relationship over three levels of recursion, i.e., paths with an average of at least two branches. Other fractal design concepts may be applied concurrently, as may be appropriate.

Yet another embodiment of the invention involves a method of cooling a solid by connecting the solid with a heatsink. The heatsink comprises a heat exchange device having a plurality of heat exchange elements having a fractal variation therebetween. A heat transfer fluid having turbulent portions is induced to flow with respect to the plurality of heat exchange elements. The fractal variation in the plurality of heat exchange elements serves to substantially reduce narrow band resonance as compared to a corresponding heat exchange device having a linear or Euclidean geometric variation between a plurality of heat exchange elements.

A preferred embodiment provides a surface of a solid heatsink, e.g., an internal or external surface, having fluid thermodynamical properties adapted to generate an asymmetric pattern of vortices over the surface over a range of fluid flow rates. For example, the range may comprise a range of natural convective fluid flow rates arising from use of the heatsink to cool a heat-emissive object. The range may also comprise a range of flow rates arising from a forced convective flow (e.g., a fan) over the heatsink.

The heatsink may cool an unconstrained or uncontained fluid, generally over an external surface of a heatsink, or a constrained or contained fluid, generally within an internal surface of a heatsink.

It is therefore an object of the present invention to provide a heatsink system comprising: a base structure configured to interface with a heat source; a heat exchange device configured to receive heat from the base structure, and emit the received heat from a heat exchange surface, into an external surrounding heat exchange medium, the heat exchange surface being subject to accumulation of particles; and a particle dislodging device configured to mechanically disrupt an accumulation of particles on the plurality of heat exchange elements.

It is also an object of the present invention to provide a method of heat transfer, comprising: providing a base structure configured to interface with a heat source; receiving heat from the base structure with a heat exchange device configured to emit the received heat from a heat exchange surface, into an external surrounding heat exchange medium; and reducing an accumulation of particles on the heat exchange surface with at least one of a particle degrading device and a particle dislodging device.

It is a further object of the present invention to provide a heatsink comprising: a base structure configured to interface with a heat source; a heat exchange device configured to receive heat from the base structure, and emit the received heat from a heat exchange surface, into an external surrounding heat exchange medium, the heat exchange surface being subject to accumulation of particles; and a particle degrading device configured to chemically degrade an accumulation of particles on the plurality of heat exchange elements.

It is a still further object of the present invention to provide a system comprising: a fractal heat exchange device comprising: a base structure configured to interface with a heat source; a plurality of heat exchange elements having approximately fractal geometry, the plurality of heat exchange elements attached to the base structure, configured to receive heat from the base structure and emit the heat into an external surrounding through radiation and convection in heat exchange medium; and a pyrolizer to pyrolize dust particles.

Another object of the present invention provides a method of heat transfer comprising providing a base structure configured to interface with a first heat source; receiving heat from the base structure with a fractal heat exchange device configured to emit the received heat from a plurality of heat exchange elements, into an external surrounding heat exchange medium; providing a second heat source distant from the first heat source, the second heat source used to heat dust particles in a vicinity of the first heat source; pyrolizing dust particles using heat from the second heat source; and dissipating the heat used to pyrolize dust particles.

A still further object of the present invention provides a fractal heat exchange device comprising: a base structure configured to interface with a heat source; a plurality of heat exchange elements having approximately fractal geometry, the a plurality of heat exchange elements attached to the base structure and configured to receive heat from the base structure and emit the heat into an external surrounding through radiation and convection in heat exchange medium; and a vibrator to vibrate at least a subset of the plurality of heat exchange elements to dislodge dust particles from heat exchange elements, wherein the base structure comprises vibration isolator to prevent vibrations from damaging the heat source. The vibrator may be one of a piezoelectric transducer and electromagnetic transducer. The vibration isolator may be one of a plastic thermal transfer medium, a non-shear transmissive solid and an active vibration suppression interface. The non-shear transmissive solid may be a copper wire bundle. The base structure may further comprise an anisotropic vibration transmissive mount to isolate vibrations from the heat source. The anisotropic vibration transmissive mount may comprise a piston in a cylinder.

Another object of the present invention provides a method of heat exchange comprising: providing a base structure configured to interface with a heat source; receiving heat from the base structure with a heat exchange device configured to emit the received heat from a plurality of heat exchange elements, into an external surrounding heat exchange medium; providing a source of vibration to vibrate the plurality of heat exchange elements; vibrating the plurality of heat exchange elements to dislodge dust particles therefrom; and dissipating vibrations before they reach the heat source.

It is also an object of the present invention to provide a method heat exchange comprising: providing a base structure configured to interface with a heat source; receiving heat from the base structure with a heat exchange device configured to emit the received heat from a plurality of heat exchange elements, into an external surrounding heat exchange medium; providing a time-varying flow of the heat exchange medium over the plurality of heat exchange elements; and dislodging dust particles accumulated on the plurality of heat exchange elements.

It is a still further object of the present invention to provide a fractal heat exchange device comprising: a base structure configured to interface with a heat source; a plurality of heat exchange elements having approximately fractal geometry, the a plurality of heat exchange elements attached to the base structure and being configured to receive heat from the base structure and emit the heat into an external surrounding through radiation and convection in heat exchange medium; an electrostatic charge generator; and an electrostatic discharge device, wherein the electrostatic charge generator is configured to induce static electricity on a surface of at least a portion of the plurality of heat exchange elements to repel dust particles from accumulating thereon.

It is another object of the present invention to provide a method of heat exchange comprising: providing a base structure configured to interface with a heat source; receiving heat from the base structure with a heat exchange device configured to emit the received heat from a plurality of heat exchange elements, into an external surrounding heat exchange medium; inducing a first static electric charge having a polarity on the surface of at least a portion of the a plurality of heat exchange elements; and inducing a second static electric charge on dust particles, the second static electric charge having the same polarity as the polarity of the first static electric charge.

Another object of the present invention is to provide a system comprising: a fractal heat exchange device, the heat exchange device further comprising: a base structure configured to interface with a heat source; a plurality of heat exchange elements having approximately fractal geometry, the plurality of heat exchange elements being attached to the base structure and being configured to receive heat from the base structure and emit the heat into an external surrounding heat transfer medium by radiation and convection; and at least one of a fan and a compressor, configured to induce a time-varying flow of the heat transfer medium over the plurality of heat exchange elements, wherein at least portions of the time varying flow of the heat transfer medium over the plurality of heat exchange elements are turbulent, having a turbulence pattern that changes over time.

The particle-dislodging device may comprise a vibrator configured to vibrate a plurality of heat exchange elements comprising the heat exchange surface. The particle-dislodging device may also comprise at least one of a piezoelectric transducer and an electromagnetic transducer. The particle-dislodging device may also comprise a rotating motor configured to induce a vibration in the plurality of heat exchange elements. The particle-dislodging device may also comprise a fan or pump configured to induce a time-varying flow of heat exchange media over the plurality of heat exchange elements. The time-varying flow of heat exchange media may comprise entrained particles or liquid, e.g., a gas-liquid mixture. The particle-dislodging device may further comprise an electrostatic charge generator. The particle-dislodging device may also comprise an electrostatic discharge device. The particle-dislodging device may comprise at least one shape memory alloy or a bimetal element. The particle dislodging system may comprise an electrical-vibration transducer and an oscillating signal generator, receiving a feedback signal from the feedback transducer, configured to excite the vibration transducer. The particle-dislodging device may comprise a fan or compressor, configured to induce a flow of a gaseous heat transfer medium over a plurality of heat exchange elements of the heat exchange surface. The particle dislodging device may comprise a fan or compressor, configured to induce a flow of a gaseous heat transfer medium over the heat exchange surface along at least one vector, having at least one control input, wherein the at least one vector is altered in dependence on the at least one control input.

The system may further comprise at least one a vibrational transducer, controlled to cancel vibrations at the base structure produced by the particle-dislodging device. A vibration damper may be provided, configured to damp vibrations at the base structure. A feedback transducer may be provided, configured to detect vibrations.

The heat exchange surface may comprise a plurality of heat exchange elements having resonances over a range of frequencies, and the particle-dislodging device comprises an electrical-vibration transducer and an oscillating signal generator, configured to generate vibrations over the range of frequencies, to resonate the plurality of heat exchange elements. The heat exchange surface may also comprise a plurality of heat exchange elements having characteristic dimensions over at least two orders of size scales. The heat exchange surface may comprise a plurality of heat exchange elements, and the particle-dislodging device may comprise an actuator configured to alter at least one spatial relationship of a first of the plurality of heat exchange elements with respect to a second of the plurality of heat exchange elements. The actuator may be a passively activated member responsive to temperature. The actuator may also be actively controlled by an automated electronic processor in dependence on a computational heat exchange model of the heatsink system.

The accumulation of particles on the heat exchange element may be reduced with a particle-degrading device. The particle-degrading device may comprise a pyrolizer, degrading the particles by pyrolysis. The particle-degrading device may also comprise a pump configured to cause a time varying flow of a liquid solvent entrained in a gas heat exchange medium on the heat exchange surface. The particle-degrading device may comprise a laser. The particle-degrading device may comprise an electrical discharge plasma emitter.

The accumulation of particles on the heat exchange surface may be reduced by vibration. The accumulation of particles on the heat exchange surface may be reduced with a piezoelectric transducer. The accumulation of particles on the heat exchange surface may be reduced with an electromagnetic transducer. The accumulation of particles on the heat exchange surface may be reduced with a rotating motor configured to induce a vibration in the plurality of heat exchange elements. The accumulation of particles on the heat exchange surface may be reduced with at least one active system, which induces a time-varying flow of heat exchange media over the heat exchange surface. The time-varying flow of heat exchange media may comprise entrained particles. The time-varying flow of heat exchange media may comprise a liquid mixed with a gas. The method may further comprise inducing a flow of a gaseous heat transfer medium comprising an entrained solvent over the plurality of heat exchange elements. The accumulation of particles on the heat exchange surface may be reduced by generating an electrostatic charge.

The accumulation of particles on the heat exchange surface may be reduced by use of an electrostatic discharge generator. The accumulation of particles on the heat exchange surface may be reduced by heating and cooling at least one shape memory alloy or bimetal element. The accumulation of particles on the heat exchange surface may be reduced by selectively activating a laser. The accumulation of particles on the heat exchange surface may be reduced by inducing transient thermal changes proximate to the heat exchange surface. The accumulation of particles on the heat exchange surface may be reduced by selectively generating vibrations with a vibrational transducer, controlled to cancel vibrations at the base structure. The accumulation of particles on the heat exchange surface may be reduced by inducing vibrations in a plurality of heat exchange elements of the heat exchange surface, and damping vibrations at the base structure. The accumulation of particles on the heat exchange surface may be reduced by inducing a flow of a gaseous heat transfer medium over the heat exchange elements along at least one vector, having at least one control input, wherein the at least one vector is altered in dependence on the at least one control input.

The method may further comprise detecting vibrations with a feedback transducer, and generating vibration with an electrical-vibration transducer in dependence on a signal received from the feedback transducer. The heat exchange surface comprises a plurality of heat exchange elements having resonances over a range of frequencies, the method further comprising generating vibrations over the range of frequencies, to resonate the plurality of heat exchange elements.

The heat exchange surface may comprise a plurality of heat exchange elements having characteristic dimensions over at least two orders of size scales. The plurality of heat exchange elements may have fractal-like features, or have fractal-like relationships with each other. The heat exchange surface may comprise a plurality of heat exchange elements, and the accumulation of particles on the heat exchange surface may be reduced by altering at least one spatial relationship of a first of the plurality of heat exchange elements with respect to a second of the plurality of heat exchange elements with an actuator. The actuator may be a passively activated member responsive to temperature. The actuator may be actively controlled by an automated electronic processor in dependence on a computational heat exchange model.

In this embodiment, the heatsink is based on a modified Koch Snowflake.

Figure 7A:
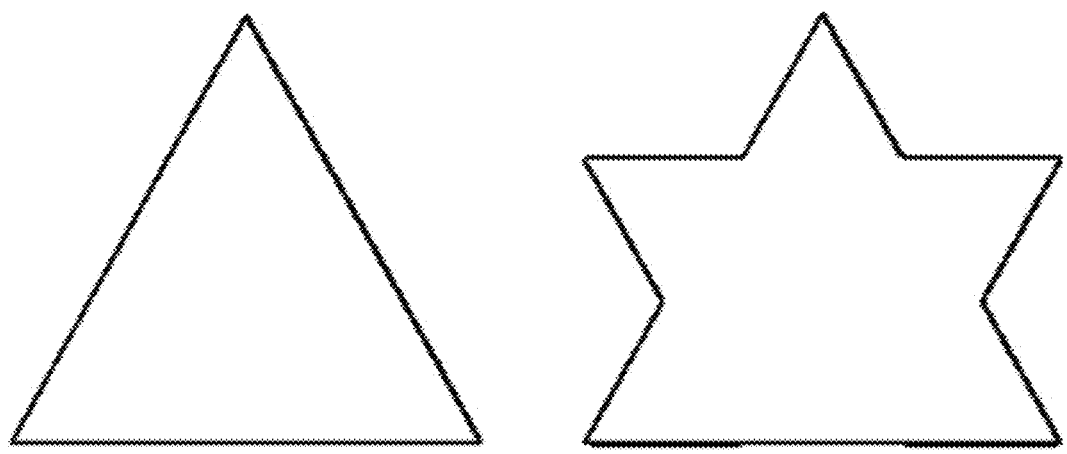
FIG. 7A illustrates a fractal heatsink that is an exemplary embodiment of the invention.
Figure 7A:
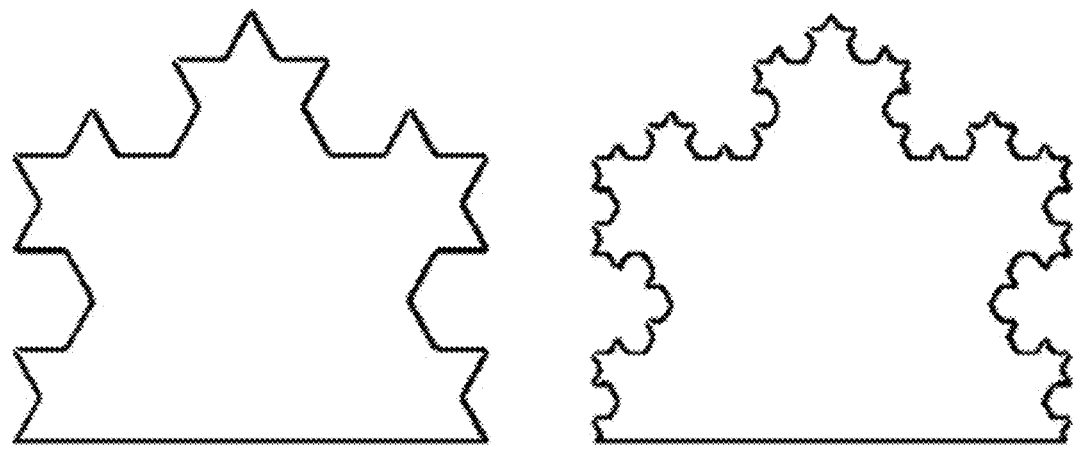
Figure 7B:
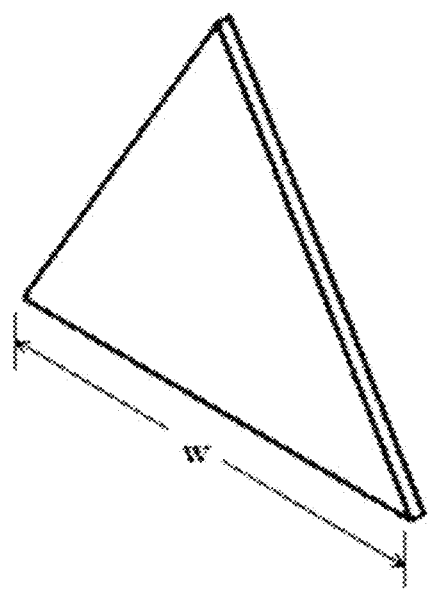

FIG. 7B illustrates the basis for generating the modified Snowflake.

Figure 8A:
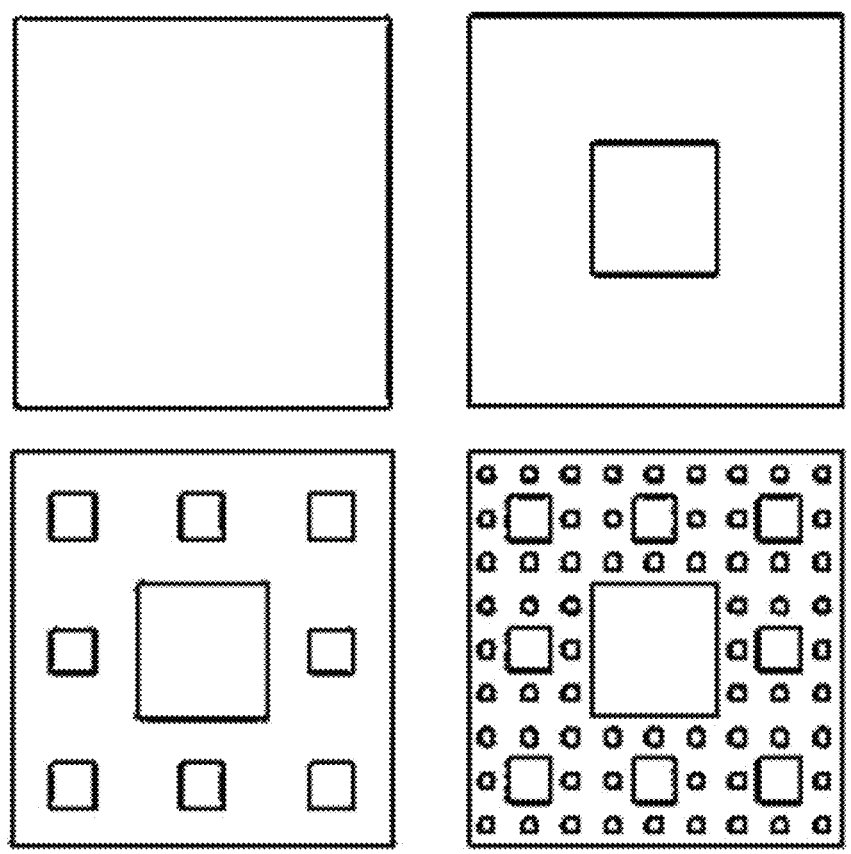

FIG. 8A illustrates a fractal heatsink that is an exemplary embodiment of the invention.

In this embodiment, the heatsink is based on a Sierpinski Carpet.

Figure 8B:
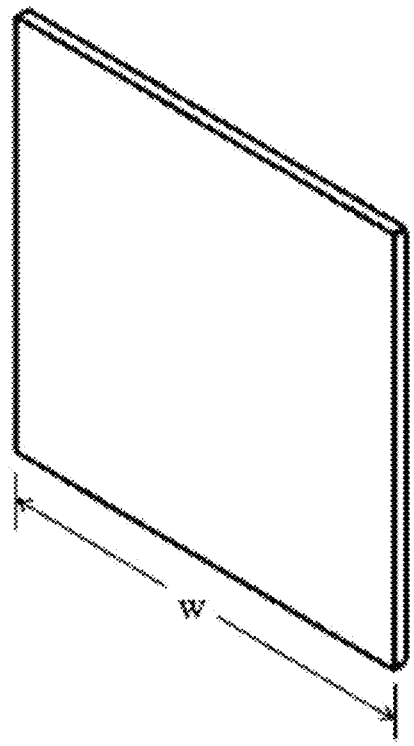

FIG. 8B illustrates the basis for generating the Sierpinski Carpet.

Figure 9:
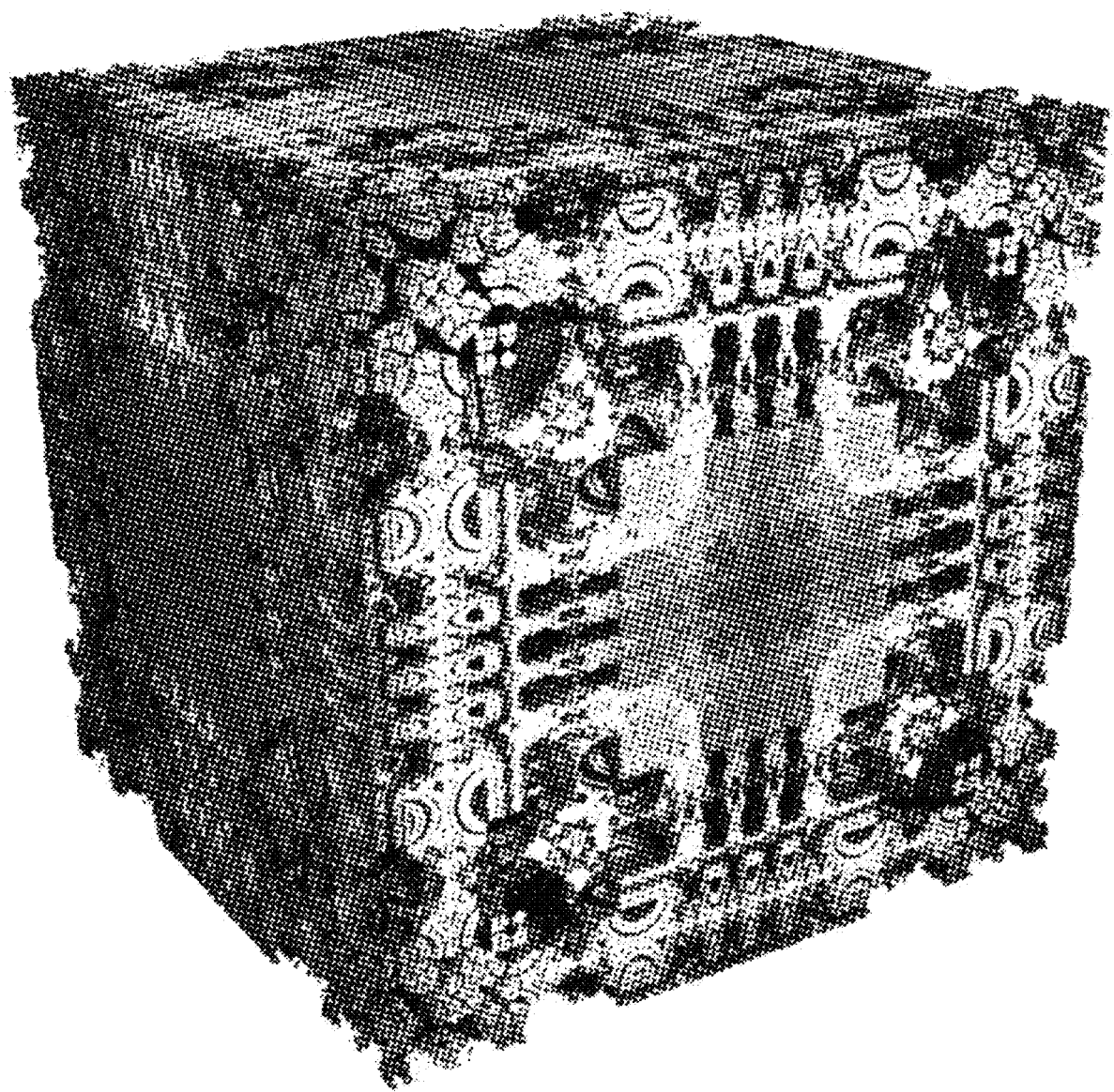

FIG. 9 illustrates a fractal heatsink that is an exemplary embodiment of the invention. In this embodiment, the heatsink is based on a Mandelbox.

Figure 10:
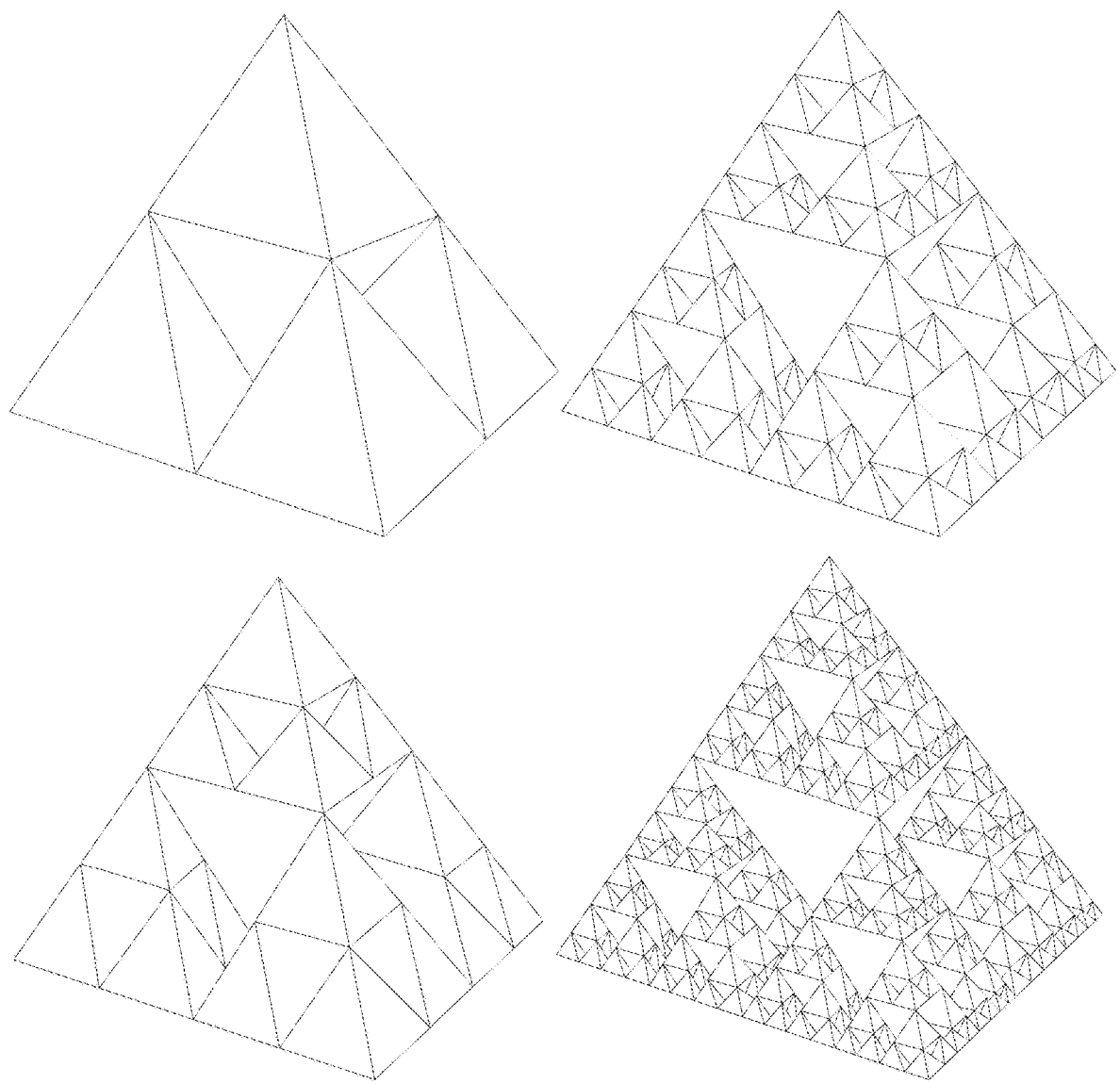

FIG. 10 illustrates a fractal heatsink that is an exemplary embodiment of the invention. In this embodiment, the heatsink is based on a Sierpinski tetrahedron.

Figure 11:
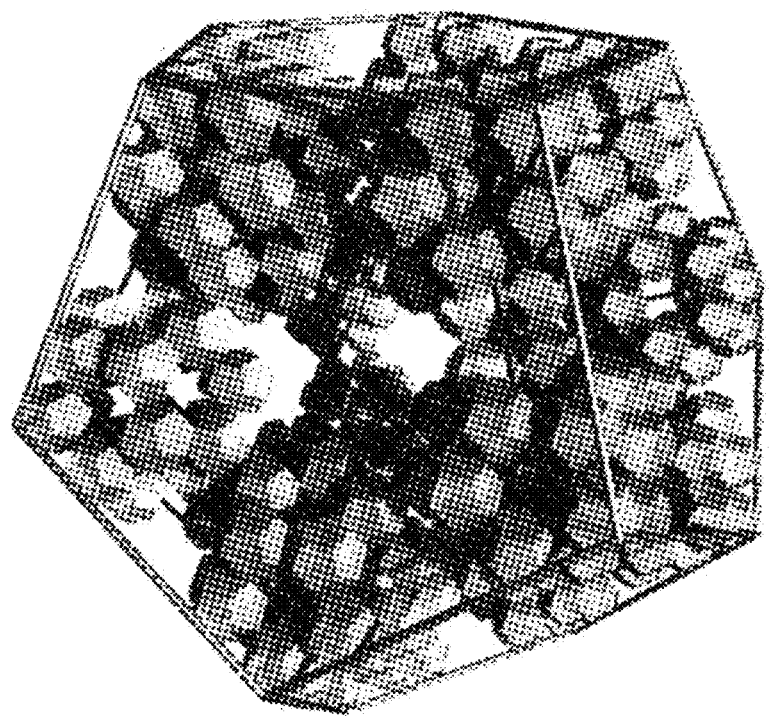

FIG. 11 illustrates a fractal heatsink that is an exemplary embodiment of the invention. In this embodiment, the heatsink is based on a Dodecaedron fractal.

Figure 12:
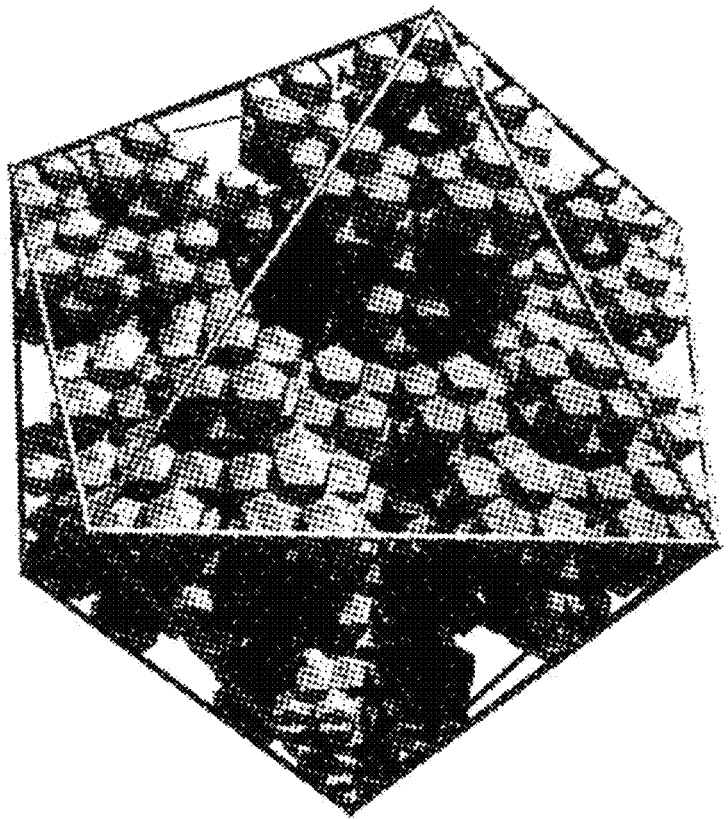

FIG. 12 illustrates a fractal heatsink that is an exemplary embodiment of the invention. In this embodiment, the heatsink is based on a Icosahedron flake.

Figure 13:
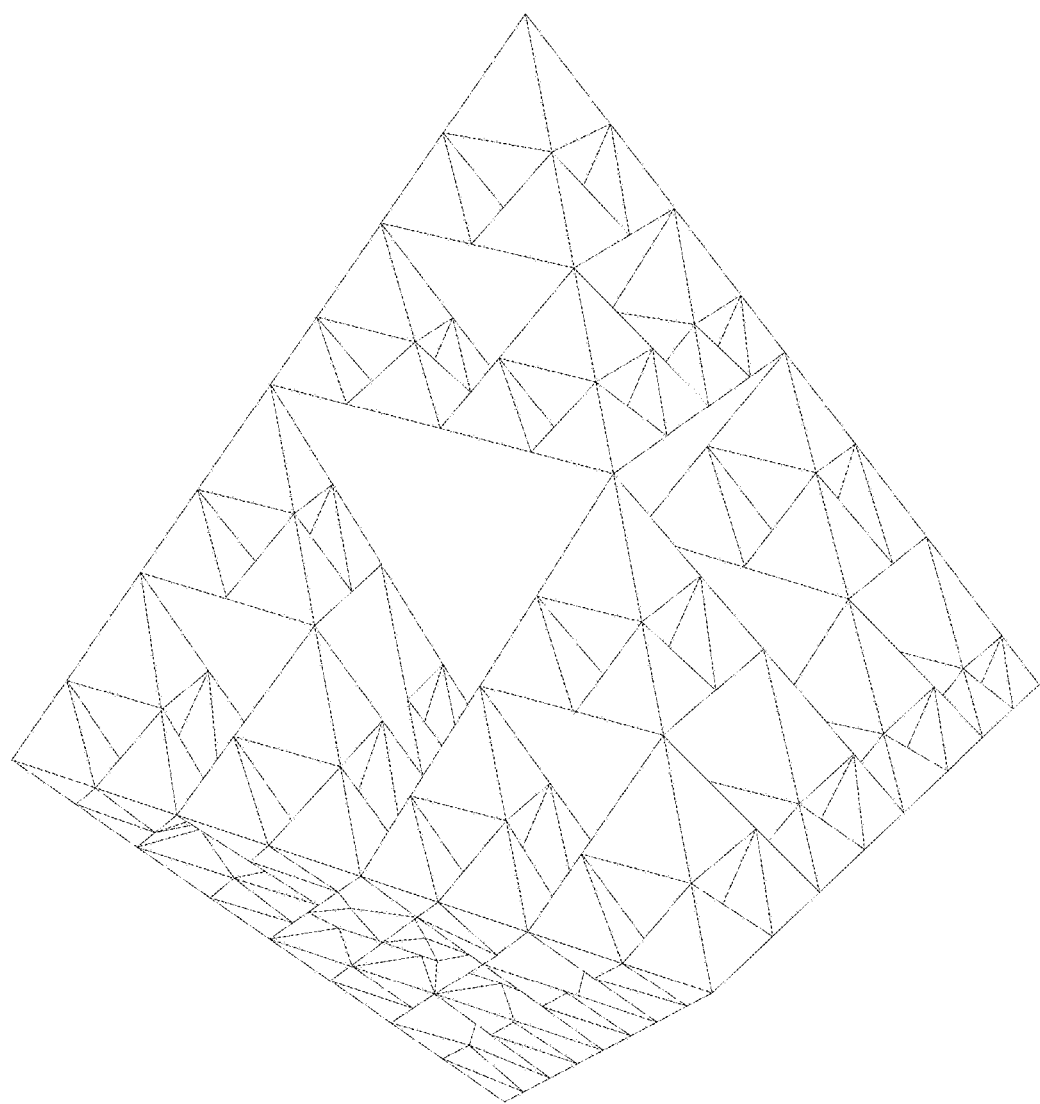

FIG. 13 illustrates a fractal heatsink that is an exemplary embodiment of the invention. In this embodiment, the heatsink is based on an Octahedron flake.

Figure 14:
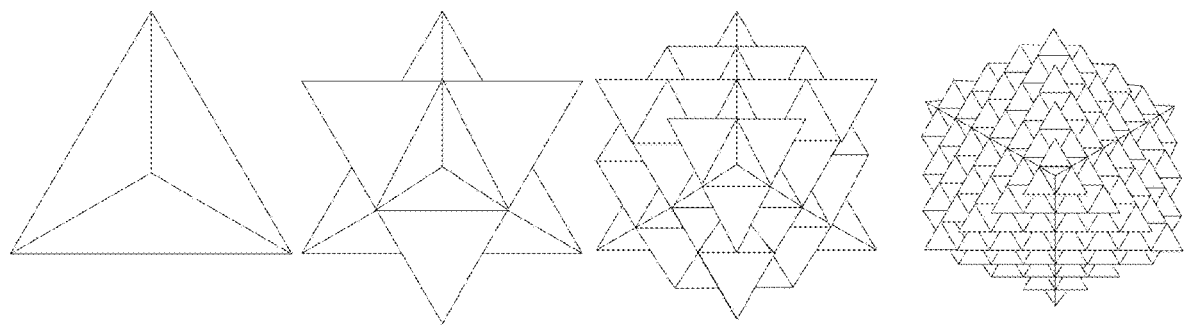

FIG. 14 illustrates a fractal heatsink that is an exemplary embodiment of the invention. In this embodiment, the heatsink is based on a 3D Quadtratic Koch.

Figure 15:
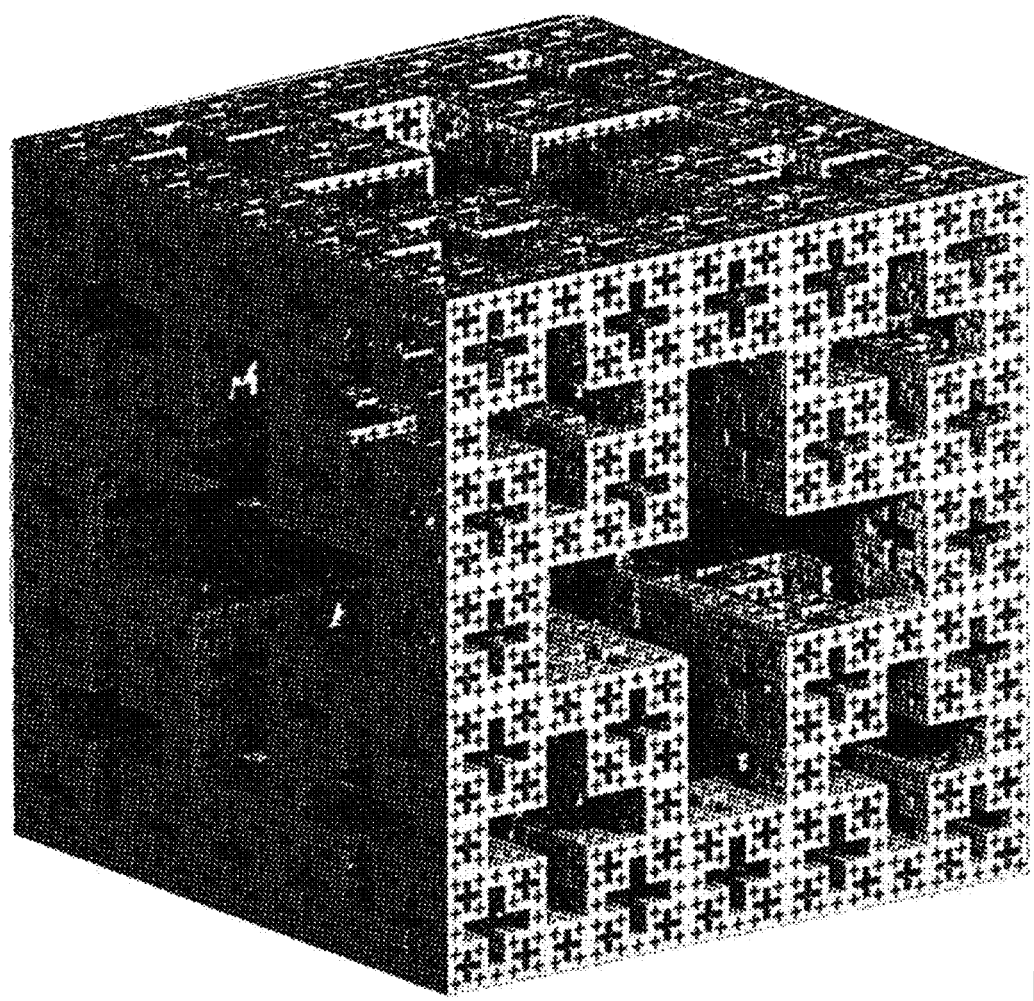

FIG. 15 illustrates a fractal heatsink that is an exemplary embodiment of the invention. In this embodiment, the heatsink is based on a Jerusalem cube.

Figure 16:
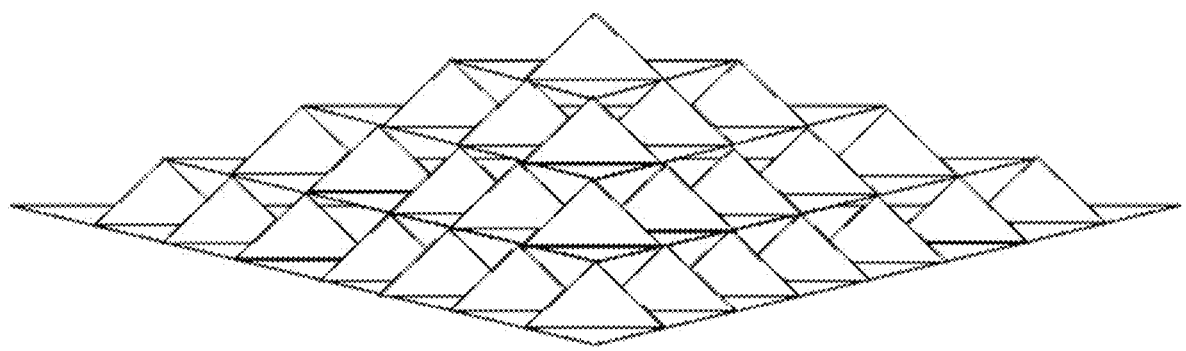

FIG. 16 illustrates a fractal heatsink that is an exemplary embodiment of the invention. In this embodiment, the heatsink is based on a von Koch surface.

Figure 17:
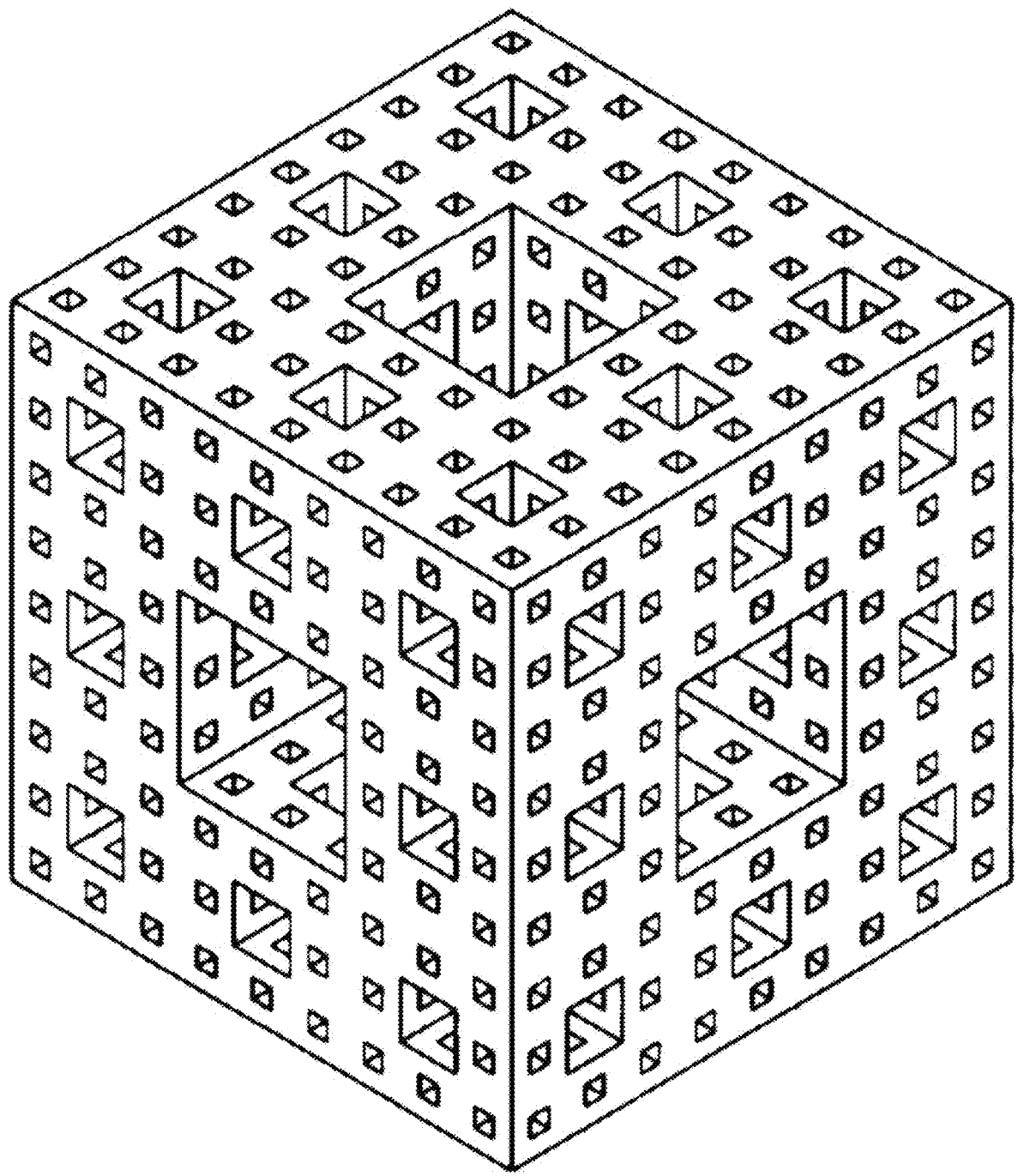

FIG. 17 illustrates a fractal heatsink that is an exemplary embodiment of the invention. In this embodiment, the heatsink is based on a Menger sponge.

Figure 18:
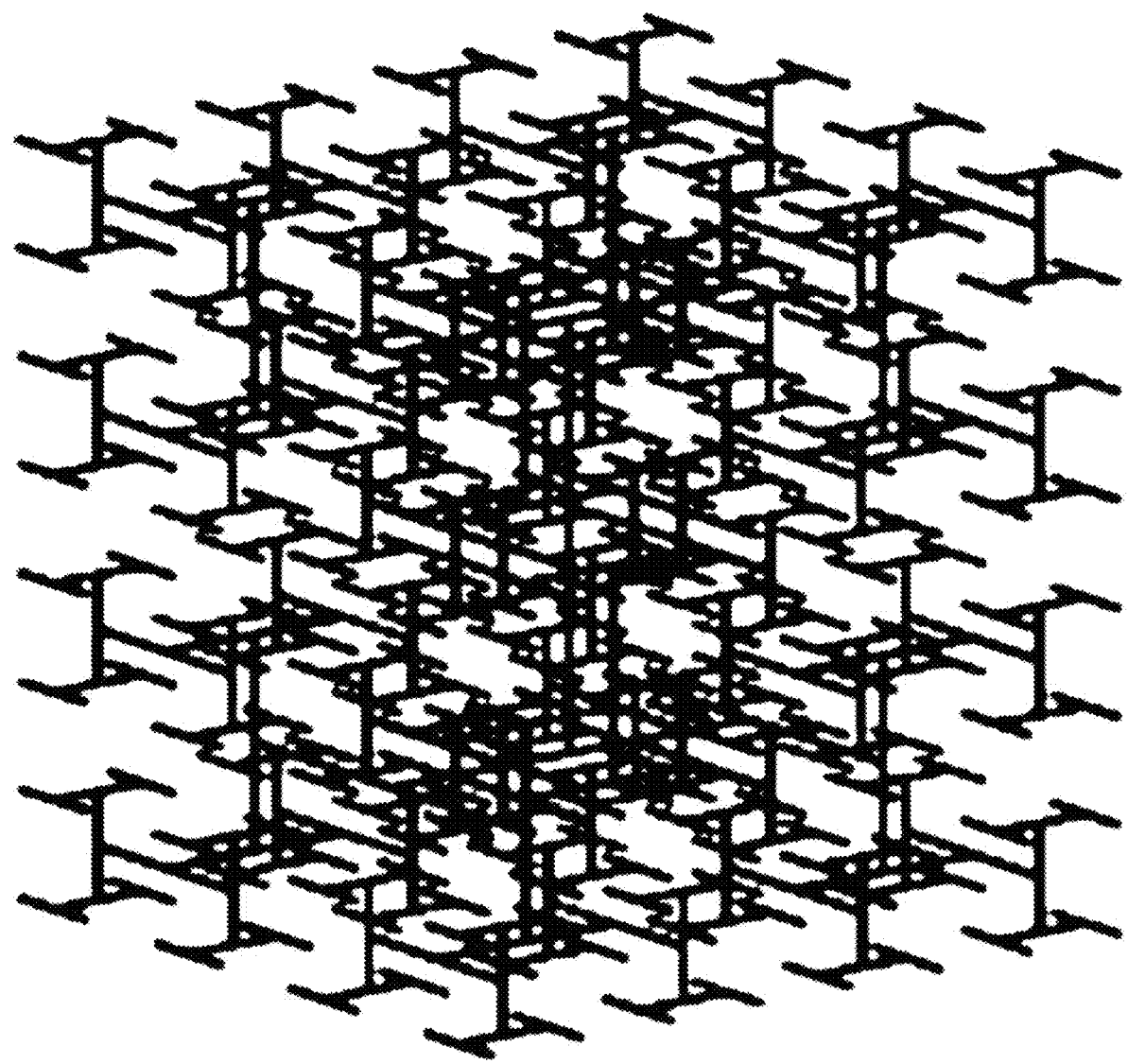

FIG. 18 illustrates a fractal heatsink that is an exemplary embodiment of the invention. In this embodiment, the heatsink is based on a 3D H fractal.

Figure 19:
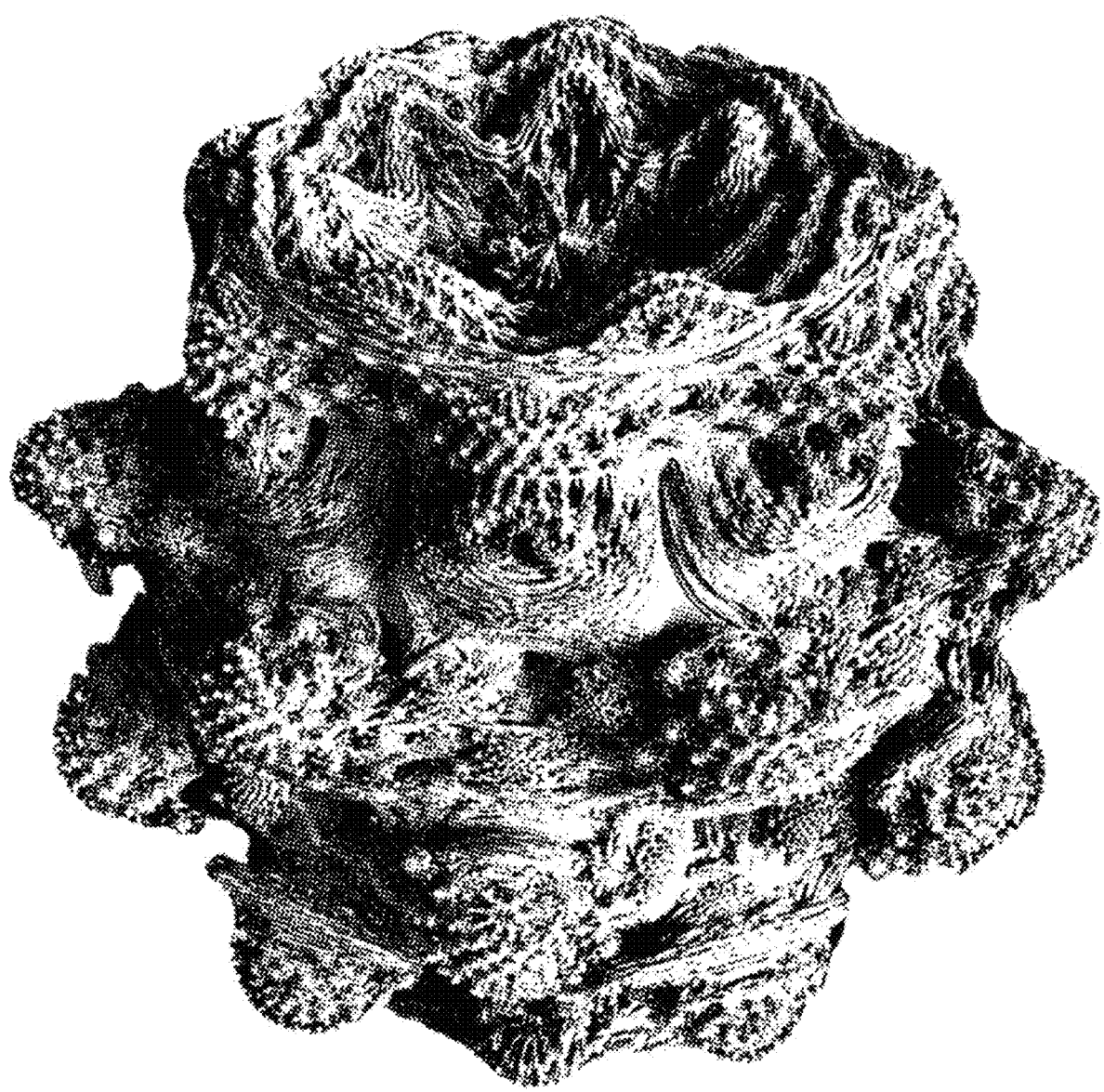
Figure 20:
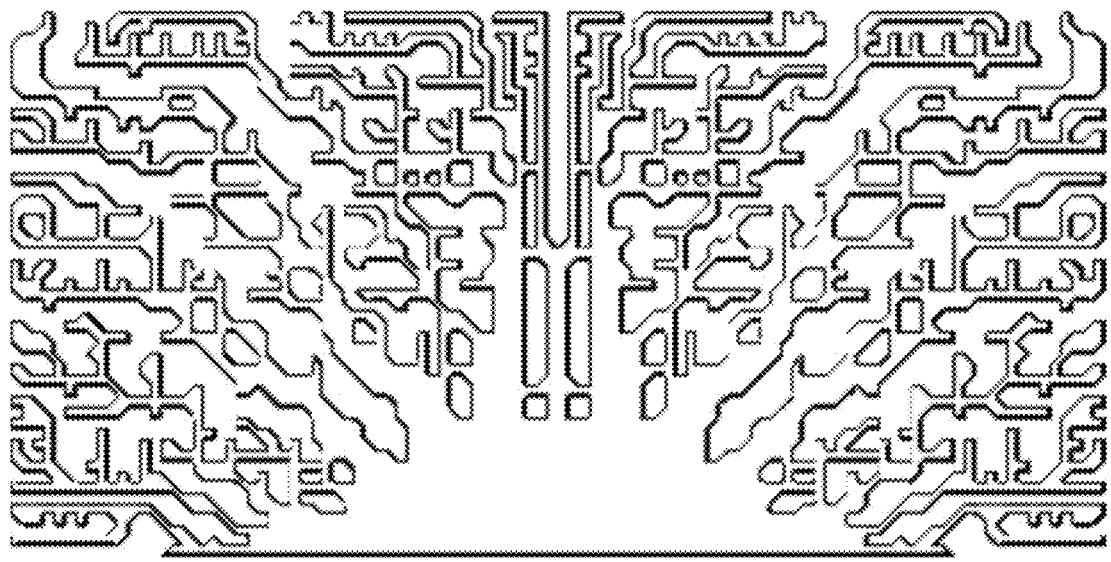
Figure 21:
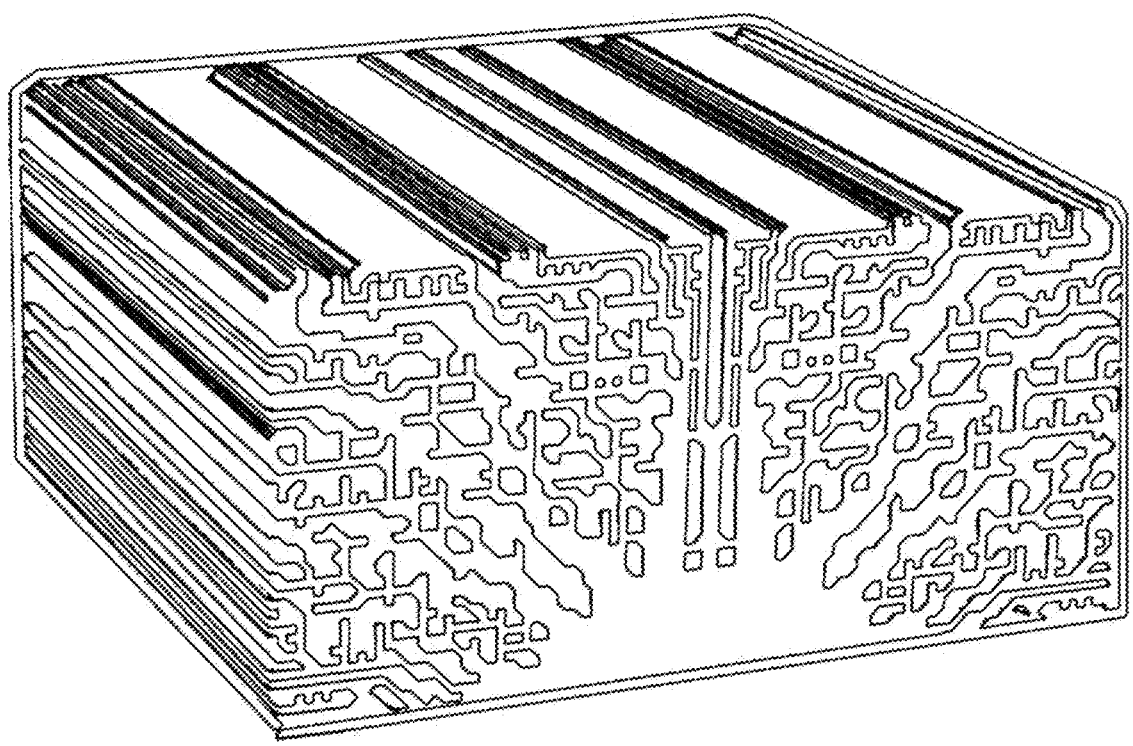
Figure 22:
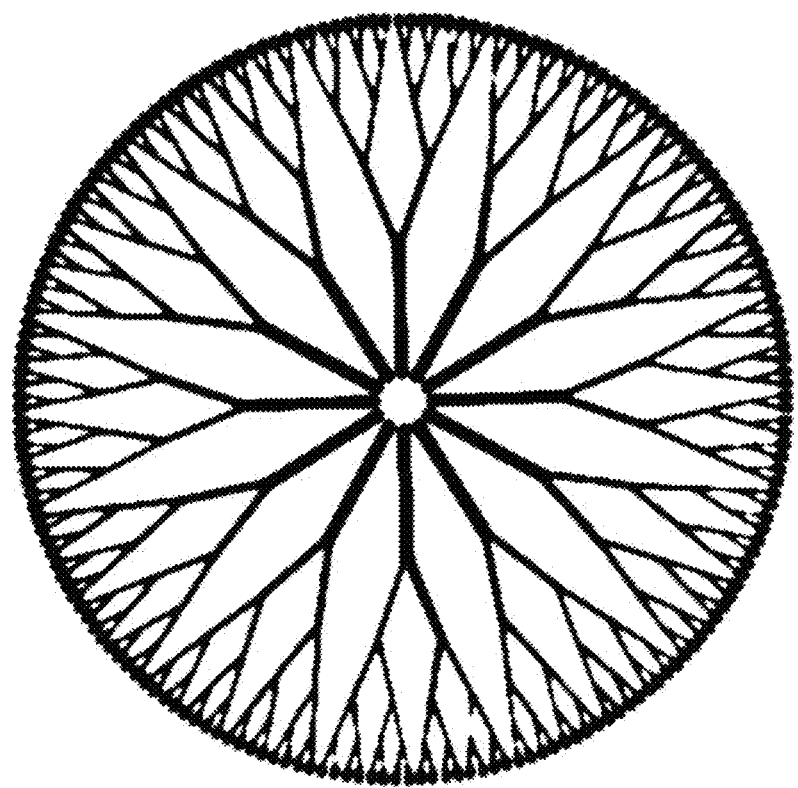
Figure 23:
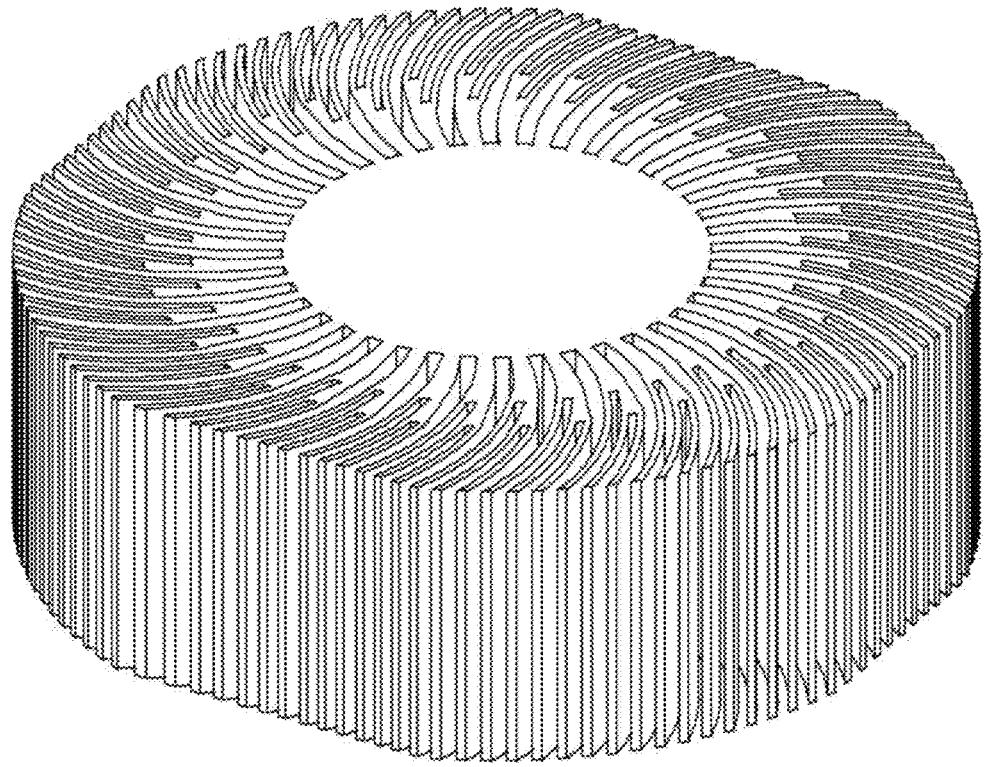
Figure 24:
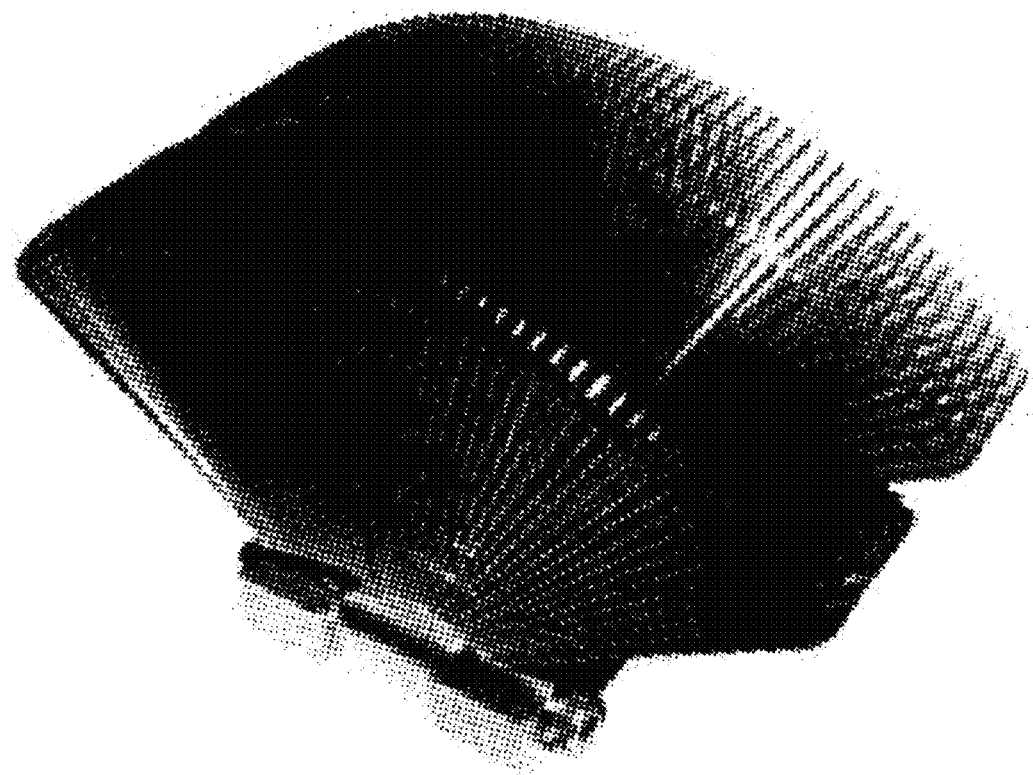
Figure 25:
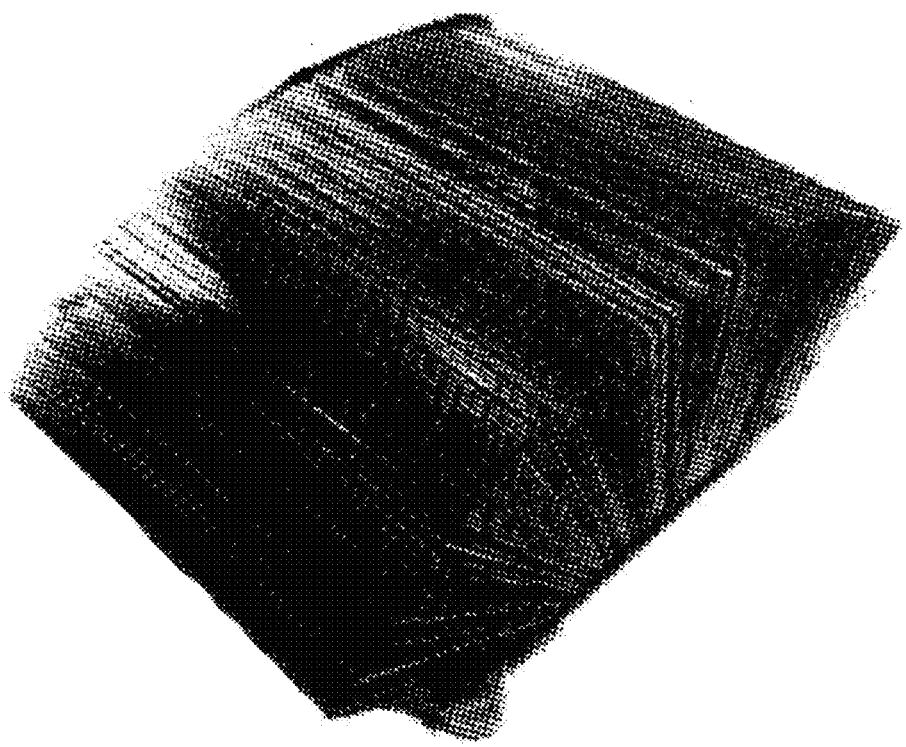
Figure 26:
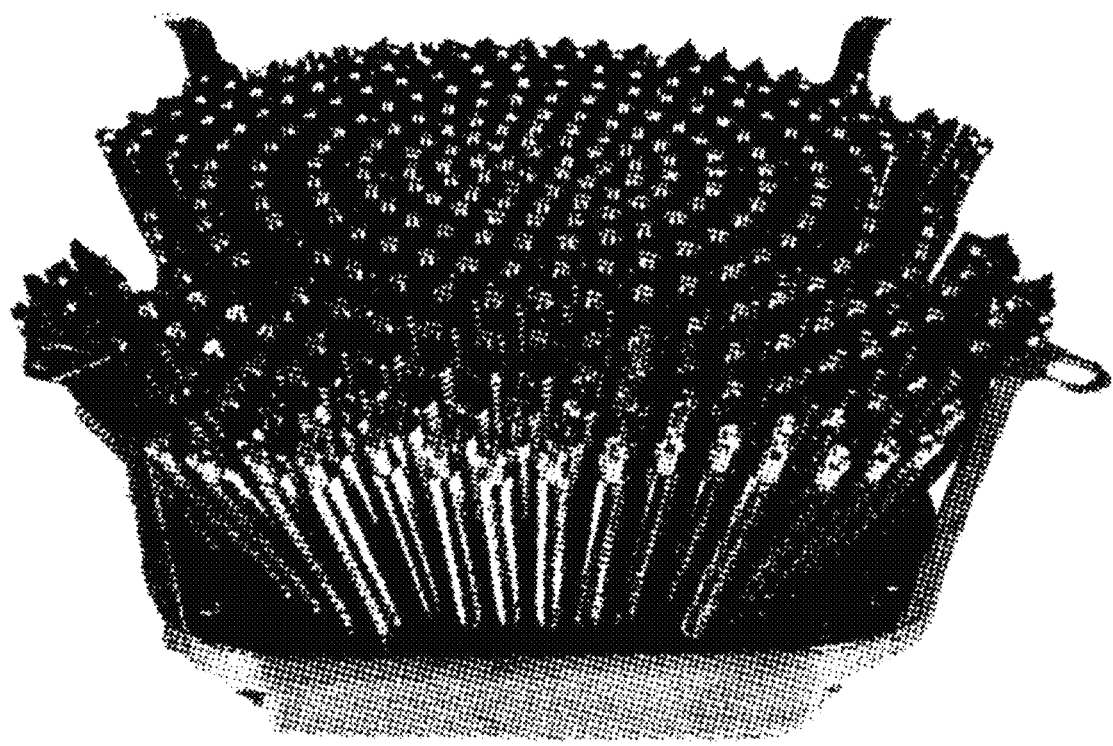
Figure 27:
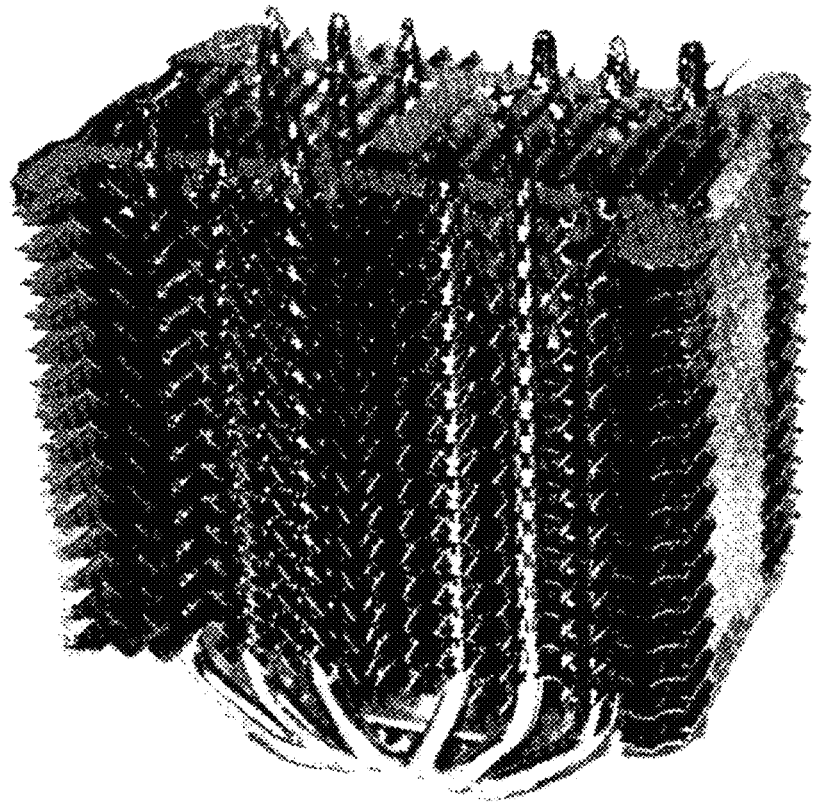
Figure 28:
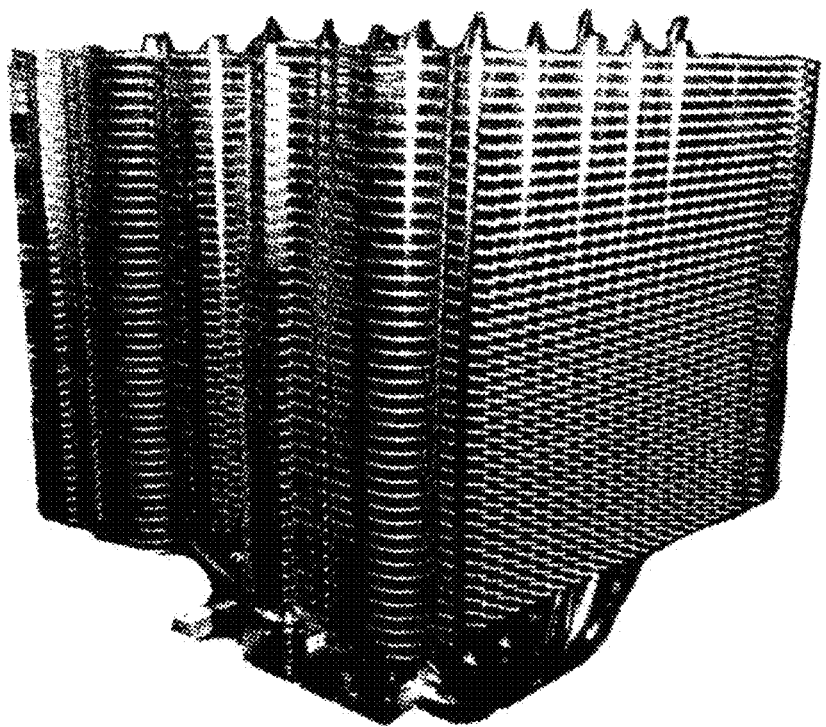
Figure 29:
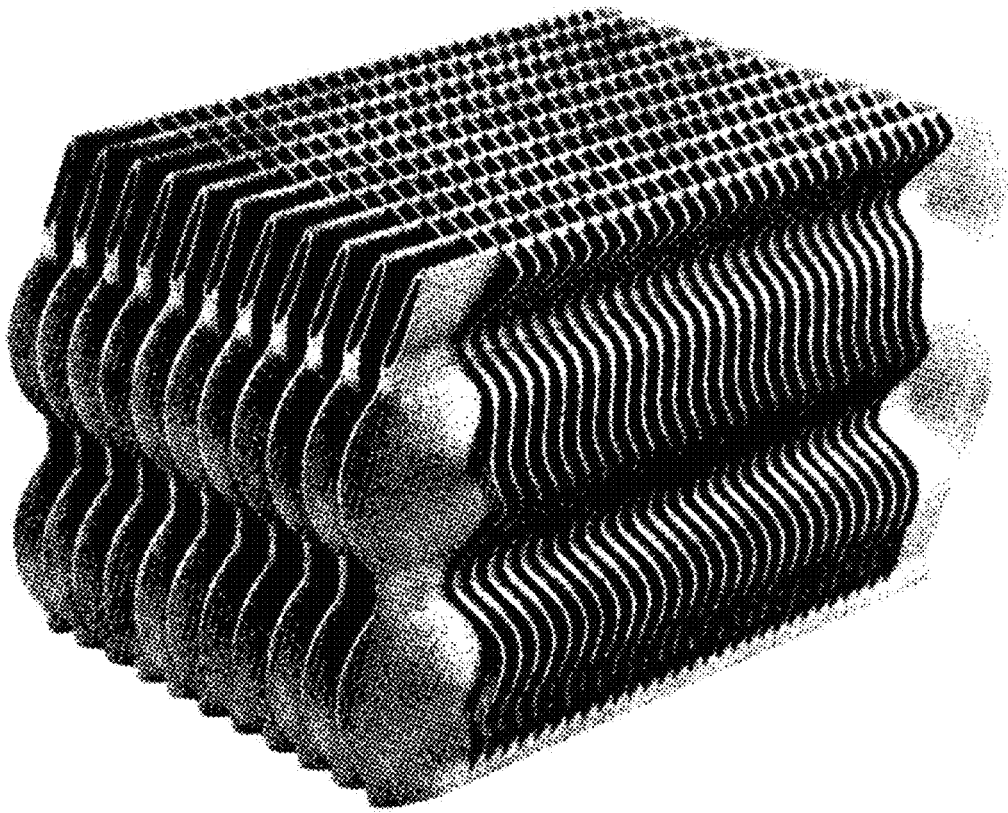
Figure 30:
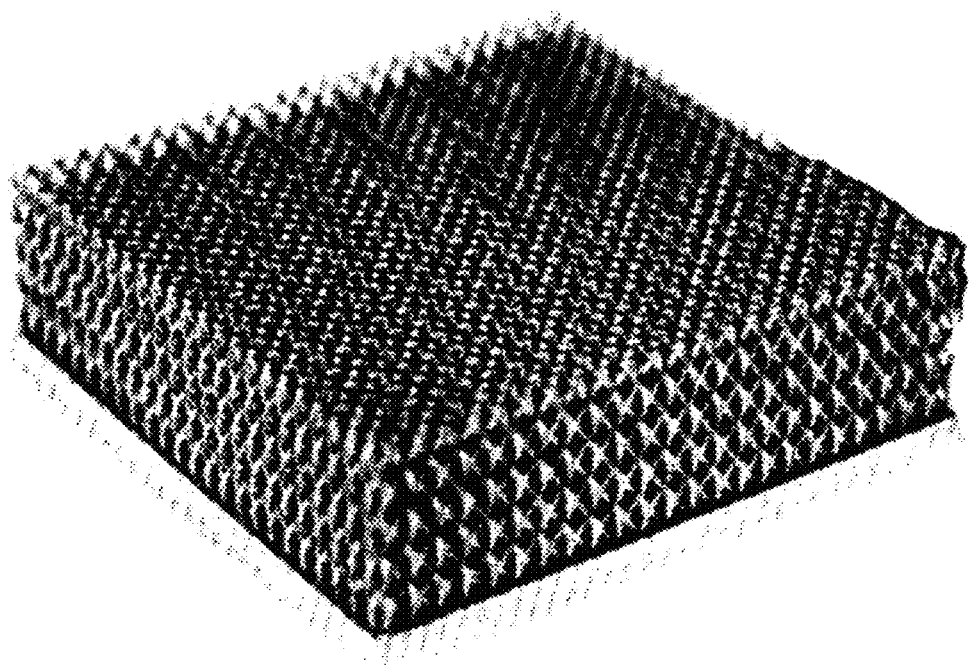
Figure 31:
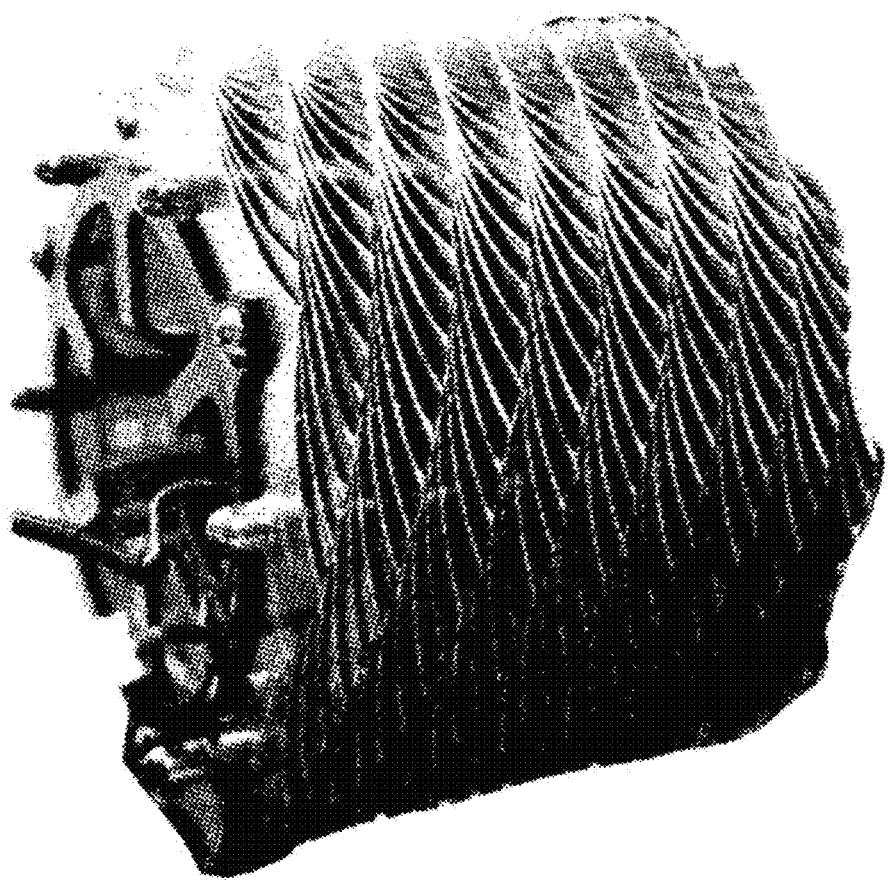
Figure 32:
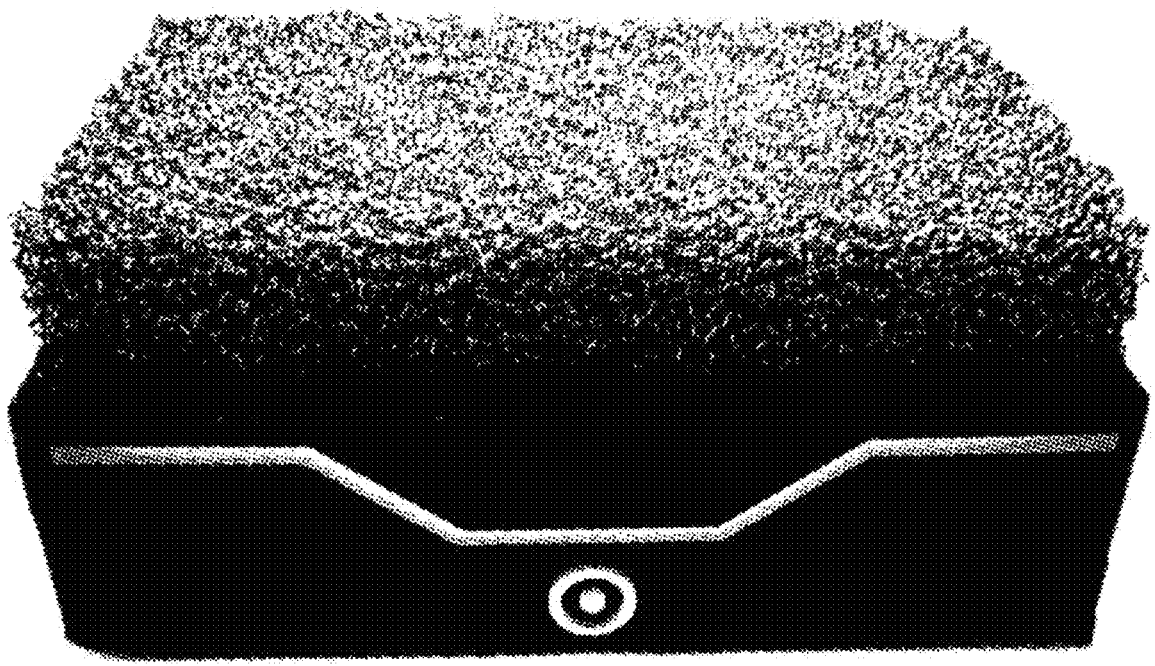
Figure 33:
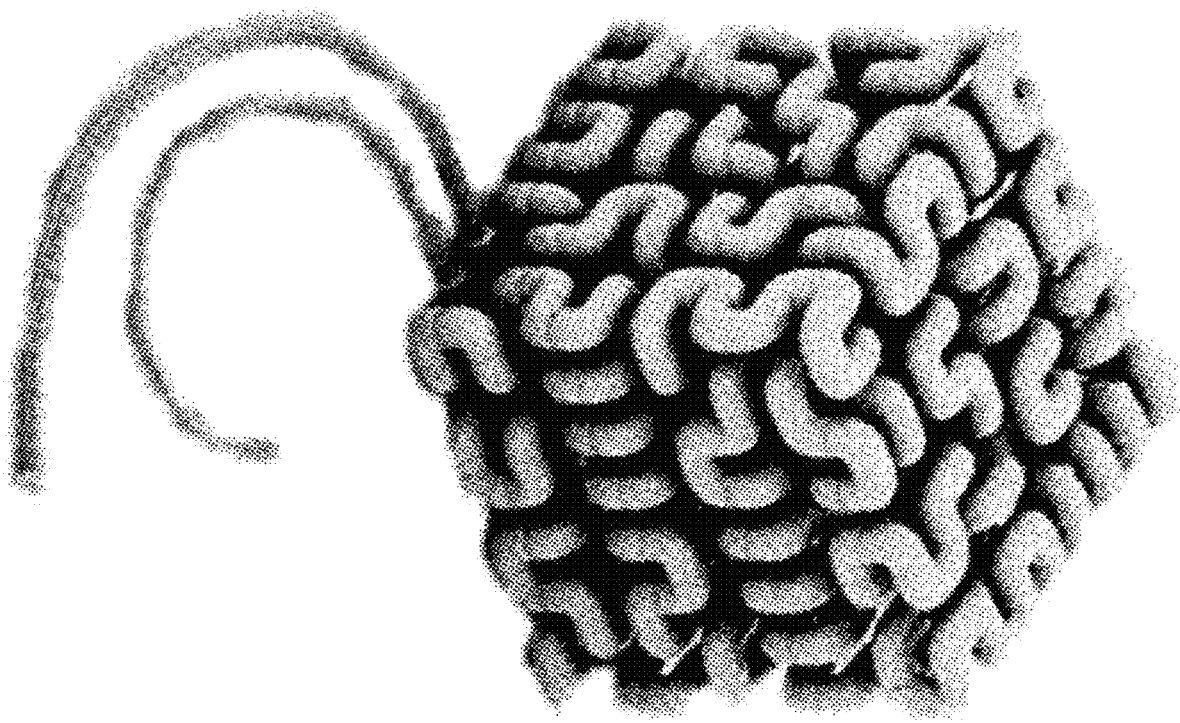
Figure 34:
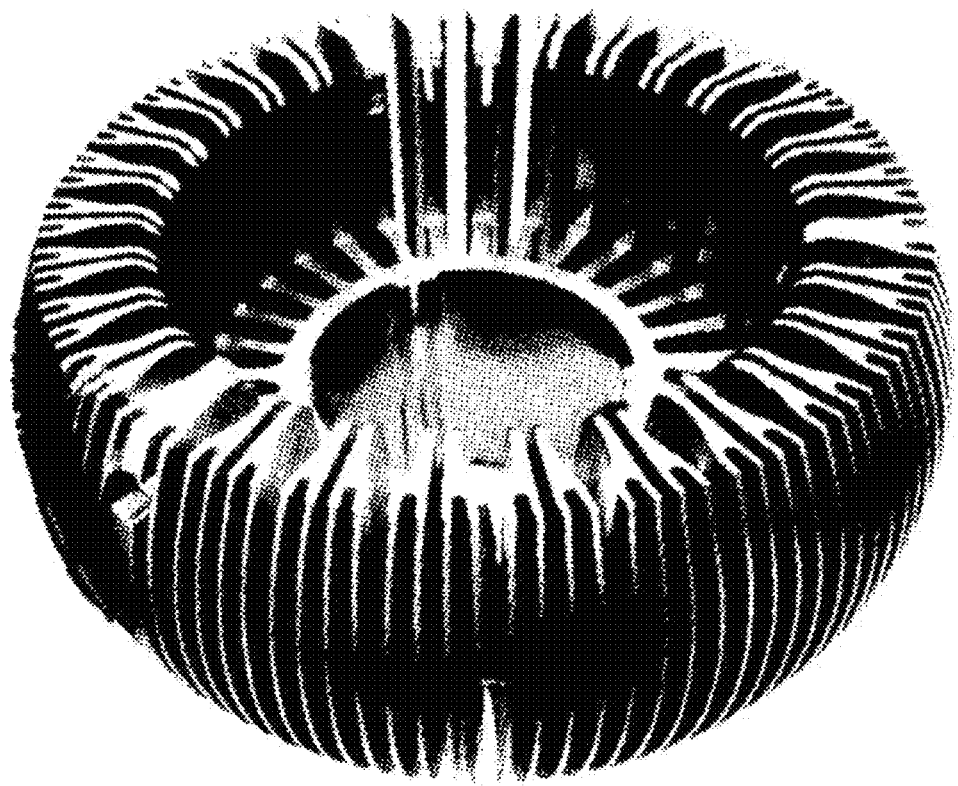
Figure 35:
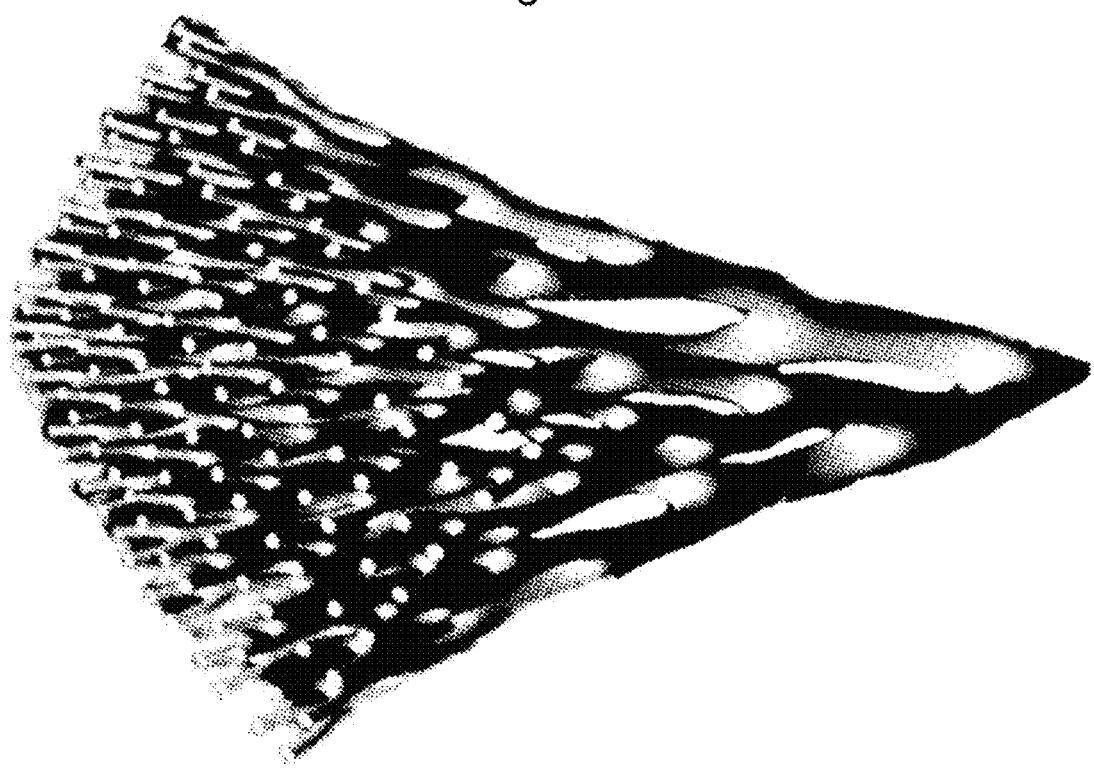
Figure 36:
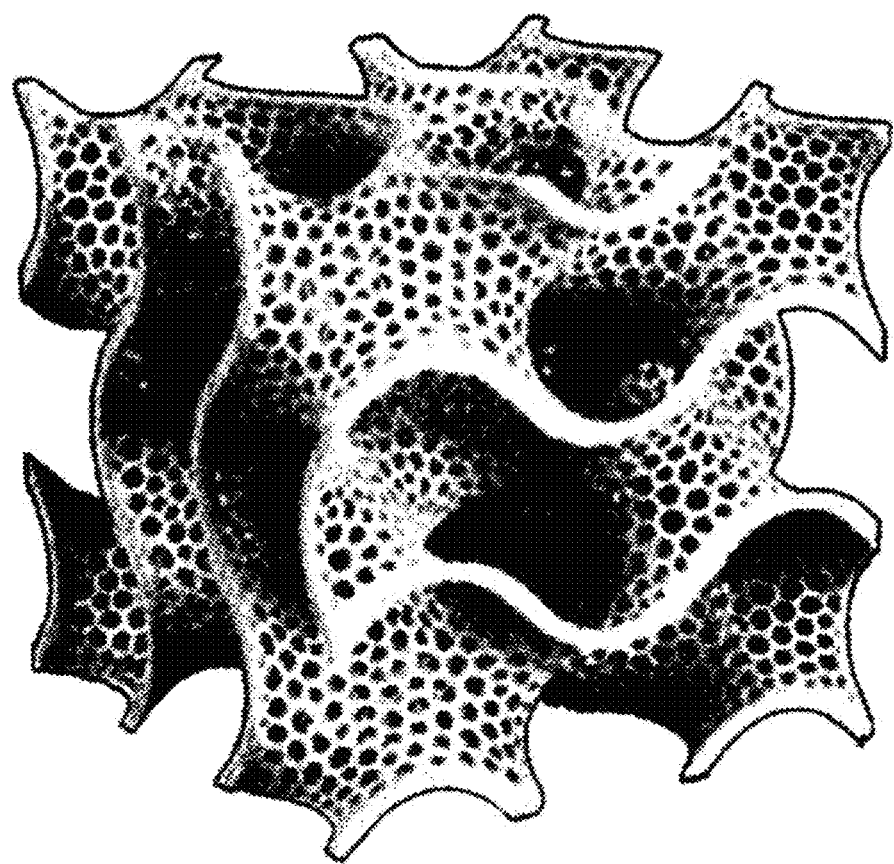
Figure 37:
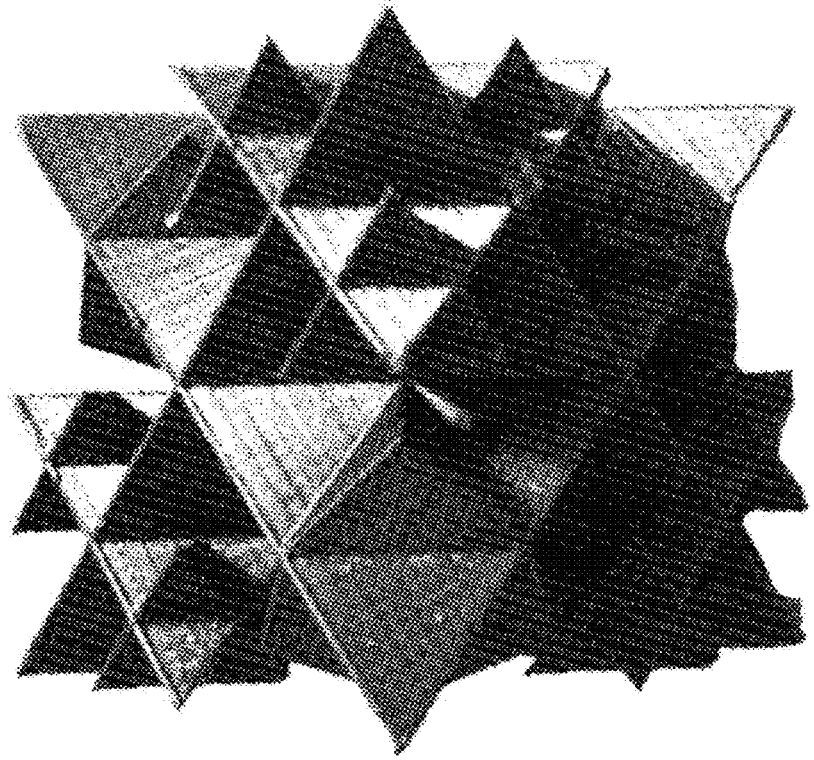

FIG. 19 illustrates a fractal heatsink that is an exemplary embodiment of the invention. In this embodiment, the heatsink is based on a Mandelbulb.

FIGS. 20-37 illustrate various heatsink designs and proposals, which may be used in conjunction with various embodiments of the technology.

DETAILED DESCRIPTION OF THE PREFERRED EMBODIMENTS

Figure 2:
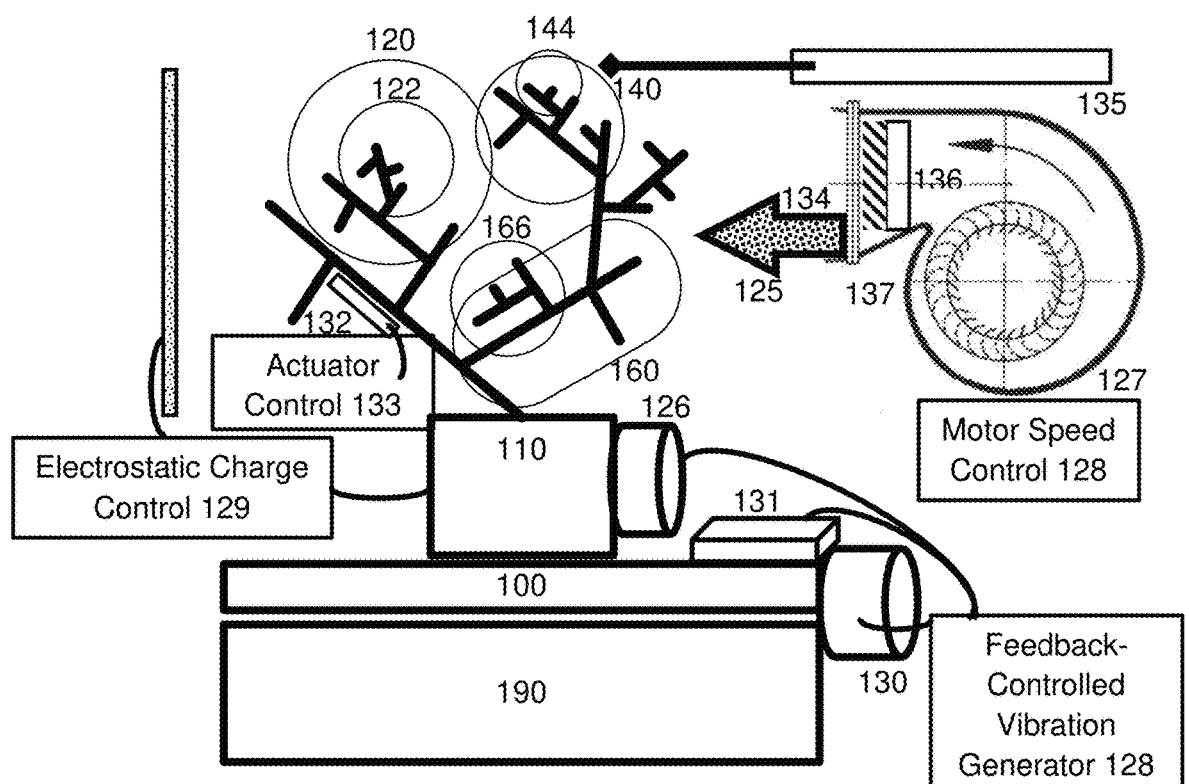
FIG. 2 illustrates a fractal heatsink that is an exemplary embodiment of the invention. In this embodiment, the heatsink is placed adjacent to the object to be cooled.

FIG. 2 illustrates a heatsink implementing a first embodiment of this invention. Note that the illustration is in two dimensions, but a three-dimensional embodiment is both possible and preferred. There is a heat transfer surface 100 that allows the heatsink to rest comfortably on a surface, such as the solid to be cooled 190. In the illustrated embodiment, the heat transfer surface 100 is roughly planar, having a closed Euclidian cross-section on the bottom. However, it might also have another shape, for example if the solid to be cooled does not have a planar face. The heat transfer surface may also comprise an anisotropic vibration transfer thermal interface material, such as a braided or straight fine copper wire bundle. Such a bundle advantageously has strands of different length, which, for example, could permit destructive interference of vibrations transmitted along each strand. A fractal-shaped heat exchange device begins at point 110. The base of the fractal-shaped heat exchange device at point 110 may also or alternately include a piston and cylinder, to provide vibrational isolation along the piston movement axis, while also transmitting heat from the heat source to the heatsink along the peripheral wall of the cylinder to the inner wall of the piston. The working fluid within the cylinder may be a heat transfer fluid, and a set of valves may be actuated based on the vibration to induce a flow. The heat transfer fluid may be a phase change fluid, and the gaseous phase may vent from the cylinder through a valve. Note that the heatsink has three branches leaving from point 110-branch 120, branch 140, and branch 160. Also note that the branch structure initiating from point 110 is nearly identical to that at point 122 and 142, even though only point 110 is a true starting point. Thus, the fractal property of self-similarity is present. We call the structure that begins at point 110 the "first motif," the structure from point 122 the "second motif," and the structure that begins from point 142 the "third motif." Note that, in the embodiment illustrated in FIG. 2, the replication from first to second motif and from second to third motif involves a linear displacement (upward) and a change of scale. In branches not going in the same direction as the prior branch, there is also a rotation. Under the limitations for ideal fractals, the second motif and third motif are a smaller, similar copy of the first motif. However, due to the limitations imposed by human-made structures and machines, the fractals designed here are generally finite and the second motif will thus be an inexact copy of the first motif, i.e. if there are N levels starting from the first motif, the second motif level will have N−1 levels, if N is very large, the difference is insignificant. In other words, the self-similarity element required in fractals is not preserved perfectly in the preferred designs due to the limitations of available machinery, other feasibility constraints, and various design issues. In addition, the benefits are achieved without requiring fractal relationships over more than a few "orders" of magnitude (iterations of the fractal recursive algorithm). For example, in the embodiment illustrated in FIG. 2, there are no continuing branch divisions and iterations at point 162, even though an ideal fractal would have them. In an ideal fractal, there would be an infinite number of sub-branches from 110, 122, and 142. However, an imperfect fractal shape, as illustrated in FIG. 2, will serve the purposes of this invention.

FIG. 2 shows various embodiments of the invention, which may be used individually, in combination, or in subcombination. When ambient air flows over a textured surface, such as a branching fractal or fractal-like shape, dust, fibers and/or debris may accumulate. In addition, in some cases, pollutants or oils may deposit. Such depositions tend to reduce the efficiency of heat transfer, and when sufficiently thick, should be removed or disrupted. According to one embodiment, a particle-dislodging device configured to mechanically disrupt an accumulation of particles on the plurality of heat exchange elements is provided, e.g., vibration transducer 126, fan 127, actuator 132, etc.

Thus, for example, the particle-dislodging device may comprise a vibration transducer 126 configured to vibrate a plurality of heat exchange elements comprising the heat exchange surface. The vibration transducer 126 may be, for example, a piezoelectric transducer, an electromagnetic transducer, or a rotating motor. In the case of a vibration transducer, it is preferred that the vibrations be emitted at resonant frequencies of the heat exchange elements; which advantageously span a range due to the fractal or fractal-like disposition. Therefore, vibrational energy can be selectively targeted to certain elements, without resonant vibration of the entire structure. The vibrational energy may be controlled to scan a range of frequencies, or to target specific frequencies corresponding to targeted structures.

The system may further comprise at least one vibrational transducer 130, controlled by a feedback-controlled vibration generator 128 to cancel vibrations at the base structure produced by the particle dislodging device 126, based on a signal from a vibration sensing transducer 131.

A vibration damper may be provided to damp vibrations at the base structure, e.g., near the point 110. This may be an isotropic or anisotropic vibration isolator, and for example may comprise a bundle of wires (e.g., copper), a piston and cylinder, a particle-filled polymeric thermal interface material, copper nanotubes, or the like.

A fan 126 or a heat transfer fluid (which may be gaseous or liquid) pump/compressor may be provided, which in turn may be controlled by e.g., motor speed control 128 to induce a time-varying flow of heat exchange media over the plurality of heat exchange elements. The fan 126 or pump/compressor may be configured to induce a flow of a gaseous heat transfer medium over the heat exchange surface along at least one vector, having at least one control input, wherein the at least one vector is altered in dependence on the at least one control input, by, for example a set of louvers 137. The flow rate may also be controlled over time, in dependence on thermal load, desired turbulence or other convective heat transfer phenomenon, acoustic emissions, or other criteria.

The heat exchange media may comprise entrained particles 125, such as magnetic particles 125, which impinge on the surfaces of the heat exchange elements, and can dislodge surface debris. Advantageously, a magnetic collector can capture the particles for reuse, after mixed debris is separated. The entrained particles 125 may also be liquid droplets in a gas-liquid mixture.

In an alternate embodiment, the particle-dislodging device comprises an electrostatic charge generator and an electrostatic discharge device 129. These cooperate to charge the surfaces of the heat exchanger, which in conjunction with a collection plate/discharge device, induce a force on the surface particles to move from the heat exchange surface to the collection plate.

The particle-dislodging device may also comprise a shape memory alloy 132 or bimetal element, which for example is passively controlled by a temperature, or actively controlled by control 133 to change the configuration of the heatsink. The control 133 may include an automated electronic processor in dependence on a computational heat exchange model of the heatsink system. Other types of actuator configured to alter at least one spatial relationship of a first portion of the heat exchange elements with respect to a second portion of the heat exchange elements are possible.

In an alternate embodiment, the particle-degrading device is configured to chemically degrade an accumulation of particles on the plurality of heat exchange elements. For example, the particle-degrading device may be a pyrolizer 134, discharge plasma emitter 136, solvent wash (solvent as entrained particles 125), etc. These chemical degradation effects need not be constant, and can thus vary in intensity, duty cycle, etc. over time.

A laser 135 may be provided to ablate or disrupt the accumulation. The laser may be, for example, controlled by electronically controlled mirrors. On some cases, a continuous scanning is desired, and the control may be a simple area scan of a pulsed laser beam.

The fractal heatsink has a much larger surface area than the heat transfer surface alone, or a regular array of heatsink because all of the "branches" and "leaves" of the fern-like fractal shape serve to increase the surface area. In addition, if a heat transfer fluid is induced to flow above the heat transfer surface 100, the turbulent portions of the heat transfer fluid near the surface will be increased by the textures inherent in the fractal variation in the heat exchange element 110. Because the fractal patterns is itself non-identically repeating within the fractal design, this will serve to substantially reduce narrow band acoustic resonance as compared to a corresponding heat exchange device having a repeating design, e.g., a linear or geometric variation between several heat exchange elements, thereby further aiding in the heat transfer process.

In a preferred embodiment, the heat transfer surface 100 and the roughly fractal-shaped heat exchange element 110 are all made out of an efficient heat conductor, such as copper or aluminum, or more preferably, having a portion whose heat conductivity exceeds 850 W/(m*K), such as graphene with a heat conductivity of between 4840 and 5300 W/(m*K) or diamond with a heat conductivity between 900 and 2320 W/(m*K). This would allow heat to quickly enter the heatsink from the solid and for heat to quickly exit the heatsink through the branches and leaves of the fern-like fractal 110. In another embodiment, the heatsink is formed, at least in part, of carbon nanotubes, which display anisotropic heat conduction, with an efficient heat transfer along the long axis of the tube. Carbon nanotubes are submicroscopic hollow tubes made of a chicken-wire-like or lattice of carbon atoms. These tubes have a diameter of just a few nanometers and are highly heat conductive, transferring heat much faster than diamond, and in some cases comparable to graphene. See news.mit.edu/2010/thermopower-waves-0308.

Also note that this exemplary embodiment provides a plethora of openings, e.g. 124 and 126, between the branches or fractal sub-elements to ensure that all of the branches are exposed to the surrounding air, gas or liquid and to allow the heat to escape from the heatsink into the surroundings. In one embodiment of the invention, at least two of these openings are congruent, as are openings 124 and 126 illustrated here. An embodiment of the invention allows the openings to be filled with the air or liquid from the surrounding medium. Due to the limitation imposed by the solid's flat shape, it is not possible to increase the exposure of the fern-like fractal to the solid. However, the air or liquid outside of the solid are perfect for the fractal's exposure.

Under the phonon model of heat exchange, applicable to carbon nanotubes, graphene materials, and perhaps others, the fractal shape is advantageous to ensure the escape of the phonons into the surrounding fluid medium because the fractal configuration may avoid peaked internal reflection of waves, and provide high surface exposure to the fluid heat transfer medium. Skilled persons in the art will realize that this could be achieved through many known structures. For example, graphene, which is one-atom-thick carbon and highly heat conductive, would be an advantageous material to use to build a 2D implementation of the fractal heatsink herein described.

When a turbulently flowing fluid passes around an obstacle, concave regions or cavities in the obstacle create pockets of separated flow which generates self-sustaining oscillations and acoustic resonance. Convex regions may also be provided. These regions may be provided in a fractal arrangement. In this aspect of the technology, fractal is meant to signify self-similar but with differences in scale and optionally another attribute. The regions may produce substantially reduced narrow band acoustic resonance as compared to regularly spaced and arranged disruptions in the flow pattern. Likewise, the presence of disruptions disturbs the surface layer and may enhance convective heat transfer.

Figure 3:
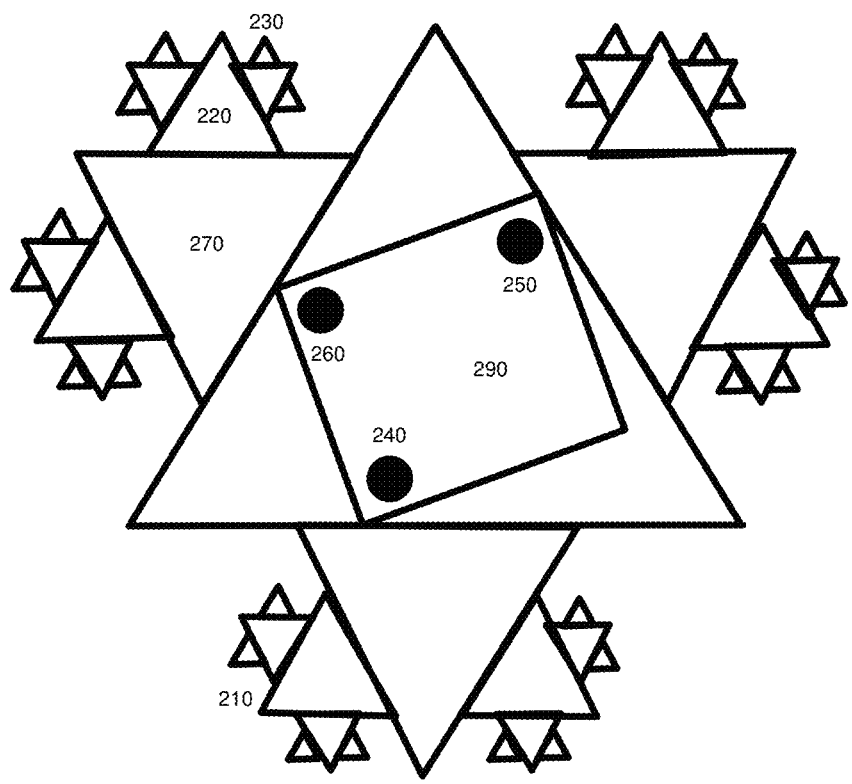
FIG. 3 illustrates a fractal heatsink that is an exemplary embodiment of the invention. In this embodiment, the heatsink is placed either adjacent to or surrounding the object to be cooled.

FIG. 3 illustrates another embodiment of the invention. A solid to be cooled that has an arbitrary shape 290 is located inside (illustrated) or outside (not illustrated) a two-dimensional or three-dimensional roughly fractal shaped 210 heatsink. In one embodiment, the heatsink 210 has an aperture 270 designed to hold the solid. Note that, as in FIG. 2, the fractal heat exchange element has multiple motifs, starting with the large triangle at 210, to progressively smaller triangles at 220 and 230. However, note that the fractal does not keep extending infinitely and there are no triangles smaller than the one at 230. In other words, the fractal heatsink 210 has multiple recursive fractal iterations 220 and 230, but the fractal iterations stop at level 230 for simplicity of design and manufacturability. Also note that the fractal submotifs 220 and 230 are of different dimensional sizes from the original fractal motif 210 and protrude from the original fractal shape 210. Here, the first motif is a large triangle, and the latter motifs are smaller triangles, which involve a rotation, linear displacement, and change of scale of the prior motif. In one embodiment, the fractal shape has some apertures in it (not illustrated) to allow the solid to be cooled to connect with other elements. Also, the solid to be cooled is connected to the fractal shape at point connector 240 and through bus wires at 250 and 260. The solid should be connected to the fractal heatsink in at least one point, either through a point connection, a bus wire connection, or some other connection. If it is desired that the solid be fixed inside the heatsink, there may be at least three connection points, as illustrated. However, only one connection point is necessary for conduction between the solid to be cooled and the heatsink. Preferably, the point or bus wire connection is built using a strong heat conductor, such as carbon nanotubes or a diamond-like coating.

Figure 1:
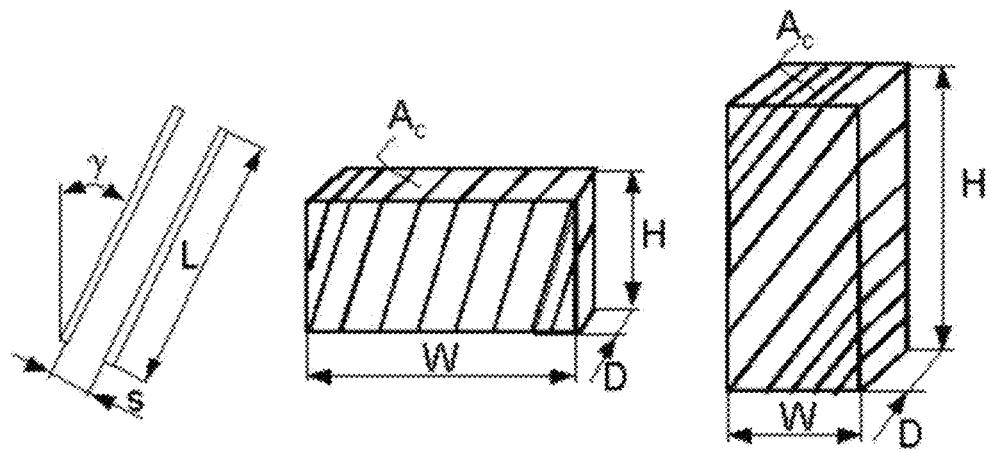
FIG. 1 shows a set of governing equations for a parallel plate heatsink.

Note that, as in FIG. 1, the fractal structure 210 in FIG. 2 has multiple concave regions or cavities. When a turbulently flowing fluid passes around this fractal heatsink, the concave regions or cavities substantially reduce the narrow band acoustic resonance as compared to a flat or Euclidian structure. This allows for more energy to be available to for heat transfer.

In yet another embodiment of the invention, the heatsink 210 in FIG. 3 could be constructed without the connections at points 240, 250, and 260. In one embodiment, a liquid or gas would fill the aperture 270 with the intent that the liquid or gas surround the solid to be cooled, hold it in place, or suspend it. Preferably, the liquid or gas surrounding the solid would conduct heat from the solid to the heatsink, which would then cause the heat to exit.

Figure 4:
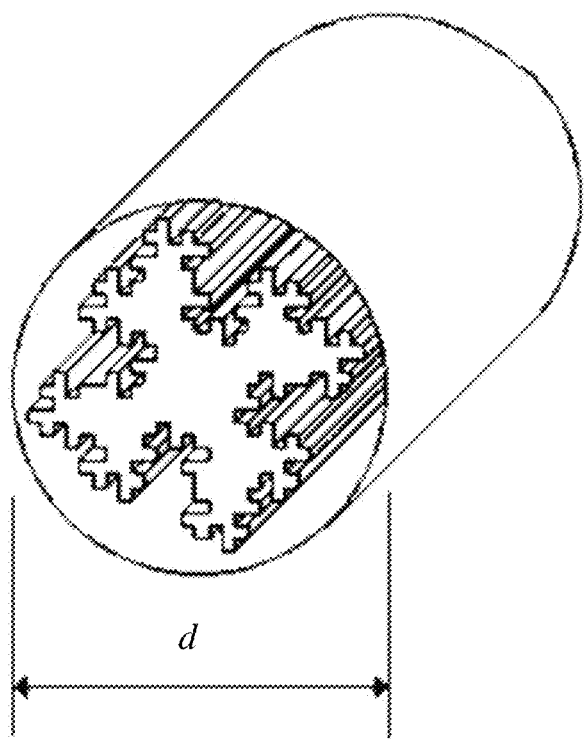
FIG. 4 illustrates a fractal heatsink that is an exemplary embodiment of the invention. In this embodiment, the heatsink is based on a Quadratic Koch Island.

In another embodiment of the invention, the heatsink comprises a heat exchange device which is structurally configured based on a Quadratic Koch Island as illustrated in FIG. 4.

Figures 5A, 5B:
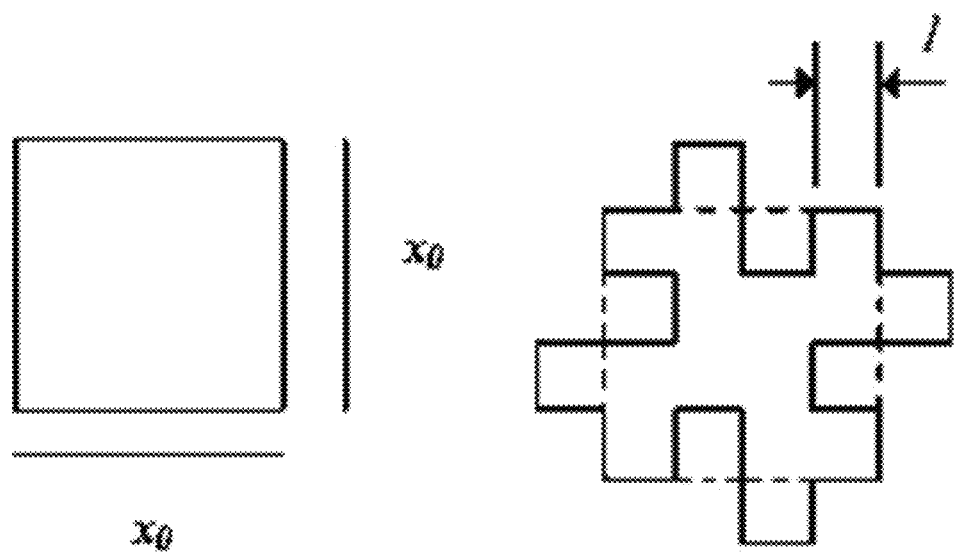
FIG. 5A illustrates the basis for the Quadratic Koch Island.
FIG. 5B illustrates a Quadratic Koch Island obtained after application of one iteration.
Figure 5C:
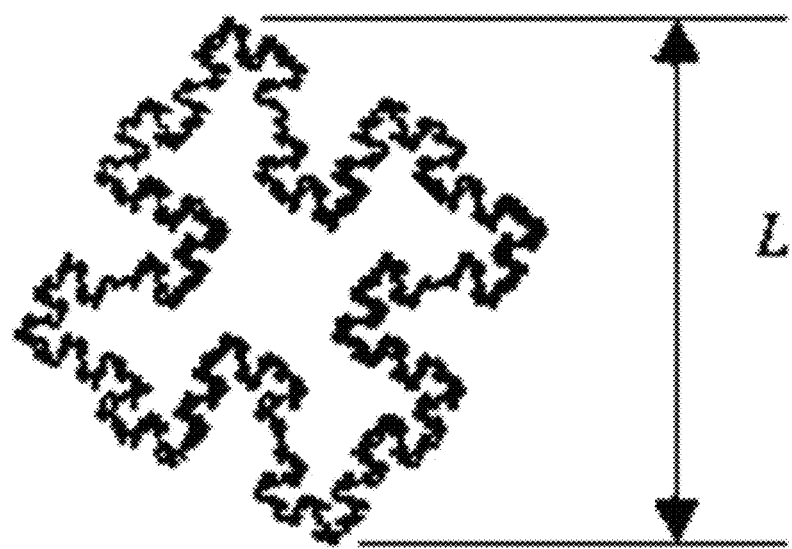
FIG. 5C illustrates a Quadratic Koch Island obtained after application of several iterations.

FIG. 5A illustrates a square with dimension $x_0$ that forms the basis for the Quadratic Koch Island. FIG. 5B illustrates a Quadratic Koch Island obtained after application of one fractal on the square. The fractal with section lengths of l is applied to each side of the square in the first iteration. Similarly, after several such iterations, a Quadratic Koch Island as illustrated in FIG. 5C may be obtained.

Figure 6:
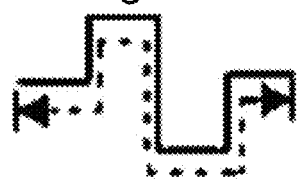
FIG. 6 illustrates the total length of all the fractal segments of a Quadratic Koch Island.

FIG. 6 illustrates the length of the fractal $l_f$ which is the total length of all the fractal segments. The length of each fractal section, l(n), decreases with each iteration of the fractal. The fractal section length is described by eq. 7.

$$l(n) = (1/4)^n x_0 \quad (7)$$

where,
$x_0$ is the length of the side of the original square,
n is the number of iterations As can be seen from eq. 7, the fractal section length decreases after each iteration. When the number of iterations becomes increasingly large, the section length tends towards being negligible.

Further, it may be mathematically shown that the overall length L of the fractal may be obtained from eq. 8.

$$L(n) = x_0 \left(1 + \frac{2}{3}\left(1 - \frac{1}{4^n}\right)\right) \quad (8)$$

where,
$x_0$ is the length of the side of the original square,
n is the number of iterations Similarly, it may be shown that the circumference C of the Quadratic Koch Island can be obtained from eq. 9.

$$C = 4(2^n x_0) \quad (9)$$

where,
$x_0$ is the length of the side of the original square,
n is the number of iterations It is evident that with each iteration, the circumference C increases. However, the cross-sectional area remains constant at $x_0^2$ since when a fractal area is added the same area is subtracted elsewhere.

In one embodiment, the number of iterations corresponding to the Quadratic Koch Island may be greater than 5. Consequently, the heat exchange device functions as a compact heat exchanger. In other words, the heat exchange device has a large heat transfer area per unit exchanger volume. As a result, several advantages are obtained such as, but not limited to, reduction in space, weight, power requirements and costs. In another embodiment, the number of iterations corresponding to the Quadratic Koch Island may be less than or equal to 5. Consequently, the heat exchange device may function as a non-compact heat exchanger.

It may be shown with heat transfer analysis that heat transfer and heat transfer coefficient increase independently of each other with every application of the fractal. Further, the increase may be double, or greater, with every fractal iteration. In general, the increase in heat transfer follows a trend of $2^n$. Moreover, pumping power increases at almost one and a half the rate. Pumping power is the power needed to pump the heat transfer fluid through the heat exchange device.

In yet another embodiment of the invention, the heatsink comprises a heat exchange device which is structurally configured based on a modified Koch Snowflake as illustrated in FIG. 7A. The basis for generating the modified Snowflake is an equilateral triangle of width w as illustrated in FIG. 7B. In the first iteration, two smaller equilateral triangles of width ⅓ of the base width w are added onto two sides of the base triangle. Similarly, by applying a second and a third iteration, the modified Koch Snowflakes as illustrated in FIG. 7A may be obtained.

The surface area, $A_s(n)$, of the modified Koch Snowflake may be obtained from eq. 10.

$$A_s(n) = 2\left(wt + \frac{\sqrt{3}}{4}w^2\right) + \sum_{1}^{n}\left[\left(\frac{w}{3^n}\right)^2\left(\frac{\sqrt{3}}{2}\right) + \left(\frac{w}{3^n}\right)t\right]2^{2n-1} \quad (10)$$

where,
w is the width of the base triangle
n is the number of iterations
t is the thickness of the modified Koch Snowflake It is evident that the surface area of the modified Koch Snowflake increases with each iteration. More specifically, it may be observed that after 5 iterations there is an increase in surface area of about 58%.

Further, the mass of the modified Koch Snowflake may be obtained using eq. 11.

$$m(n) = \left\{\frac{\sqrt{3}}{4}w^2 + \sum_{1}^{n}\left[\left(\frac{w}{3^n}\right)^2\left(\frac{\sqrt{3}}{4}\right)\right]2^{2n01}\right\}\rho t \quad (11)$$

where, w, n, and t are as above, and p is the density of the material making up the modified Koch Snowflake.

It may be observed that the change in surface area with respect to the baseline case (i.e., n=0) is a function of width (w) and thickness (t). However, the change in mass with respect to the baseline is dependent on the fractal geometry chosen. The mass of the modified Koch Snowflake increases with each iteration. However, it converges to a maximum value of mass increase of approximately 40%.

A heat transfer effectiveness (ε) of the modified Koch Snowflake may be defined as the ratio of heat transfer achieved to heat transfer that would occur if the modified Koch Snowflake was not present. e may be calculated from eq. 13.

$$\varepsilon = \frac{Q_c}{hA_b(T_b - T_\infty)} \tag{13}$$

where,

Q is the heat rate h is the heat transfer co-efficient

A is the area

T is the temperature

Further, a heat transfer efficiency (η) of the modified Koch Snowflake may be defined as the ratio of heat transfer achieved to the heat transfer that would occur if the entire modified Koch Snowflake was at the base temperature. η may be calculated from eq. 12.

$$\eta = \frac{Q_c}{hA_S(T_b - T_\infty)} \tag{12}$$

where, Q, h, A, and T are as above.

The heat transfer effectiveness (ε) increases with each iteration. In an embodiment, the modified Koch Snowflake corresponding to three iterations may be used to form the heat exchange device. Accordingly, in this case, the heat transfer effectiveness (ε) may increase by up to 44.8%. Further, the increase in heat transfer effectiveness (F) per mass may be up to 6%. In one embodiment, the material used to make the modified Koch Snowflake may be aluminum. Consequently, heat transfer effectiveness (ε) per mass of approximately two times larger than that obtained using copper may be achieved.

Further, the heat transfer effectiveness (ε) per mass depends on the thickness of the modified Koch Snowflake. In an embodiment, the ratio of width (w) to thickness (t) corresponding to the modified Koch Snowflake may be 8. Accordingly, an increase in heat transfer effectiveness (ε) per mass of up to 303% may be achieved at the fourth iteration.

In yet another embodiment of the invention, the heatsink comprises a heat exchange device which is structurally configured based on a Sierpinski Carpet as illustrated in FIG. 8A. The Sierpinski Carpet is formed by iteratively removing material from a base geometry such as, but not limited to, a square as illustrated in FIG. 8B. In the first iteration, a square with ⅓ of the base width (w) is removed. Similarly, by performing second and third iterations, the Sierpinski Carpets as illustrated in FIG. 8A may be obtained.

The surface area, $A_s(n)$, of the Sierpinski Carpet may be obtained from eq. 13.

$$A_s(n) = 2w^2 + 3wt - \sum_1^n 8^{n-1}\left[2\left(\frac{w}{3^n}\right)^2 - 4\left(\frac{w}{3^n}\right)t\right] \tag{13}$$

where, w is the width of the base square n is the number of iterations t is the thickness of the Sierpinski Carpet Starting from n=0, with each subsequent iteration, the surface area of the Sierpinski carpet initially reduces before reaching a minimum. However, after reaching the minimum, the surface area increases with each subsequent iteration. For example, at a width (w) of 0.0508 m an increase in surface area of 117% may be obtained after five iterations. Similarly, at a width (w) of 0.0254 m, a surface area increase of 265% may be obtained after five iterations.

Further, the mass of the Sierpinski Carpet may be obtained using eq. 14.

$$m(n) = \left\{w^2 - \sum_1^n \left[8^{n-1}\left(\frac{w}{3^n}\right)^2\right]\right\}\rho t \tag{14}$$

where w, n, and t are as above, and p is the density of the material making up the Sierpinski carpet It may be seen from eq. 11 that with each iteration, the mass of the Sierpinski carpet decreases. For example, after five iterations, there is a reduction of 45% of mass of the Sierpinski carpet.

The heat transfer effectiveness (e) corresponding to the Sierpinski carpet increases with each iteration. In an embodiment, the Sierpinski carpet corresponding to three iterations may be used to form the heat exchange device. Accordingly, in this case, the heat transfer effectiveness (F) may increase by up to 11.4%. Further, the increase in heat transfer effectiveness (F) per mass corresponding to the Sierpinski carpet may be up to 59%. In one embodiment, the material used to make the Sierpinski carpet may be aluminum. Consequently, heat transfer effectiveness (F) per mass of approximately two times larger than that obtained using copper may be achieved.

Further, the heat transfer effectiveness (F) per mass corresponding to the Sierpinski carpet depends on the thickness of the corresponding to the Sierpinski carpet. In an embodiment, the ratio of width (w) to thickness (t) corresponding to the corresponding to the Sierpinski carpet may be 8. Accordingly, an increase in heat transfer effectiveness (F) per mass of up to 303% may be achieved at the fourth iteration.

In other embodiments, the heatsink may comprise a heat exchange device which is structurally configured based on, but not limited to, one or more fractals selected from the group comprising: A "scale 2" and "scale 3" Mandelbox; Sierpinski tetrahedron; Fractal pyramid; Dodecahedron fractal; 3D quadratic Koch surface (type 1); 3D quadratic Koch surface (type 2); Jerusalem cube; Icosahedron fractal; Octahedron fractal; Von Koch surface; Menger sponge; 3D H-fractal; and Mandelbulb.

In accordance with an embodiment, the heatsink may comprise a heat exchange device which is structurally configured based on a Mandelbox as exemplarily illustrated in FIG. 9. A Mandelbox is a box-like fractal object that has similar properties as that of the Mandelbrot set. It may be considered as a map of continuous, locally shape preserving *Julia* sets. Accordingly, the Mandelbox varies at different locations, since each area uses a *Julia* set fractal with a unique formula. The Mandelbox may be obtained by applying eq. 15 repeatedly to every point in space.

That point v is part of the Mandelbox if it does not escape to infinity.

$$v = s*\text{ballFold}(r, f*\text{boxFold}(v)) + c \quad (15)$$

where boxFold(v) means for each axis a:
if v[a]>1 v[a]=2−v[a]
else if v[a]<−1 v[a]−2−v[a]
and ballFold(r, v) means for v's magnitude m:
if m<r m=m/r$^2$
else if m<1 m=1/m In an instance, using the values of s=2, r=0.5 and f=1 in eq. 12, the standard Mandelbox may be obtained.

In accordance, with another embodiment, the heatsink may comprise a heat exchange device which is structurally configured based on a Sierpinski tetrahedron. The Sierpinski tetrahedron, also called as tetrix, is a three-dimensional analogue of the Sierpinski triangle. The Sierpinski tetrahedron may be formed by repeatedly shrinking a regular tetrahedron to one half its original height, putting together four copies of this tetrahedron with corners touching, and then repeating the process. This is illustrated in FIG. 10 for the first four iterations. The Sierpinski tetrahedron constructed from an initial tetrahedron of side-length L has the property that the total surface area remains constant with each iteration.

The initial surface area of the (iteration-0) tetrahedron of side-length L is L$^2$√3. At the next iteration, the side-length is halved and there are 4 such smaller tetrahedra. Therefore, the total surface area after the first iteration may be calculated by eq. 16.

$$4\left(\left(\frac{L}{2}\right)^2 \sqrt{3}\right) = 4\frac{L^2}{4}\sqrt{3} = L^2\sqrt{3} \quad (16)$$

This remains the case after each iteration. Though the surface area of each subsequent tetrahedron is ¼ that of the tetrahedron in the previous iteration, there are 4 times as many thus maintaining a constant total surface area. However, the total enclosed volume of the Sierpinski tetrahedron decreases geometrically, with a factor of 0.5, with each iteration and asymptotically approaches 0 as the number of iterations increases.

In accordance with another embodiment, the heatsink may comprise a heat exchange device which is structurally configured based on a dodecaedron fractal. The dodecahedron fractal, also called as dodecahedron flake, may be formed by successive flakes of twenty regular dodecahedrons, as exemplarily illustrated in FIG. 11 for second iteration. Each flake is formed by placing a dodecahedron scaled by 1/(2+φ) in each corner, wherein φ=(1+√5)/2.

In accordance with another embodiment, the heatsink may comprise a heat exchange device which is structurally configured based on an icosahedron flake, also called as a Sierpinski icosahedron. The icosahedron flake may be formed by successive flakes of twelve regular icosahedrons, as exemplarily illustrated in FIG. 12 for third iteration. Each flake may be formed by placing an icosahedron scaled by 1/(2+φ) in each corner, wherein φ=(1+√5)/2.

In accordance with another embodiment, the heatsink may comprise a heat exchange device which is structurally configured based on an octahedron flake. The octahedron flake, or Sierpinski octahedron, may be formed by successive flakes of six regular octahedrons, as exemplarily illustrated in FIG. 13 for third iteration. Each flake may be formed by placing an octahedron scaled by ½ in each corner.

In accordance with another embodiment, the heatsink may comprise a heat exchange device which is structurally configured based on a 3D Quadtratic Koch. As exemplarily illustrated in FIG. 14, the 3D Quadratic Koch may be obtained by growing a scaled down version of a triangular pyramid onto the faces of the larger triangular pyramid with each iteration. FIG. 14 illustrates the first four iterations.

In accordance with another embodiment, the heatsink may comprise a heat exchange device which is structurally configured based on a Jerusalem cube, as exemplarily illustrated in FIG. 15. The Jerusalem cube may be obtained by recursively drilling Greek cross-shaped holes into a cube. The Jerusalem Cube may be constructed as follows:

1. Start with a cube.
2. Cut a cross through each side of the cube, leaving eight cubes (of rank +1) at the corners of the original cube, as well as twelve smaller cubes (of rank +2) centered on the edges of the original cube between cubes of rank +1.
3. Repeat the process on the cubes of rank 1 and 2.

Each iteration adds eight cubes of rank one and twelve cubes of rank two, a twenty-fold increase.

In accordance with another embodiment, the heatsink may comprise a heat exchange device which is structurally configured based on a von Koch surface, as exemplarily illustrated in FIG. 16. The von Koch surface may be constructed by starting from an equilateral triangular surface. In the first iteration, the midpoints of each side of the equilateral triangular surface are joined together to form an equilateral triangular base of a hollow triangular pyramid. This process is repeated with each iteration.

In accordance with another embodiment, the heatsink may comprise a heat exchange device which is structurally configured based on a Menger sponge, as exemplarily illustrated in FIG. 17. The Menger sponge may be constructed as follows:

1. Begin with a cube (first image).
2. Divide every face of the cube into 9 squares, like a Rubik's Cube. This will sub-divide the cube into 27 smaller cubes.
3. Remove the smaller cube in the middle of each face, and remove the smaller cube in the very center of the larger cube, leaving 20 smaller cubes (second image). This is a level-1 Menger sponge (resembling a Void Cube).
4. Repeat steps 2 and 3 for each of the remaining smaller cubes, and continue to iterate ad infinitum.

In accordance with another embodiment, the heatsink may comprise a heat exchange device which is structurally configured based on a 3D H fractal, as exemplarily illustrated in FIG. 18. The 3D H fractal is based on an H-tree which may be constructed by starting with a line segment of arbitrary length, drawing two shorter segments at right angles to the first through its endpoints, and continuing in the same vein, reducing (dividing) the length of the line segments drawn at each stage by √2. Further, by adding line segments on the direction perpendicular to the H tree plane, the 3D H fractal may be obtained.

In accordance with another embodiment, the heatsink may comprise a heat exchange device which is structurally configured based on a Mandelbulb, as exemplarily illustrated in FIG. 19. The Mandelbulb is a three-dimensional analogue of the Mandelbrot set. The Mandelbulb may be defined as the set of those C in $\mathbb{R}^3$ for which the orbit of <0, 0, 0> under the iteration v ↦ v″+c is bounded, where the "nth power" of the vector v=⟨x,y,z⟩ in $\mathbb{R}^3$ is given by eq. 17.

$$v'':=r''\langle \sin(n\theta)\cos(n\phi), \sin(n\theta)\sin(n\phi), \cos(n\theta) \rangle \qquad (17)$$

Where
$r=\sqrt{x^2+y^2+z^2}$,
$\phi=\arctan(y/x)=\arg(x+yi)$, and
$\theta=\arctan(\sqrt{x^2+y^2}/z)=\arccos(z/r)$.

In accordance with another embodiment of the invention disclosed herein, the heatsink comprises a heat exchange device having a plurality of heat exchange elements which are perforated. As a result, an enhanced heat transfer may be achieved. Additionally, use of perforations may increase heat transfer by up to a factor of two per pumping power. Further, in a specific embodiment, the plurality of heat exchange elements may be hollow. The combination of hollow heat exchange elements with perforations can result in increases in heat transfer greater than that of a solid heat exchange element of the same diameter. Additionally, increases in heat transfer per pumping power of up to 20% could be achieved by varying the inclination angle and diameter of the perforations in aligned arrays of the plurality of heat exchange elements. Furthermore, one or more of the number of perforations and shape of perforations may be configured in order to control the heat transfer. For instance, under natural convection, heat transfer is directly proportional to the number of square perforations. In another instance, circular and square perforations may be used to obtain higher Nusselt number. Since heat transfer is proportional to Nusselt number, greater heat transfer may be achieved with such an arrangement. In yet another instance, the Nusselt number corresponding to the plurality of heat exchange elements may be varied based on one or more of a pitch, a hole diameter, a surface area and flow velocity. In particular, by modifying the pitch of the perforations, the Nusselt number and hence heat transfer may be increased.

In an embodiment, the heat transfer effectiveness of the plurality of heat exchange elements may be greater than or equal to a minimum value such that addition of the plurality of heat exchange elements is justified. As a non-limiting example, the minimum value may be ten.

In another embodiment, a spacing between the plurality of heat exchange elements is determined based on a height of the plurality of heat exchange elements. In a specific embodiment, for a given heat rate, an optimal spacing between the plurality of heat exchange elements may decrease with an increase in height of the plurality of heat exchange elements.

In yet another embodiment, a shape corresponding to the plurality of heat exchange elements may be configured to provide enhanced heat transfer. For instance, the plurality of heat exchange elements may be fluted. As a result, an increase in heat transfer by up to 9% may be achieved. In another instance, the plurality of heat exchange elements may be wavy providing an increase in heat transfer by up to 6%. In one embodiment, the shape corresponding to the plurality of heat exchange elements may be triangular, circular, elliptical, rectangular and trapezoidal. For instance, the plurality of heat exchange elements may be elliptically annular. Further, an elliptical aspect ratio corresponding to the plurality of heat exchange elements may be varied in order to obtain greater heat transfer efficiency. As a non-limiting example, the elliptical aspect ratio may be increased in order to obtain higher heat transfer efficiency. In another instance, the plurality of heat exchange elements may be trapezoidal with an optimal aspect number of 1.5. In yet another instance, the plurality of heat exchange elements may be diamond shaped pin fins. Further, the pitch corresponding to the plurality of heat exchange elements may be varied to obtain enhanced heat transfer. For example, the pitch may be varied in proportion to the required heat transfer coefficient. As a result, increase in heat transfer up to 340% beyond that of flat pin fins may be achieved.

In other embodiments of the invention, the surface geometry of the plurality of heat exchange elements may be varied in order to provide enhanced heat transfer. For instance, square ribs along the plurality of heat exchange elements may be used. As a result, thermal performance may increase by up to 30%. In another instance, diamond shaped surface protrusions may be provided over the plurality of heat exchange elements. Consequently, thermal performance may be increased by up to 38% while also leading to better flow distribution. In yet another instance, grooves may be created on the surfaces of the plurality of heat exchange elements. As a result, heat transfer could increase by up to 25%. In a further instance, dimples may be placed on the flat base of the plurality of heat exchange elements forming a pin fin. Consequently, an increase in heat transfer by up to 8% may be achieved while also reducing the friction factor by up to 18%. Further, in an instance, convex shaped dimples may be used to obtain greater heat transfer.

In some other embodiments, an orientation of the plurality of heat exchange elements may be varied in order to enhance heat transfer. For instance, in case the number of the plurality of heat exchange elements is large, the plurality of heat exchange elements may be oriented vertically with respect to the flat base of the plurality of heat exchange elements. In another instance, in case the plurality of heat exchange elements are short with a finning factor of less than 2.7, a horizontal orientation may be used in order to provide better heat transfer.

In other embodiments, the plurality of heat exchange elements may be configured in order to control an amount of heat transfer by radiation. For example, the height of the plurality of heat exchange elements may be maintained short. As a result, up to 55% of the heat transfer may take place by radiation. On the other hand, the height of the plurality of heat exchange elements may be increased in order to reduce the amount of heat transfer by radiation. As another example, the plurality of heat exchange elements may be circular around an annular heat pipe. Further, a ratio of spacing between the plurality of heat exchange elements and diameter of the plurality of heat exchange elements may be controlled in order to vary the amount of heat transfer by radiation. For instance, the ratio may be decreased in order to decrease the amount of heat transfer by radiation. Similarly, the ratio may be increased in order to increase the amount of heat transfer by radiation.

In an embodiment, the number of iterations corresponding to the fractal variation between respective branches of the plurality of heat exchange elements may be configured in order to control heat transfer. For instance, the number of iterations may be increased in order to obtain greater heat transfer. However, beyond a certain limit, heat transfer may not be directly proportional to the number of iterations. Additionally, varying the number of iterations may also control diffusion rate across the surfaces of the plurality of heat exchange elements based on the fact that diffusion rate is directly proportional to the number of iterations. However, a certain number of iterations such as, but not limited to, four to five iterations, the diffusion rate may converge.

In another embodiment, a dimension corresponding to the fractal variation between respective branches of the plurality of heat exchange elements may be configured in order to control heat transfer. In general, the heat transfer is directly proportional to the fractal dimension. However, this relationship is valid only till a limited number of iterations.

In yet another embodiment, the number of branches corresponding to the plurality of heat exchange elements may be configured to control the heat transfer. Under natural convection, heat transfer effectiveness is found to be directly proportional to the number of branches. However, after a certain number of branch generations, heat transfer effectiveness saturates. Further, a branching ratio may be configured in order to obtain minimum resistance to heat conduction and hence greater heat transfer. In a non-limiting example, a branching ratio of 0.707 or 0.7937 may be used.

In another embodiment, heat transfer may be controlled based on the velocity of fluidic heat exchange medium flowing over the plurality of heat exchange elements. In general, the heat transfer is directly proportional to the velocity of fluidic heat exchange medium under forced convection. Additionally, the optimal number of branches required to maximize heat transfer has been found to reduce with increase in velocity of fluidic heat exchange medium. Accordingly, under forced convection with higher velocity, a smaller number of branches may be required to achieve a required amount of heat transfer. In another embodiment, heat transfer by the plurality of heat exchange elements in the form of an array of perforated fins may be controlled by varying a pumping power. In this case, the heat transfer can be inversely proportional to the pumping power with small increase for turbulent cross-flow but significant increase for parallel flow.

In accordance with embodiments disclosed herein, the heat sink may be manufactured using manufacturing techniques such as, but not limited to, injection molding, die casting, extrusion, forging, gravitational molding, CNC milling, CNC punching, stamping, wire cut machine and wire cut Electrical Discharge Machining (EDM), additive manufacturing (e.g., 3D printing, 2.5D printing, etc.

In a particular embodiment, the heatsink may be manufactured by a machining processing employing cutting tools and controlled slicing techniques to construct the plurality of heat exchange elements from a solid block of material such as, but not limited to, copper or aluminum. This technique is preferable to construct the plurality of heat exchange elements with smaller thickness than is possible by other techniques such as extrusion. Advantages of the heatsink manufactured using this technique include high aspect ratio, thin fin, low tooling cost, easy and inexpensive to prototype, unidirectional flow and single piece construction.

In another embodiment, the heatsink may be manufactured by bending sheets made of, but not limited to, copper or aluminum into fins to form the plurality of heat exchange elements. The fins are then bonded to the flat base of the heatsink. This technique allows the flat base and the fins to be made of different materials. Advantages of this manufacturing technique include light weight of fins, lower tooling cost and differing materials for the flat base and the fins.

In yet another embodiment, the heatsink may be manufactured from sheets of material such as, but not limited to, copper or aluminum bonded onto the flat base using one or more of epoxy, soldering and brazing. This technique of manufacturing is suitable for high power application with low thermal resistance and where forced air cooling is available.

In a further embodiment, the heatsink may be manufactured using die casting. In this technique, material such as, but not limited to, liquid aluminum is forced under high pressure into re-usable steel molds. This technique is especially suited when the plurality of heat exchange elements are of complex shapes.

Those skilled in the art will recognize many ways to fabricate the heatsinks described herein. For example, modern three-dimensional laser and liquid printers can create objects such as the heatsinks described herein with a resolution of features on the order of 16 µm. Also, it is possible to grow a crystal structure using a recursive growth algorithm or through crystal growth techniques. For example, US 2006/0037177, describes a method of controlling crystal growth to produce fractals or other structures through the use of spectral energy patterns by adjusting the temperature, pressure, and electromagnetic energy to which the crystal is exposed. This method might be used to fabricate the heatsinks described herein. For larger heatsinks, such as those intended to be used in car radiators, traditional manufacturing methods for large equipment can be adapted to create the fractal structures described herein.

FIGS. 20-37 illustrate various heatsink designs and proposals, which may be used in conjunction with various embodiments of the technology. In general, these provide heat transfer surfaces with large surface area, and in many cases, small terminal features, which can accumulate or trap dust or particles. According to the present technology, the accumulation or dust and/or particles may be reduced by the various means disclosed herein.

In a typical prior heatsink, the energy cost of a fan is considered high (and the penalty of noise also considered high), and therefore low pressure and modest flow rates are provided, with the flow tending to be linear over a set of plates or vanes. Such flow conditions tend to promote particulate deposition on the heat exchange surfaces. On the other hand, in some cases, the energy cost of the fan and/or noise are not the critical variables to be minimized. In such cases, high flow rates such as to cause turbulent flow are desirable, since these disrupt the boundary layer and provide a higher heat transfer coefficient, while also reducing particulate deposition on the heat exchange surfaces. As shown e.g., in FIG. 36, a spatial-filled fractal or fractal-like object has surfaces with characteristic sizes over a broad range. In these architectures, a heat dissipative structure may be provided in or near the geometric center. (The structure may be split approximately in half, and the structure mounted over a heat dissipative structure on a surface). A source of compressed air may be provided blowing in a void near the heat dissipative structure, with the air flow exiting the structure through the fractal like object. According to another embodiment, a relatively small compressor pressurizes a plenum, which is periodically exhausted through one or more nozzles, toward heat transfer surfaces subject to fouling. The compressor may act in parallel to a fan, i.e., both run concurrently, and the compressor may be run from the same motor as the fan. The compressor may have at least two modes of operation, one employed when the heat dissipation load permits the heat to be shed based on the fan or convective flows, and therefore permitting the plenum to be charged to relatively high pressures, and thus produce a high impulse to dislodge dust and debris, and another mode assumed when heat load is high, and a more continuous flow of lower pressure air from the compressor assist in heatsink operation. In this way, maximum air flow is available at peak heat dissipation requirement times, and a lower air flow with high peak flow rates is available at low heat dissipation times. Further, it is noted that vibration of the heat exchange elements of the structure may assist in heat dissipation, especially if movements are macroscopic, and thus are associated with pressure gradients and air flows around the elements.

This document describes in detail illustrative examples of the inventive apparatus, methods, and articles of manufacture for making and using fractal heatsinks, along with systems and methods for removing dust and particles from their surfaces. Neither the specific embodiments of the invention as a whole, nor those of its features necessarily limit the general principles underlying the invention. The specific features described herein may be used in some embodiments, but not in others, in the various combinations and permutations, without departure from the spirit and scope of the invention as set forth herein. Various physical arrangements of components and various step sequences also fall within the intended scope of the invention. Many additional modifications are intended in the foregoing disclosure, and it will be appreciated by those of ordinary skill in the art that in some instances some features of the invention will be employed in the absence of a corresponding use of other features. The illustrative examples therefore do not limit the metes and bounds of the invention and the legal protection afforded the invention, which function is carried out by current and future claims and their equivalents.

What is claimed is:

1. A system for maintaining efficiency of a heatsink with respect to an accumulation of deposits due to a flow of air over a surface of the heatsink, comprising:
    a vibrator mechanism configured to excite a vibration in the heatsink; and
    a control system, configured to produce a control signal for controlling the vibrator mechanism to excite the vibration in the heatsink over a range of different frequencies, the vibration being adapted to dislodge accumulated deposits on the heatsink, to thereby maintain an efficiency of the heatsink against reduction due to the accumulated deposits,
    wherein the heatsink has a plurality of resonant frequencies, wherein the control system is further configured to selectively excite the vibration in the heatsink at a plurality of different resonant frequencies.

2. The system according to claim 1, further comprising a feedback transducer configured to receive feedback into the control system for controlling the vibrator mechanism.

3. The system according to claim 1, wherein the vibrator mechanism comprises a piezoelectric transducer.

4. The system according to claim 1, wherein the vibrator mechanism comprises an electromagnetic transducer.

5. The system according to claim 1, wherein the vibrator mechanism comprises a rotating electric motor.

6. The system according to claim 1, further comprising a variable speed fan, the variable speed fan having a variable speed controlled by the control system.

7. The system according to claim 6, further comprising an actuator configured to alter a flow direction of air from the variable speed fan over the heatsink.

8. The system according to claim 1, wherein the control system comprises an automated electronic processor configured to produce the control signal in dependence on a model of the heatsink.

9. The system according to claim 1, wherein the heatsink is thermally linked to a heat source, further comprising a damper configured to damp a vibration within the heatsink to attenuate vibrations reaching the heart source.

10. The system according to claim 1, wherein the control system is further configured to intermittently produce the control signal in a cleaning cycle.

11. A method for maintaining efficiency of a heatsink with respect to an accumulation of deposits due to a flow of air over a surface of the heatsink, comprising:
    exciting a vibration in the heatsink with a vibrator mechanism, dependent on a control signal;
    producing the control signal to excite the vibration in the heatsink over a range of different frequencies with a control system having an automated processor; and
    dislodging accumulated deposits on the heatsink, to thereby maintain an efficiency of the heatsink against reduction due to the accumulated deposits,
    wherein the heatsink has a plurality of resonant frequencies, further comprising selectively exciting the vibration in the heatsink at a plurality of different resonant frequencies.

12. The method according to claim 11, further comprising receiving feedback from a feedback transducer into the control system for controlling the vibrator mechanism.

13. The method according to claim 11, wherein the vibrator mechanism comprises at least one of a piezoelectric transducer, an electromagnetic transducer, and a rotating electric motor.

14. The method according to claim 11, further comprising providing a variable speed fan, and varying a speed of the variable speed fan based on the control signal.

15. The method according to claim 11, wherein the heatsink is thermally linked to a heat source, further comprising damping a vibration within the heatsink to attenuate vibrations reaching the heart source.

16. The method according to claim 11, wherein the control system is further configured to intermittently produce the control signal in a cleaning cycle.

17. A system for removing an accumulation of deposits on a heatsink, comprising:
    a heatsink heat transfer surface configured to receive heat from a heat emissive surface;
    a heatsink body, configured to transfer heat from the heatsink heat transfer surface;
    a plurality of elements extending into air, configured to receive the heat from the heatsink body and emit the heat into the air from an air interface surface, the plurality of elements having a range of resonant frequencies;
    a vibrator mechanism configured to excite a vibration in the heatsink within the range of resonant frequencies, to cause at least one of the plurality of elements to resonate and without resonant vibration of the entire heatsink; and
    a control system, configured to produce a control signal for controlling the vibrator mechanism to excite the vibration in the heatsink across the range of resonant frequencies, the vibration being adapted to dislodge accumulated deposits on the plurality of elements.

18. The system according to claim 17, wherein the control system is a model-based control system comprising a computational vibration model of the heatsink, further comprising a feedback transducer configured to receive feedback into the model-based control system for controlling the vibrator mechanism, wherein the model-based control system is further configured to intermittently produce the control signal according to define a cleaning cycle that selectively resonates each of the plurality of elements.

* * * * *